United States Patent
Mitsuishi et al.

(10) Patent No.: US 12,080,554 B2
(45) Date of Patent: *Sep. 3, 2024

(54) BONDING METHOD, BONDING DEVICE, AND HOLDING MEMBER

(71) Applicant: NIKON CORPORATION, Tokyo (JP)

(72) Inventors: Hajime Mitsuishi, Yokohama (JP); Isao Sugaya, Kawasaki (JP); Minoru Fukuda, Tokyo (JP); Masaki Tsunoda, Kamakura (JP); Hidehiro Maeda, Yokohama (JP); Ikuhiro Kuwano, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/225,727

(22) Filed: Apr. 8, 2021

(65) Prior Publication Data

US 2021/0225651 A1 Jul. 22, 2021

Related U.S. Application Data

(60) Division of application No. 16/413,127, filed on May 15, 2019, now Pat. No. 11,004,686, which is a (Continued)

(30) Foreign Application Priority Data

Nov. 16, 2016 (JP) .................... 2016-223645

(51) Int. Cl.
*H01L 21/18* (2006.01)
*B23K 20/00* (2006.01)
(Continued)

(52) U.S. Cl.
CPC .......... *H01L 21/185* (2013.01); *B23K 20/002* (2013.01); *H01L 21/02* (2013.01);
(Continued)

(58) Field of Classification Search
CPC ............... H01L 33/007; H01L 21/3065; H01L 21/28; H01L 33/36; H01L 33/32; H01L 33/145; H01L 2933/0016; H01L 21/30621
(Continued)

(56) References Cited

U.S. PATENT DOCUMENTS 5,273,553 A * 12/1993 Hoshi ................. H01L 21/6838
257/E21.705
6,197,617 B1 3/2001 Ohuchi
(Continued)

FOREIGN PATENT DOCUMENTS

JP 7-66093 A 3/1995
JP 2012-186243 9/2012
(Continued)

OTHER PUBLICATIONS

Notice for Reasons of Refusal mailed May 18, 2021 in Japanese Patent Application No. 2020-122432.
(Continued)

*Primary Examiner* — Vu A Vu
(74) *Attorney, Agent, or Firm* — STAAS & HALSEY LLP

(57) ABSTRACT

A method for bonding a first substrate and a second substrate includes: forming a protrusion at a partial region of the first substrate; measuring a position of the first substrate after the protrusion is formed in the first substrate; and bonding the first substrate and the second substrate by contacting the protrusion of the first substrate with a surface of the second substrate to form a contact region and enlarging the contact region.

39 Claims, 44 Drawing Sheets

Related U.S. Application Data continuation of application No. PCT/JP2017/041366, filed on Nov. 16, 2017.

(51) Int. Cl.

| | | |
|---|---|---|
| *H01L 21/02* | (2006.01) | |
| *H01L 21/50* | (2006.01) | |
| *H01L 21/67* | (2006.01) | |
| *H01L 21/68* | (2006.01) | |
| *H01L 21/683* | (2006.01) | |
| *H01L 21/687* | (2006.01) | |

(52) U.S. Cl.
CPC ........ *H01L 21/50* (2013.01); *H01L 21/67092* (2013.01); *H01L 21/67259* (2013.01); *H01L 21/681* (2013.01); *H01L 21/682* (2013.01); *H01L 21/6831* (2013.01); *H01L 21/6838* (2013.01); *H01L 21/68735* (2013.01)

(58) Field of Classification Search
USPC .......................................................... 438/5
See application file for complete search history.

(56) References Cited

U.S. PATENT DOCUMENTS

| | | | |
|---|---|---|---|
| 7,670,873 B2 | 3/2010 | Nakamura | |
| 7,682,933 B1* | 3/2010 | Loomis | H01L 25/50 438/455 |
| 8,153,901 B2* | 4/2012 | Kondo | H05K 3/4626 174/250 |
| 8,575,002 B2* | 11/2013 | Broekaart | H01L 25/50 438/455 |
| 8,946,797 B2 | 2/2015 | Mizuta et al. | |
| 9,209,097 B2* | 12/2015 | Endo | H01L 22/20 |
| 9,490,158 B2* | 11/2016 | Huang | H01L 24/75 |
| 9,576,827 B2* | 2/2017 | Liu | B23B 31/307 |
| 9,646,860 B2* | 5/2017 | Huang | H01L 21/67092 |
| 9,741,595 B2* | 8/2017 | Sugakawa | H01L 21/67092 |
| 9,837,291 B2* | 12/2017 | Huang | H01L 21/68735 |
| 9,919,508 B2 | 3/2018 | Okamoto et al. | |
| 10,109,487 B2* | 10/2018 | Kurz | H01L 22/20 |
| 10,438,918 B2* | 10/2019 | Omori | H01L 21/67092 |
| 10,483,212 B2 | 11/2019 | Sugaya et al. | |
| 10,580,752 B2 | 3/2020 | Yamauchi | |
| 10,833,047 B2* | 11/2020 | Kim | H01L 21/67253 |
| 11,004,686 B2* | 5/2021 | Mitsuishi | H01L 21/681 |
| 2013/0327463 A1 | 12/2013 | Kitahara et al. | |
| 2015/0044786 A1* | 2/2015 | Huang | H01L 21/681 438/14 |
| 2015/0214082 A1 | 5/2015 | Endo | |
| 2015/0140689 A1 | 7/2015 | Huang et al. | |
| 2017/0221856 A1 | 8/2017 | Yamauchi | |
| 2017/0278803 A1 | 9/2017 | Sugaya et al. | |

FOREIGN PATENT DOCUMENTS

| | | |
|---|---|---|
| JP | 2013-258377 | 12/2013 |
| JP | 2015-135909 | 7/2015 |
| JP | 2015-228449 | 12/2015 |
| JP | WO2016/060274 | 4/2016 |
| JP | WO2016/093284 | 6/2016 |
| JP | 2016-039254 | 3/2023 |
| KR | 10-2016-0018410 A | 2/2016 |
| KR | 10-2017-0096757 | 8/2017 |
| TW | 201633367 A | 9/2016 |
| WO | WO 2014/064944 A1 | 5/2014 |
| WO | WO 2016/093284 A1 | 6/2016 |
| WO | WO 2016/060274 A1 | 4/2023 |

OTHER PUBLICATIONS

Notice of Office Action issued Mar. 15, 2022 in Taiwanese Patent Application No. 106139495.
Notification for Reason of Refusal dated Jul. 20, 2021 in Korean Patent Application No. 10-2021-7020528.
Notice of Reasons for Refusal dated Dec. 2, 2021 in Japanese Patent Application No. 2020-122432.
English Translation by WIPO of the International Preliminary Report on Patentability dated May 21, 2019 in corresponding International Patent Application No. PCT/JP2017/041366 (6 pages).
International Search Report issued Jan. 9, 2018 in corresponding International Application No. PCT/JP2017/041366.
Written Opinion of the International Searching Authority issued Jan. 9, 2018 in corresponding International Application No. PCT/JP2017/041366.
Notice of Reasons for Refusal dated Feb. 21, 2020 in Japanese Patent Application No. 2018-551689 (4 pages) (7 pages English Translation).
Non-Final Office Action dated Apr. 6, 2020 in co-pending U.S. Appl. No. 16/413,127 (24 pages).
Final Office Action dated Jul. 27, 2020 in co-pending U.S. Appl. No. 16/413,127 (7 pages).
Advisory Action dated Nov. 13, 2020 in co-pending U.S. Appl. No. 16/413,127 (3 pages).
Notice of Allowance dated Jan. 13, 2021 in co-pending U.S. Appl. No. 16/413,127 (8 pages).
U.S. Appl. No. 16/413,127, filed May 15, 2019, Hajime Mitsuishi et al., Nikon Corporation, Tokyo, JP.
Notice of Final Rejection dated Apr. 20, 2021 in Korean Patent Application No. 10-2019-7013867.
Notice of Final Rejection mailed Jan. 19, 2022 in Korean Patent Application No. 10-2021-702528.
Notice of Office Action issued Mar. 10, 2021 in related Taiwanese Patent Application No. 106139495 (14 pages) (11 pages English Translation).
Request for the Submission of an Opinion; mailed Dec. 23, 2022 in related Korean Patent Application No. 10-2022-7021689 (7 pages) (8 pages English Translation).
Taiwanese Office Action issued in a counterpart Taiwanese Patent Application No. 111133760 dated Aug. 24, 2023.
Japanese Office Action issued in Japanese Application No. 2022-133848 dated Jul. 19, 2023.
Korean Office Action issued in Korean Application No. 10-2022-7021689 dated Jul. 18, 2023.
Taiwanese Office Action issued in a counterpart Taiwanese Patent Application No. 111133760 dated Feb. 14, 2023.
Taiwanese Office Action issued in counterpart Taiwanese Application No. 111133760 dated Oct. 27, 2023.
Korean Office Action issued in counterpart Korean Application No. 10-2024-7004976 dated Feb. 27, 2024.

\* cited by examiner

BONDING METHOD, BONDING DEVICE, AND HOLDING MEMBER

CROSS-REFERENCE TO RELATED APPLICATIONS

This is a divisional application of U.S. patent application Ser. No. 16/413,127, filed on May 15, 2019, which is a continuation of International Application No. PCT/JP2017/041366, filed Nov. 16, 2017, which claims the foreign priority benefit to Japanese Patent Application No. 2016-223645, filed Nov. 16, 2016, the disclosures of which are incorporated herein by reference.

BACKGROUND

1. Technical Field

The present invention relates to a bonding method, a bonding device, and a holding member.

2. Related Art

There has been a method for manufacturing a stacked substrate, in which two substrates are stacked, by adhering the two substrates (see Patent Document 1, for example).
Patent Document 1: Japanese Patent Application Publication No. 2012-186243

The process of adhering two substrates may involve air bubbles remaining between the two substrates, for example.

SUMMARY

According to a first aspect of the present invention, a bonding method for bonding a first substrate and a second substrate is provided, the bonding method including: forming a protrusion at a partial region of the first substrate; measuring a position of the first substrate after the protrusion is formed in the first substrate; and bonding the first substrate and the second substrate by contacting the protrusion of the first substrate with a surface of the second substrate to form a contact region and enlarging the contact region.

According to a second aspect of the present invention, a bonding device for bonding a first substrate and a second substrate is provided, the bonding device including: a forming section configured to form a protrusion at a partial region of the first substrate: a measuring section configured to measure a position of the first substrate after the protrusion is formed in the first substrate; and a bonding section configured to bond the first substrate and the second substrate by contacting the protrusion of the first substrate with a part of a surface of the second substrate to form a contact region and enlarging the contact region.

According to a third aspect of the present invention, a holding member is provided, including: a main body having a holding surface for holding a substrate; and a projecting member provided in the main body and at least partially protruding from the holding surface, wherein a protrusion is formed in a partial region of the substrate when the substrate is held on the holding surface and the projecting member abuts the partial region, the protrusion being curved at a larger curvature than other regions of the substrate.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
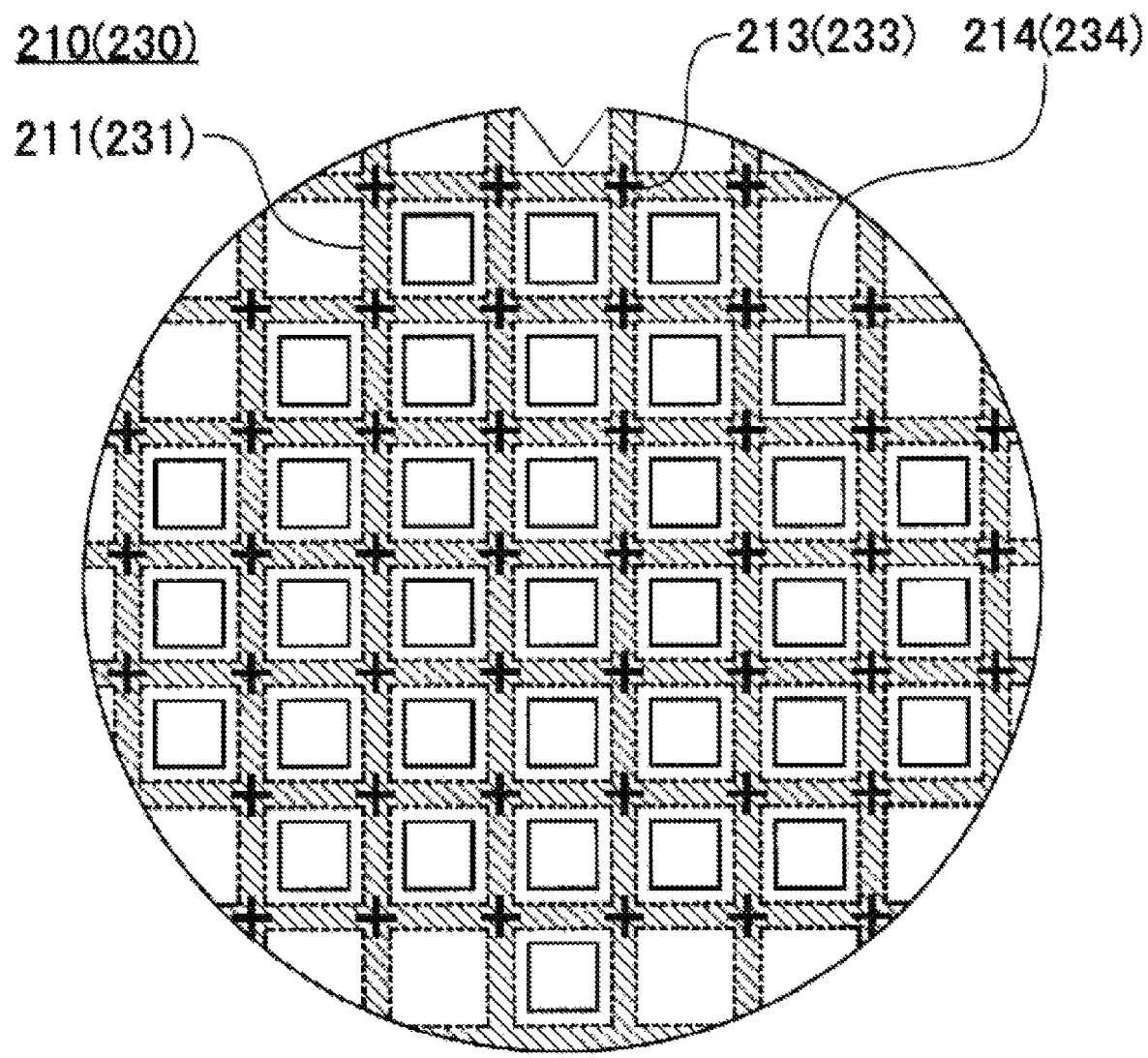
FIG. 1 is a schematic plan view of substrates 210 and 230.

FIG. 1 is a schematic plan view of substrates 210 and 230 to be bonded to each other in a stacked manner. The substrates 210 and 230 include, respectively, scribe lines 211 and 231, alignment marks 213 and 233, and circuit regions 214 and 234. There are a plurality of alignment marks 213 and 233 and a plurality of circuit regions 214 and 234.

The alignment marks 213 and 233 are exemplary structures formed on surfaces of the substrates 210 and 230, and in the illustrated example are disposed over the scribe lines 211 and 231 disposed between the individual circuit regions 214 and 234. In bonding the two substrates 210 and 230, the alignment marks 213 and 233 are used as reference marks for aligning the substrates 210 and 230 with each other.

The circuit regions 214 and 234 are composed of a plurality of identical structures disposed at regular intervals on the surfaces of the substrates 210 and 230. Structures such as semiconductor devices, interconnects, and passivation films, such as formed by photolithography techniques, are provided in each of the circuit regions 214 and 234. Also disposed in the circuit regions 214 and 234 are connections such as pads and bumps, which serve as connection terminals for electrically connecting the substrate 210 to another substrate 210, a lead frame, or the like. The connections are also exemplary structures formed on the surface of the substrate 210.

Figure 2:
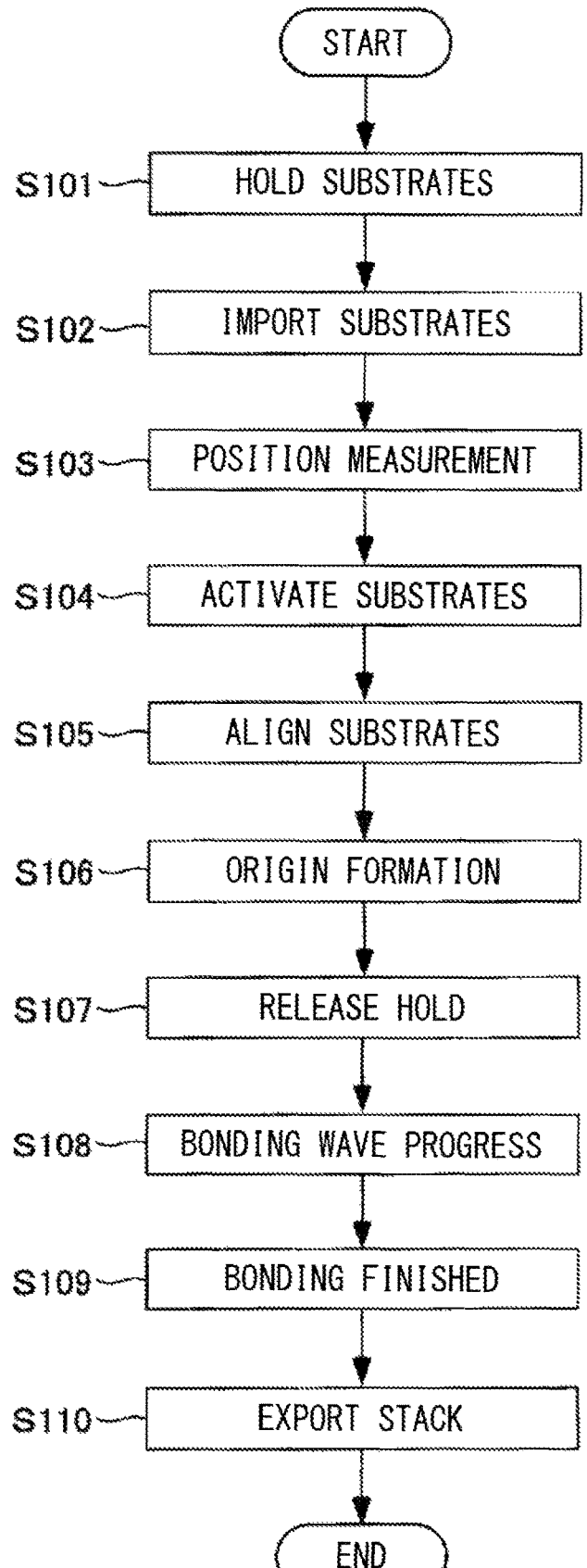
FIG. 2 is a flow diagram showing procedures for bonding the substrates 210 and 230.

FIG. 2 is a flow diagram showing procedures for bonding the substrates 210 and 230. First, the substrates 210 and 230, which are to be bonded to each other in an overlaid manner, are held onto respective holding members such as substrate holders 220 and 240 (step S101). This allows the substrates 210 and 230 to be protected and to be handled easily.

Figure 3:
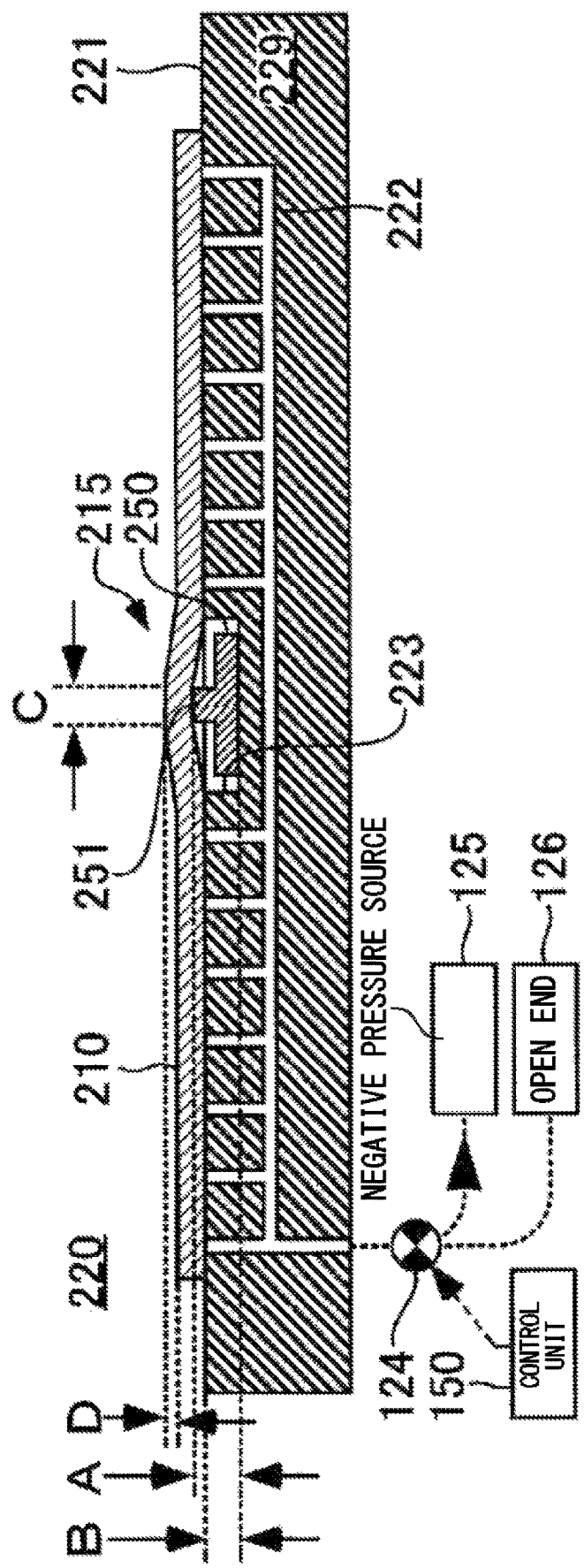
FIG. 3 is a schematic cross-sectional view of a substrate holder 220.

FIG. 3 is a schematic cross-sectional view of a substrate holder 220 for holding one of the substrates, 210. The substrate holder 220 includes a main body 229 and a projecting member 250.

The main body 229 includes a holding surface 221, an air passage 222, and a recess 223. The holding surface 221 is a flat surface formed as the illustratively upper surface of the main body 229, and is in contact with the back surface of the substrate 210.

The air passage 222 has one end with a plurality of air suction holes opened in the holding surface 221. The other end of the air passage 222 is selectively coupled to a negative pressure source 125 or an open end 126, which are provided outside the substrate holder 220, via a control valve 124.

The control valve 124 selectively connects the air passage 222 with the negative pressure source 125 or the open end 126 under control of a control unit 150 of a bonding device 100, which will be described later. When the control valve 124 connects the air passage 222 with the negative pressure source 125, a negative pressure is applied through the openings of the holding surface 221 to suction the substrate 210 mounted on the substrate holder 220. When the control valve 124 connects the air passage 222 with the open end 126, the suction force of the holding surface 221 is eliminated to release the hold of the substrate 210 by the substrate holder 220.

The recess 223 is formed at an approximately central part of the holding surface 221. The projecting member 250 is accommodated inside the recess 223, which is depressed from the holding surface 221. The projecting member 250 has a flat bottom surface, and is fixed on the bottom surface of the recess 223 with a fixing means such as an adhesive, double-sided tape, magnetic force, screw, or fitting structure. The projecting member 250 includes, at its approximately central part, an abutting portion 251 that protrudes upward and has a surface for abutting on the substrate 210 at its illustratively upper end.

In the illustrated example, the abutting portion 251 has a cylindrical shape. Height A, the distance from the bottom surface of the projecting member 250 to the upper end of the abutting portion 251, is larger than depth B of the recess 223, so that the upper end of the abutting portion 251 protrudes from the holding surface 221. Thus, when the substrate 210 is suctioned onto the holding surface 221, the upper end of the abutting portion 251 abuts the lower surface of the substrate 210, and pushes up region C, a central portion of the substrate 210, in the direction toward the upper surface from the lower surface, that is, in the direction such that region C goes away from the main body 229. As a result, when the substrate 210 is held by the substrate holder 220 by being suctioned onto the holding surface 221, the central portion of the substrate 210 is raised with a larger curvature than other regions of the substrate 210 to form a protrusion 215. That is, the projecting member 250 is an example of the forming section for forming the protrusion 215 by abutting a partial region of the substrate 210 held on the holding surface 221.

Note that the protrusion 215, formed at a part of the substrate 210 by the projecting member 250, is not limited to have a constant curvature throughout the protrusion 215, as long as at least part of the protrusion 215 has a larger curvature than regions of the substrate 210 other than the protrusion 215. If the regions of the substrate 210 other than the protrusion 215 are flat, that is, the curvatures of these regions are zero, only the protrusion 215 has a curved shape in the substrate 210 when the protrusion 215 is formed in the flat substrate 210 by the projecting member 250.

Alternatively, if a region of the substrate 210 other than the protrusion 215 is also curved, the curvature of the protrusion 215 may partially be smaller than the curvature of the other region of the substrate 210. For example, if the protrusion 215 partially has a conical shape, the curvature of a portion corresponding to the side of the cone may be zero. If, for example, a peripheral portion the substrate 210 is largely curved toward the back surface side, the curvature of the protrusion 215 may be smaller than the curvature of this peripheral portion. However, in any case, the entire shape of the protrusion 215 protrudes from an imaginary surface, flat or curved, that is continuous with the regions of the substrate 210 other than the protrusion 215.

As viewed in a cross section of the protrusion 215 passing through the top point of the protrusion 215 and along the direction of thickness of the substrate 210, at least the extremity of the protrusion 215 has a surface curvature that is larger than the curvatures of the regions of the substrate 210 other than the central portion. The surface curvature of the extremity is such a curvature that, when the extremity of the protrusion 215 and the other substrate 230 contact, the contact region has an area, shape and the like in which such an amount of air bubbles that causes bonding failure between the extremity and the other substrate 230 are not produced or interposed.

Height D of the protrusion 215 is the height of the top point of the protrusion 215 relative to the surface of the regions of the substrate 210 other than the central portion, and is approximately equal to the amount of protrusion of the abutting portion 251 from the holding surface 221.

Figure 4:
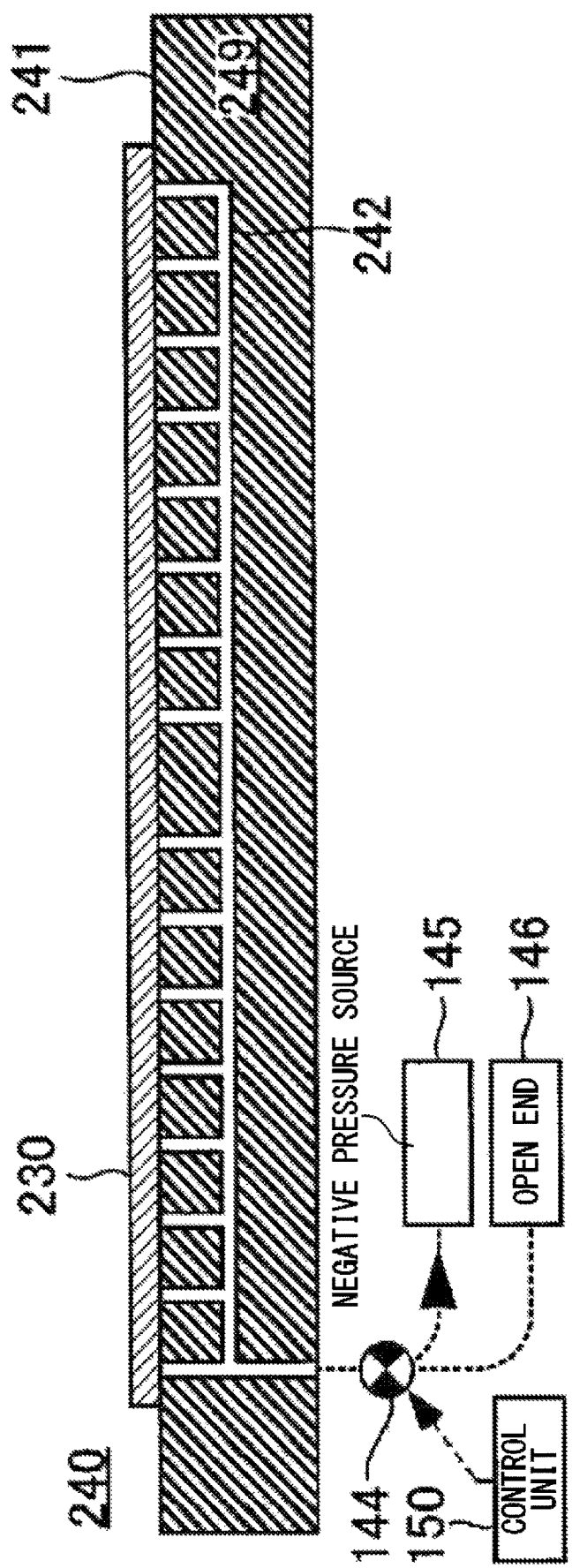
FIG. 4 is a schematic cross-sectional view of a substrate holder 240.

FIG. 4 is a schematic cross-sectional view of a substrate holder 240 for holding the other substrate 230, which is to be bonded to the substrate 210. The substrate holder 240 includes a main body 249 in which a holding surface 241 and an air passage 242 are formed.

The holding surface 241 of the substrate holder 240 is generally flat, and has a plurality of openings connecting with the air passage 242. One end of the air passage 242 is selectively coupled to a negative pressure source 145 or an open end 146, which are provided outside the substrate holder 240, via a control valve 144.

As with the control valve 124, the control valve 144 is controlled by the control unit 150 of the bonding device 100, which will be described later, to selectively connect the air passage 242 with the negative pressure source 145 or the open end 146.

Referring back to FIG. 2, the substrates 210 and 230, after being held onto the respective substrate holders 220 and 240 as described above, are imported into the bonding device 100 together with the substrate holders 220 and 240 (step S102).

Figure 5:
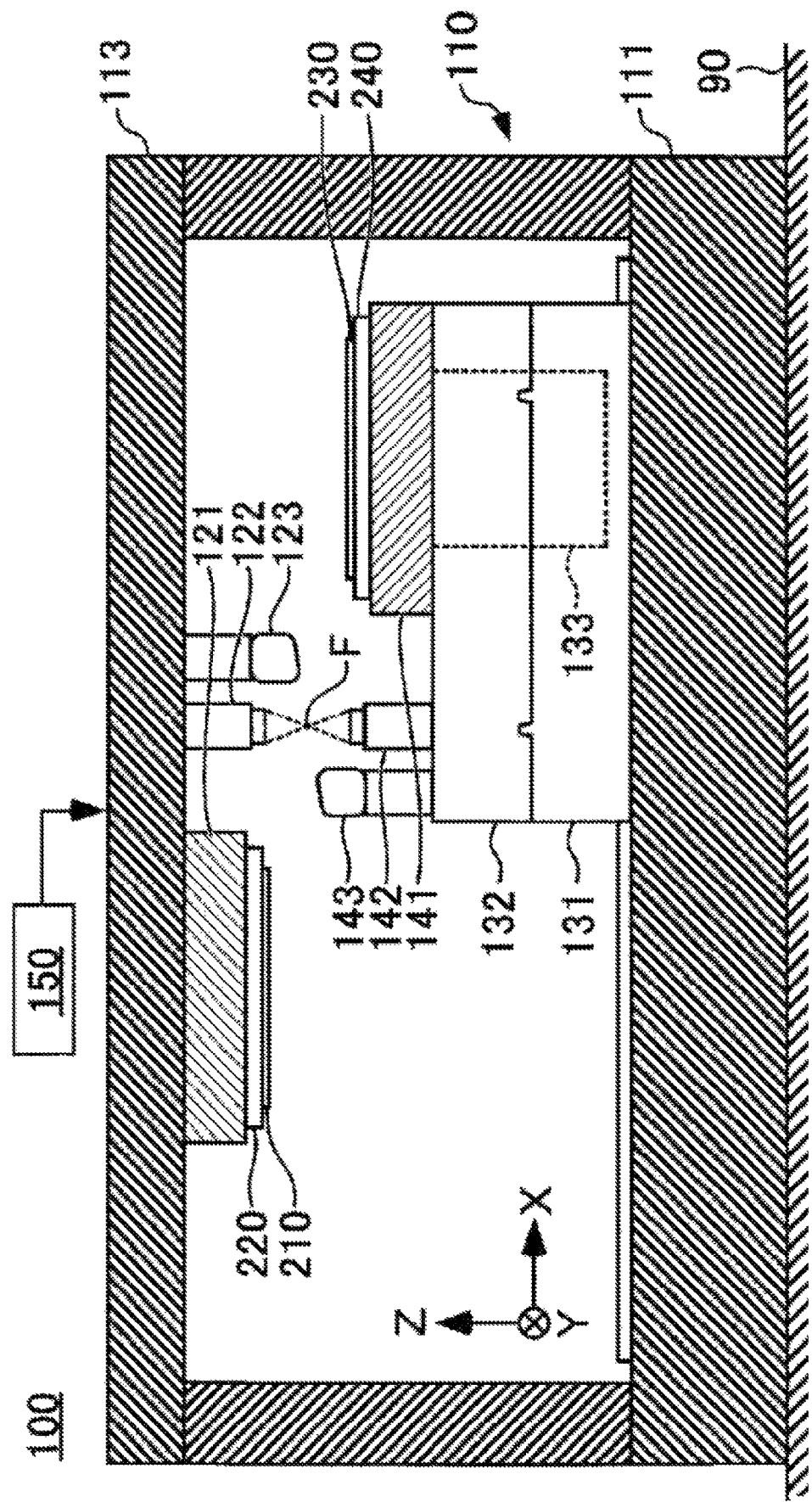
FIG. 5 is a schematic cross-sectional view of a bonding device 100.

FIG. 5 is a schematic view showing the structure of the bonding device 100. FIG. 5 shows the state immediately after the substrates 210 and 230 are imported in step S102.

The bonding device 100 includes a frame 110, a fixed stage 121, a movable stage 141, and a control unit 150.

The fixed stage 121 is fixed on a ceiling plate 113 of the frame 110 to face downward, and has a holding functionality such as vacuum chucking or electrostatic chucking for holding the substrate holder 220 by suction. The substrate holder 220 with the substrate 210 held thereon are imported onto the fixed stage 121 such that a surface of the substrate 210 faces downward.

An upper microscope 122 and an upper activation device 123, fixed to face illustratively downward, are disposed beside the fixed stage 121 on the illustratively lower surface of the ceiling plate 113. When the movable stage 141 is arranged to oppose the fixed stage 121, the upper microscope 122 can observe the upper surface of the substrate 230 on the movable stage 141. The upper activation device 123 generates plasma for cleansing and activating the upper surface of the substrate 230 held on the movable stage 141.

An X-direction driving unit 131, a Y-direction driving unit 132, and the movable stage 141 are disposed in a stacked manner on the illustratively upper surface of a base plate 111 of the frame 110. The substrate holder 240 with the substrate 230 held thereon are imported onto the upper surface of the movable stage 141 such that a surface of the substrate 230 faces upward.

The X-direction driving unit 131 moves in parallel with the base plate 111 in the direction indicated by arrow X in the figure. The Y-direction driving unit 132 moves on the X-direction driving unit 131 in parallel with the base plate 111 in the direction indicated by arrow Y in the figure. The movable stage 141 can be moved two-dimensionally in parallel with the base plate 111 by the combined operation of the X-direction driving unit 131 and the Y-direction driving unit 132.

A Z-direction driving unit 133 is disposed between the Y-direction driving unit 132 and the movable stage 141. The Z-direction driving unit 133 moves the movable stage 141 relative to the Y-direction driving unit 132 in the direction indicated by arrow Z, perpendicular to the base plate 111. In this manner, the movable stage 141 can be brought close to the fixed stage 121. The amount of movement of the movable stage 141 by the X-direction driving unit 131, the Y-direction driving unit 132 and the Z-direction driving unit 133 is accurately measured using an interferometer or the like.

A lower microscope 142 and a lower activation device 143 are mounted beside the movable stage 141 on the illustratively upper surface of the Y-direction driving unit 132. The lower microscope 142 moves together with the Y-direction driving unit 132, and can observe the lower surface of the substrate 210 held on the fixed stage 121 to face downward. The lower activation device 143 moves together with the Y-direction driving unit 132, and generates plasma for cleansing and activating the illustratively lower surface of the substrate 210 held on the fixed stage 121.

Note that, instead of the upper activation device 123 and the lower activation device 143, a different activation device may be provided in a place other than the bonding device 100, and the substrates 210 and 230 may be activated before being imported into the bonding device 100.

Further, the bonding device 100 includes the control unit 150. The control unit 150 controls the operation of the X-direction driving unit 131, the Y-direction driving unit 132, the Z-direction driving unit 133, the upper activation device 123, and the lower activation device 143.

Prior to bonding the substrates 210 and 230, the control unit 150 pre-calibrates the relative positions of the upper microscope 122 and the lower microscope 142. The calibration of the upper microscope 122 and the lower microscope 142 can be performed by, for example, focusing the upper microscope 122 and the lower microscope 142 at a common focal point, F, so that they observe it. Alternatively, the upper microscope 122 and the lower microscope 142 may observe a common reference object.

Figure 6:
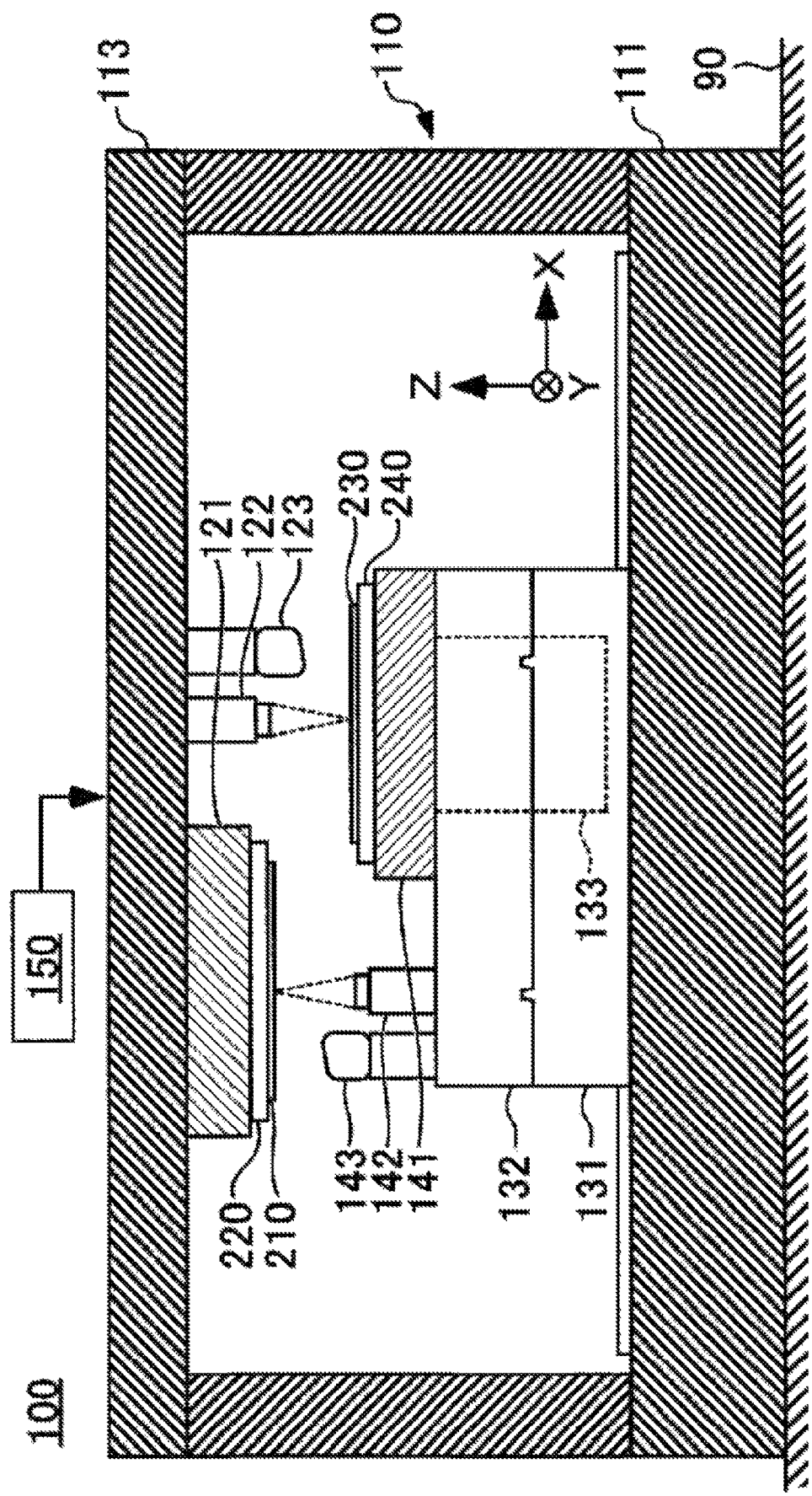
FIG. 6 is a schematic cross-sectional view of the bonding device 100 in operation.

Referring back to FIG. 2, when the substrates 210 and 230 are imported in the above-described manner, the control unit 150 moves the movable stage 141 as shown in FIG. 6, and the opposing substrates 210 and 230 are observed using the upper microscope 122 and the lower microscope 142 to measure the positions of the plurality of alignment marks 213 and 233 (step S103).

Since the relative positions of the upper microscope 122 and the lower microscope 142 are pre-calibrated, this measurement can accurately detect the relative positions of the substrates 210 and 230. At this stage, the substrate 210 observed by the lower microscope 142 is held to the fixed stage 121 by being held on the substrate holder 220, which has the projecting member 250. The lower microscope 142 then observes the substrate 210, in which the protrusion 215 is formed, to detect the positions of the alignment marks 213 on the surface of the substrate 210, including the protrusion 215.

As above, the protrusion 215 is formed in the substrate 210 by the projecting member 250 before the position detection of the alignment marks 213, so that the positions of the alignment marks 213 are detected in the presence of the protrusion 215 formed. This can suppress the occurrence of displacement of the central portion of the substrate 210 due to its deformation after the position detection of the alignment marks, unlike in the case where the protrusion 215 is formed in the substrate 210 after the detection of the positions of the alignment marks 213. Therefore, the lowering of alignment accuracy can be suppressed.

Also, since the protrusion 215 is formed in the substrate 210 during the operation of holding the substrate 210 onto the substrate holder 220, the increase in number of steps for forming the protrusion 215 can be avoided, unlike with a bonding device in which the operation of forming the protrusion 215 by pushing a part of the substrate 210 is performed after holding the substrate 210.

If the protrusion 215 is formed in the substrate 210 after the position detection of the alignment marks 213, the central portion of the substrate 210 is deformed due to the formation of the protrusion 215, causing alignment marks 213 particularly at the central portion to be displaced from the detected positions. Also, when a pushing force is applied to the central portion of the substrate 210 for forming the protrusion 215, regions other than the central portion are pulled by the pushing force, and the regions other than the central portion are displaced from where they were at the time of detection of the alignment marks 213. This lowers the reliability of position information, lowering the accuracy of alignment based on the position information.

In other words, as long as the order of procedures is kept, in which the protrusion 215 is formed before the position detection of the alignment marks 213 and the alignment of the substrates 210 and 230, equipment other than the substrate holder 220 may be used to form the protrusion 215 for stacking the substrates 210 and 230. Examples of such equipment can include a stage device having a push rod that protrudes or retracts from the central part of the holding surface.

The control unit 150 calculates the direction and amount of movement of the movable stage 141 required to align the substrates 210 and 230 based on the detected relative position information of the substrates 210 and 230.

Figure 7:
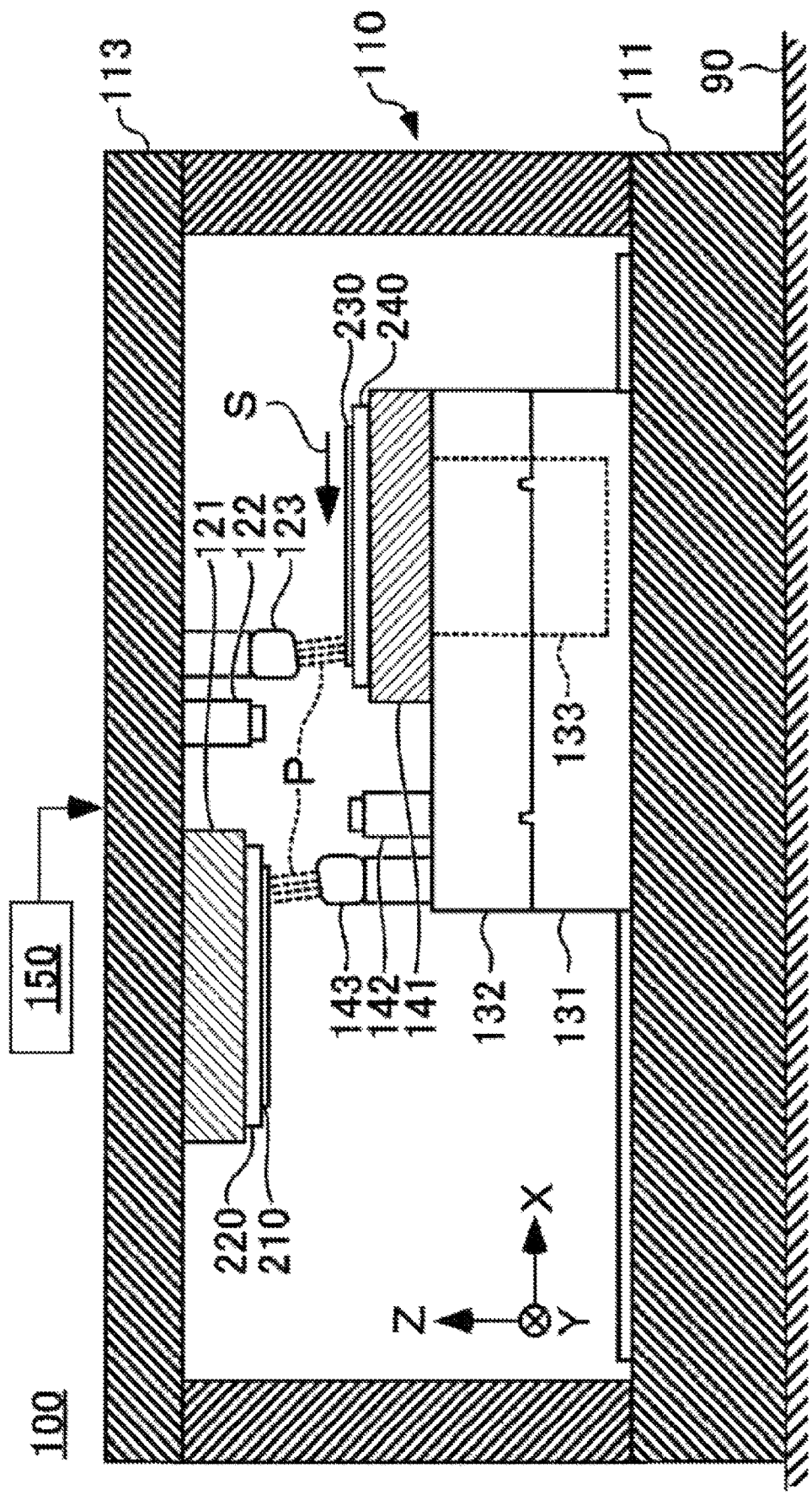
FIG. 7 is a schematic cross-sectional view of the bonding device 100 in operation.

The control unit 150 then moves the movable stage 141 while operating the upper activation device 123 and the lower activation device 143 as shown in FIG. 7, to activate the surfaces of the substrates 210 and 230 (step S104). When the activated surfaces of the substrates 210 and 230 are contacted with each other, the surfaces can be bonded to each other without an intervening material such as an adhesive or processing such as welding or pressure bonding.

Figure 8:
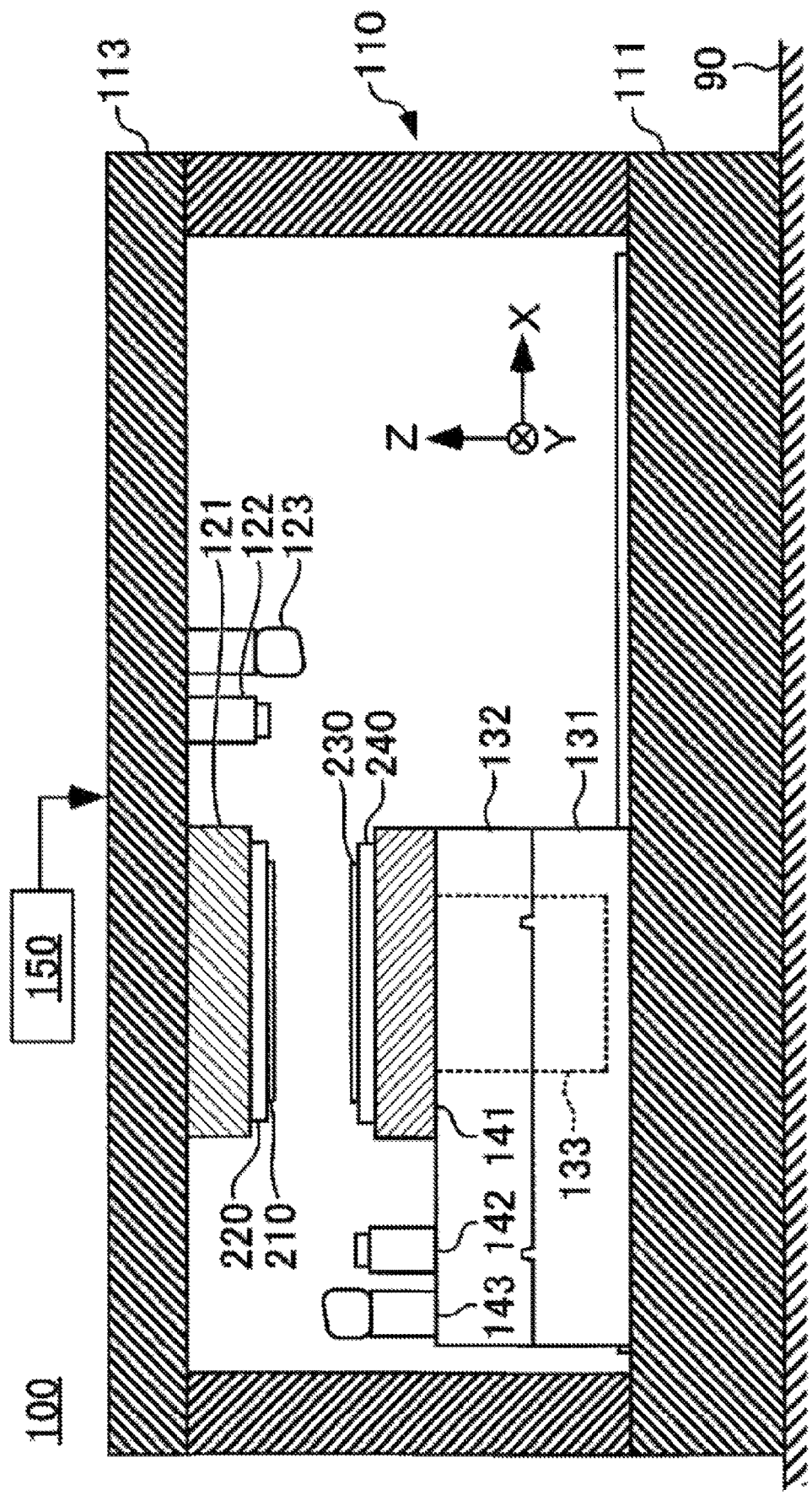
FIG. 8 is a schematic cross-sectional view of the bonding device 100 in operation.
Figure 9:
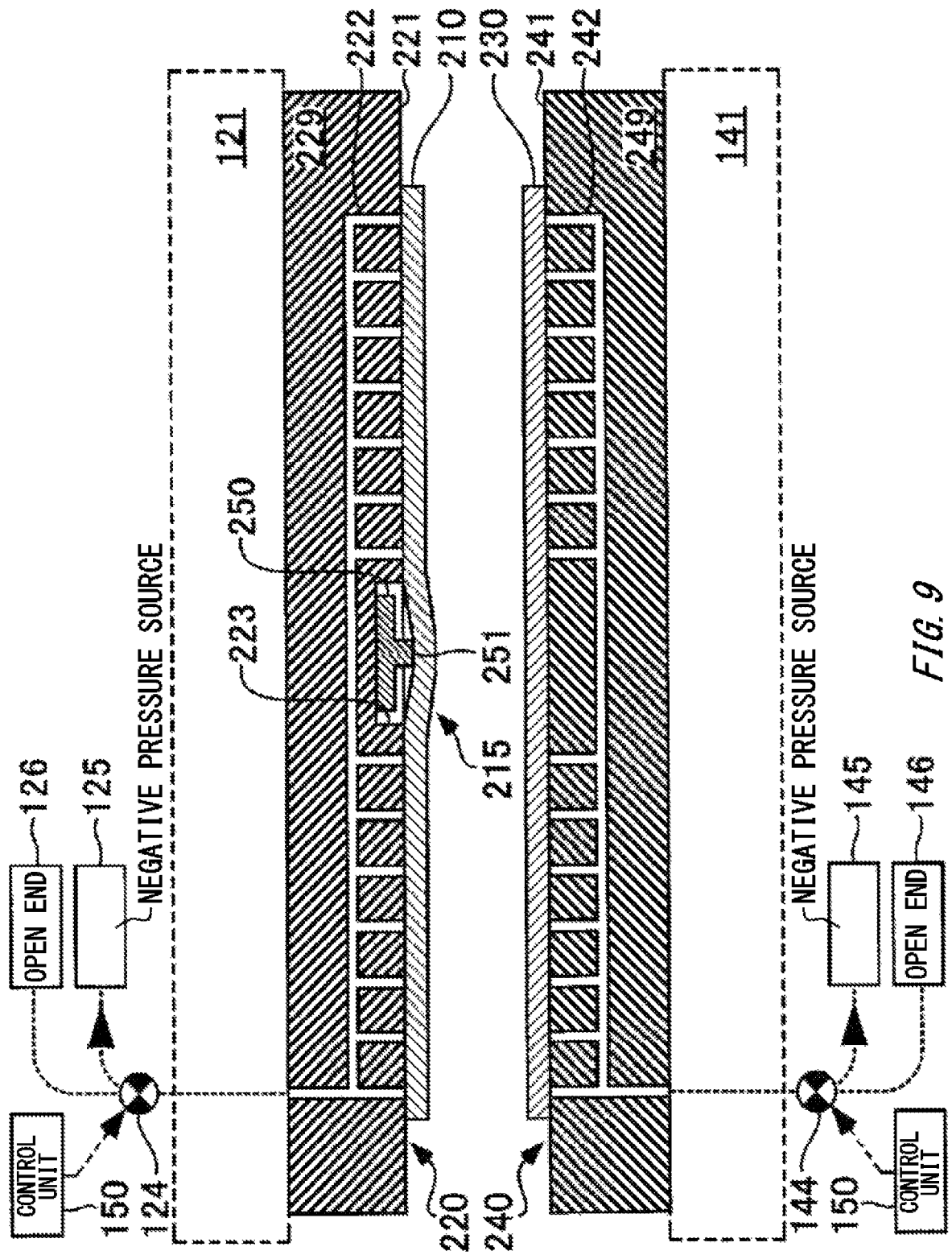
FIG. 9 is a schematic cross-sectional view of the substrates 210 and 230 in the bonding process.

The control unit 150 then moves the movable stage 141 based on the information previously calculated in step S103 to align the substrates 210 and 230 with each other as shown in FIG. 8 (step S105). FIG. 9 is a schematic cross-sectional view of the substrates 210 and 230 after being aligned in the bonding device 100.

At this stage, the control unit 150 controls the control valve 144 to connect the air passage 242 of the substrate holder 240 held on the movable stage 141 with the negative pressure source 145. Thus, the substrate 230 is suctioned onto the holding surface 241.

Also, the control unit 150 controls the control valve 124 to connect the air passage 222 of the substrate holder 220 held on the fixed stage 121 with the negative pressure source 125. Thus, the substrate 210 is suctioned onto the holding surface of the substrate holder 220.

Figure 10:
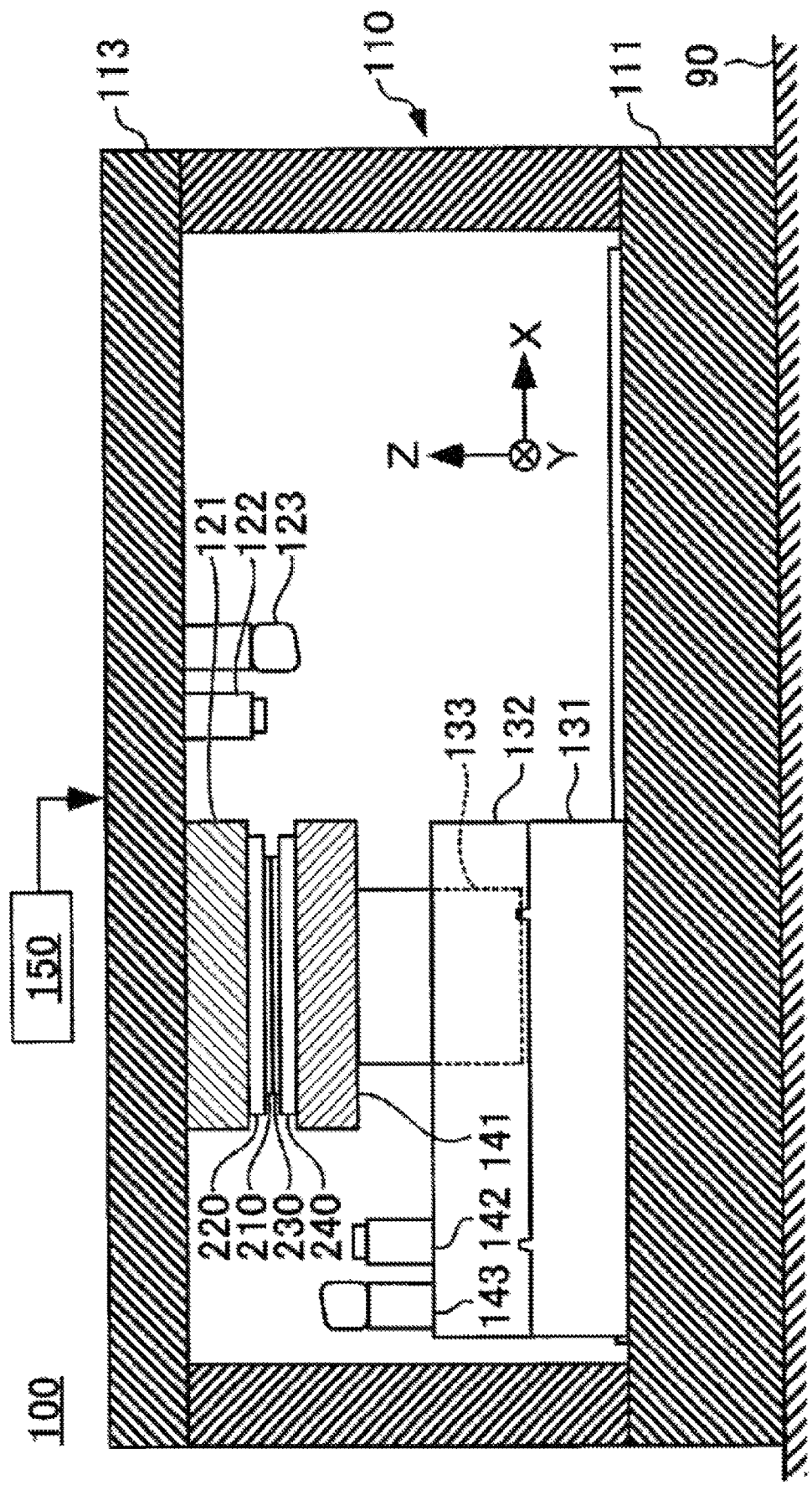
FIG. 10 is a schematic cross-sectional view of the bonding device 100 in operation.

The control unit 150 then operates the Z-direction driving unit 133 to elevate the movable stage 141 as shown in FIG. 10. Thus, the substrate 230 is elevated, and the substrates 210 and 230 eventually contact each other.

Figure 11:
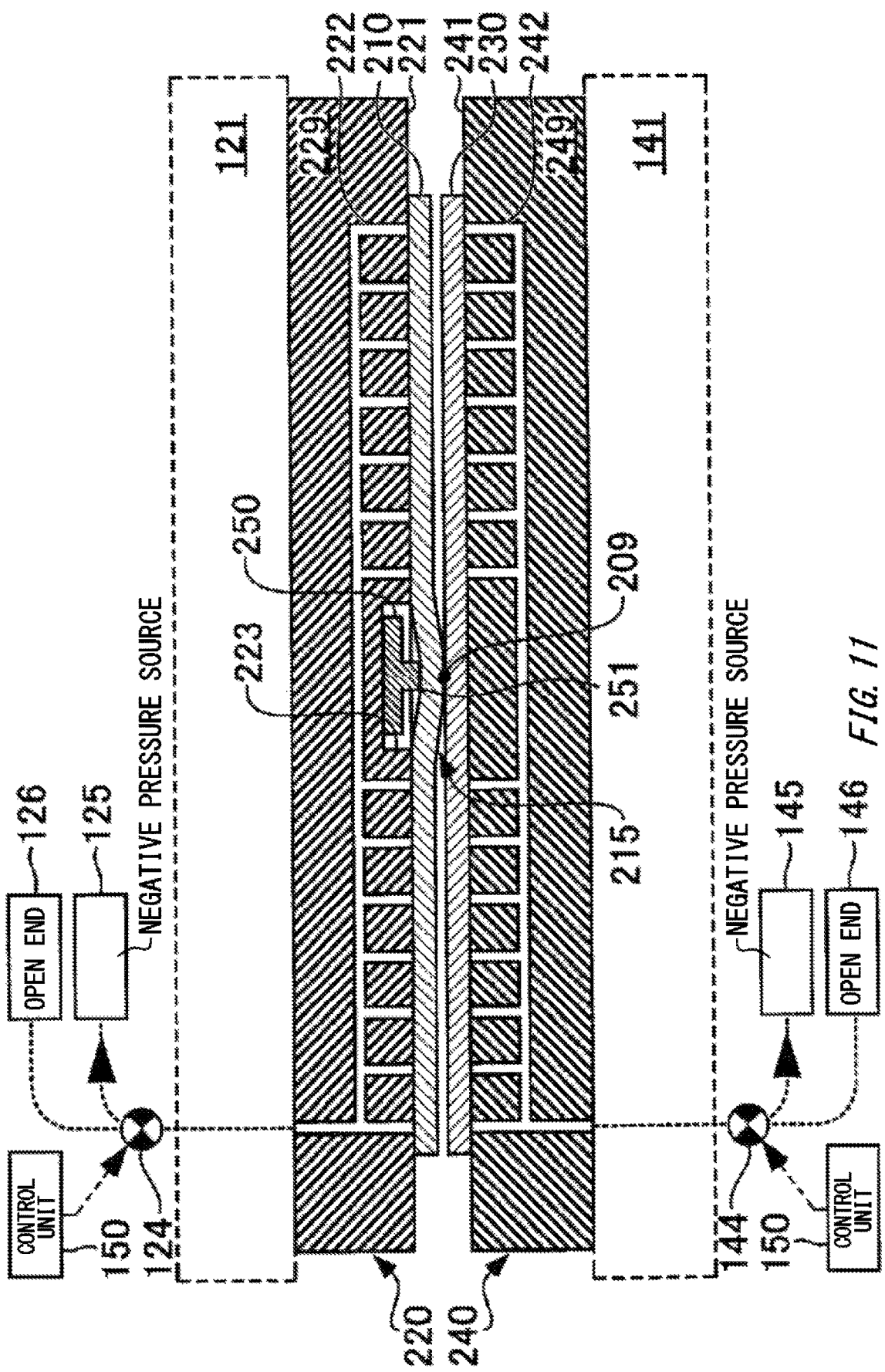
FIG. 11 is a schematic cross-sectional view of the substrates 210 and 230 in the bonding process.

FIG. 11 is a schematic cross-sectional view of the substrates 210 and 230 beginning to contact in the bonding device 100. A protrusion 215 protruding illustratively downward is formed in the substrate 210 held on the fixed stage 121. Thus, when the substrates 210 and 230 come close to each other through the elevation of the movable stage 141, the protrusion 215 first contacts the surface of the substrate 230.

In other words, since the protrusion 215 is raised higher than the other regions of the substrate 210, it is ensured that the extremity of the protrusion 215 among all regions of the lower surface of the substrate 210 first contacts the surface of the substrate 230. In this process, it is preferable that the extremity of the protrusion 215 contacts the center of the surface of the substrate 230. The surfaces of the substrates 210 and 230 are already activated in step S104, and thus the substrates 210 and 230 are partially bonded by contact, to form a bonding origin 209 at the point of contact of the substrates 210 and 230 (step S106 in FIG. 2).

The bonding origin 209 is a contact region in which the substrates 210 and 230 are in contact with each other, and is formed at the beginning of adhesion. The bonding origin 209 may be a region having an area. The origin of adhesion of the pair of substrates 210 and 230 to be adhered is formed via the direct contact of the substrates 210 and 230 by pushing a part of the substrate 210 against a part of the substrate 230 to push out the ambient air between the substrates 210 and 230, for example.

This contact causes the two activated substrates 210 and 230 to be coupled at the contact region via chemical bonds such as hydrogen bonds. After the two substrates 210 and 230 are partially contacted, the control unit 150 maintains the two substrates 210 and 230 in contact with each other. In this process, the contact region may be enlarged by increasing the area of the contact portion by pushing the substrates 210 and 230 against each other.

The control unit 150 controls the control valves 124 and 144 to connect both of the air passages 222 and 242 of the respective substrate holders 220 and 240 with the negative pressure sources 125 and 145. The substrates 210 and 230 are thus suctioned onto the respective substrate holders 220 and 240, so that the substrates 210 and 230 are inhibited from contacting at portions other than the bonding origin 209.

When a predetermined amount of time elapses while the contact is maintained, a coupling strength is obtained between the two substrates 210 and 230 that causes no displacement between the substrates 210 and 230 in the process of adhering the two substrates 210 and 230. The origin of adhesion is thus formed at a portion where the substrates 210 and 230 contact each other.

Then, for the fixed stage 121 side, the control unit 150 switches the control valve 124 to connect the air passage 222 of the substrate holder 220 with the open end, which leads to atmospheric pressure. Thus, the hold of the substrate 210 by the substrate holder 220 is released (step S107), and the substrates 210 and 230 are autonomously bonded to each other, such as via intermolecular forces between their activated surfaces.

Figure 12:
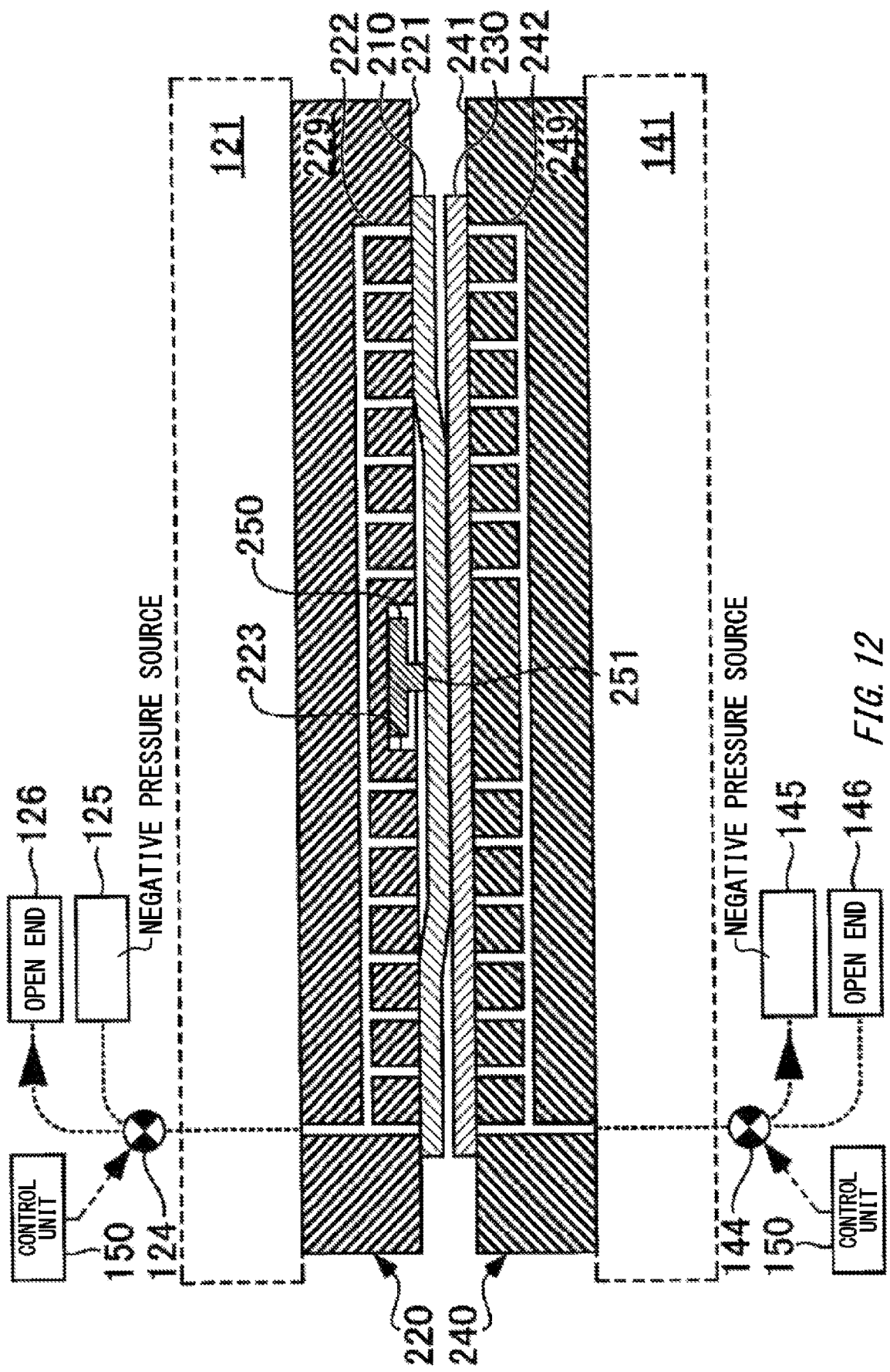
FIG. 12 is a schematic cross-sectional view of the substrates 210 and 230 in the bonding process.

In this process, the contact region, at which the substrates 210 and 230 are bonded, progressively enlarges from the bonding origin 209 toward the radially outside of the substrates 210 and 230 as shown in FIG. 12. A bonding wave is thus generated in which the bonding region progressively extends, and the bonding of the substrates 210 and 230 progresses (step S108).

Figure 13:
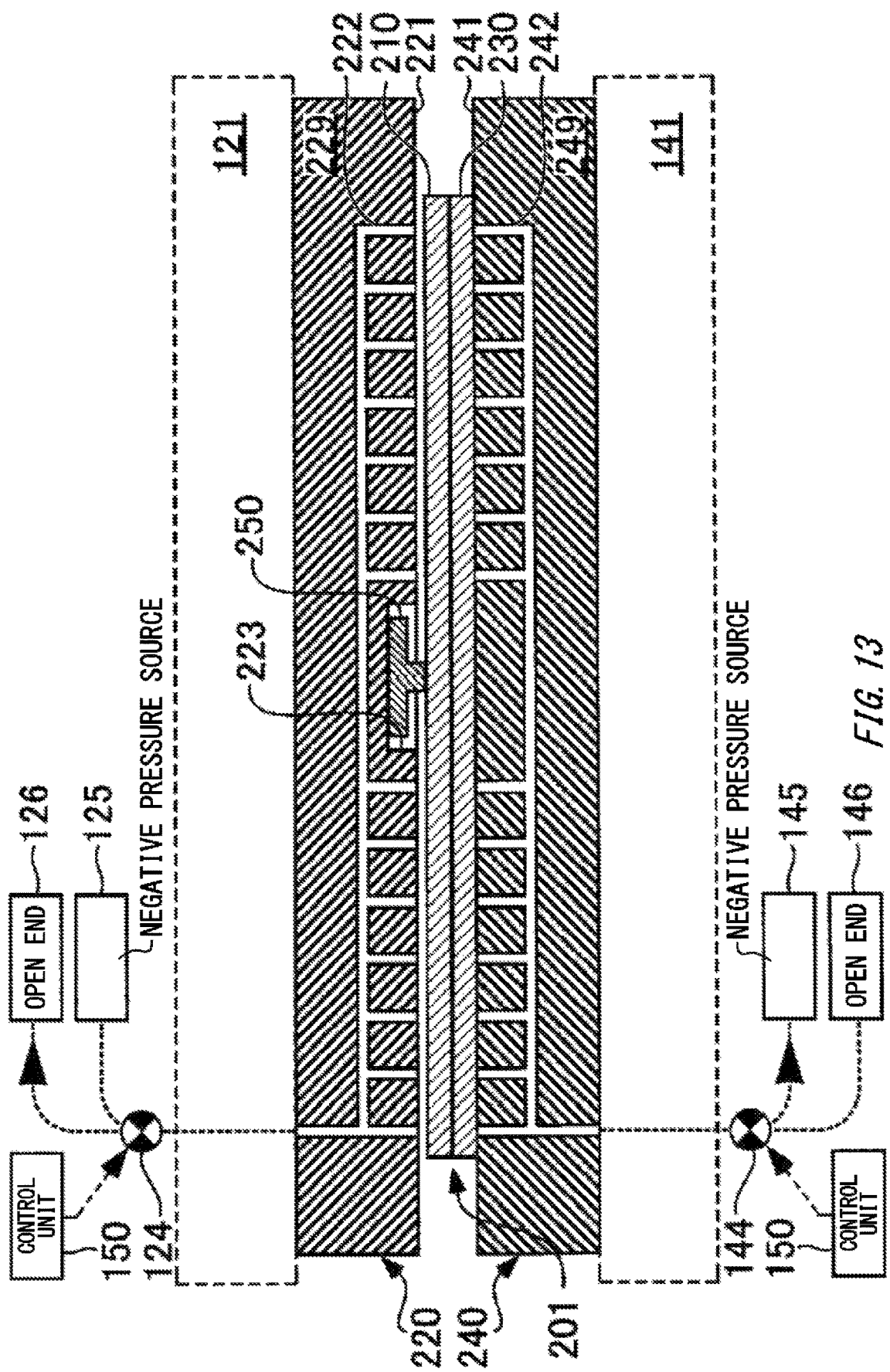
FIG. 13 is a schematic cross-sectional view of the substrates 210 and 230 in the bonding process.

FIG. 13 is a schematic cross-sectional view of the substrates 210 and 230 when the progress of the bonding wave described above is finished, and is illustrated from the same point of view as in FIGS. 11 and 12. As illustrated, the substrates 210 and 230 are entirely in contact and further bonded. The bonding of the substrates 210 and 230 is thus finished (step S109), and the two substrates 210 and 230 are integrally combined into a stacked substrate 201. As above, the bonding device 100 includes the movable stage 141 and the fixed stage 121, which serve as a holding section for holding the two substrates 210 and 230, including the substrate 210 in which the protrusion 215 is formed, and forms the bonding origin 209 by contacting the protrusion 215 of one of the substrates, 210, with the other substrate 230, and further, forms a bonding section for bonding the substrates 210 and 230 by enlarging the contact region from the bonding origin 209.

The suction of the substrate 210 by the substrate holder 240 suctioned onto the fixed stage 121 at the illustratively upper side is already released in step S107. Thus, the stacked substrate 201 formed is held on the substrate holder 240 held on the movable stage 141. Subsequently, the stacked substrate 201 is exported from the bonding device 100 (step S110). The stacked substrate 201 may be exported alone after first releasing the hold of the stacked substrate 201 by the substrate holder 240, or may be exported together with the substrate holder 240 while keeping the hold by the substrate holder 240 before separating the stacked substrate 201 from the substrate holder 240.

In the above-described example, the substrates 210 and 230, including the circuit regions 214 and the like as shown in FIG. 1, are aligned and bonded. Instead, the bonding device 100 may be used to bond substrates such as glass substrates and semiconductor substrates in which the circuit regions 214 and the like are not formed. In this case, the position measurement in step S103 and the alignment in step S105 may be eliminated from the bonding procedures shown in FIG. 2.

Figure 14:
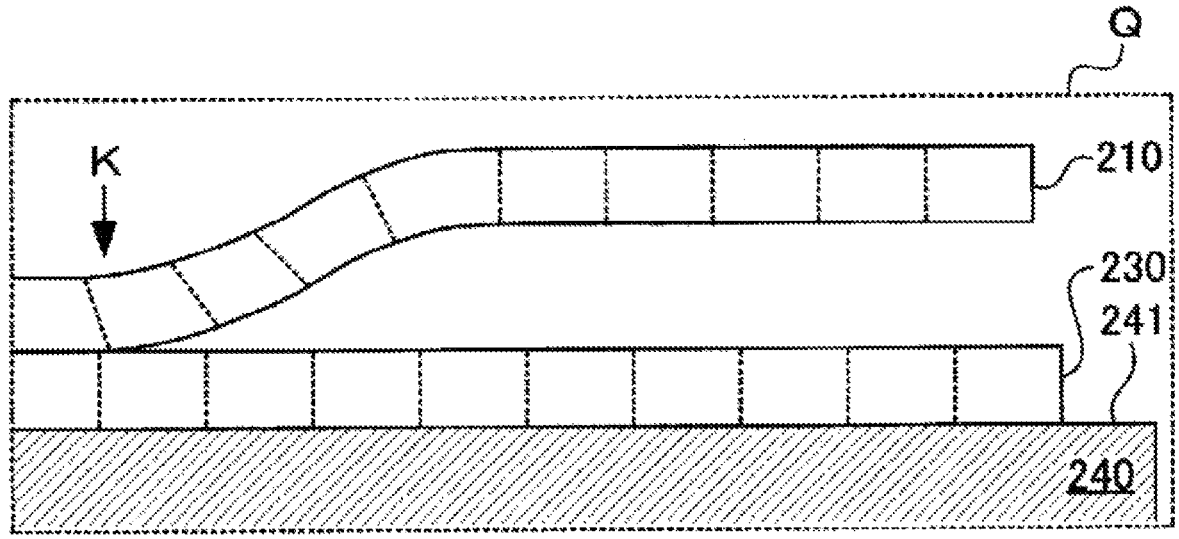
FIG. 14 is a schematic cross-sectional view of the bonding wave in progress.
Figure 15:
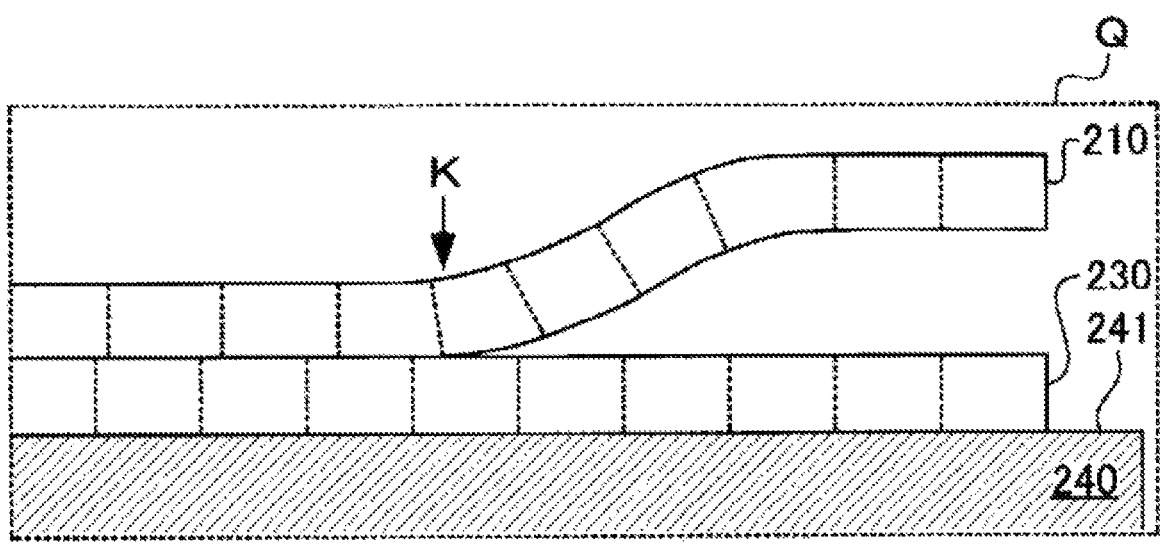
FIG. 15 is a schematic cross-sectional view of the bonding wave in progress.
Figure 16:
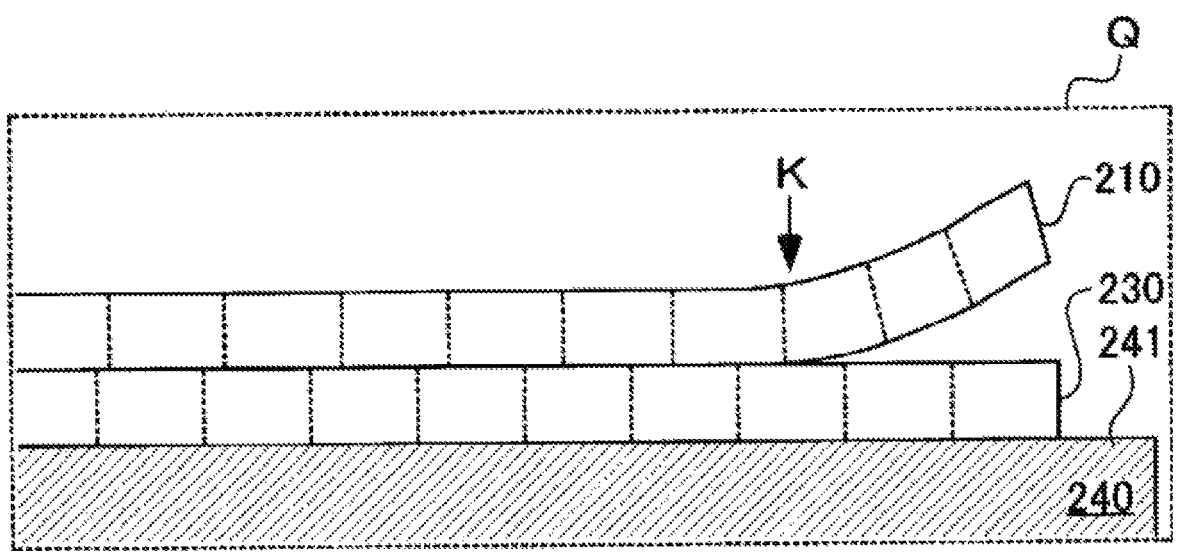
FIG. 16 is a schematic cross-sectional view of the bonding wave in progress.

FIGS. 14, 15, and 16 illustrate displacement between the substrates 210 and 230 occurring while the bonding wave progresses from the bonding origin 209 toward the outer periphery in the process of bonding the substrates 210 and 230. These figures enlarge the vicinity of boundary K between the bonding region and non-bonding regions of the substrates 210 and 230, that is, the extremity of the bonding wave in the process of bonding the substrates 210 and 230.

The displacement refers to a deviation from a predetermined relative position between corresponding alignment marks 213 of the two substrates 210 and 230, or between connections corresponding to each other. If the amount of displacement is larger than a threshold, connections will not be in contact with each other, or adequate electrical conduction cannot be obtained, or a predetermined bonding strength cannot be obtained between bonding portions.

As shown in FIG. 14, in the close vicinity of boundary K, the substrate 210, when released from the hold by the substrate holder 220, undergoes deformation of stretching at the illustratively lower surface side and contracting at the illustratively upper surface side. Further, as shown in FIG. 15, as the position of boundary K moves on the substrates 210 and 230, the position at which the above-described deformation occurs moves with boundary K.

When the substrates 210 and 230 deformed as described above by contact are bonded to each other, the stretch of the substrate 210 is fixed by being bonded to the substrate 230, so that the substrate 210 appears to be enlarged relative to the substrate 230. Thus, as seen from the displaced dotted lines in the figure, a displacement corresponding to the amount of stretch in the substrate 210 occurs between the lower substrate 230 held on the substrate holder 240 and the upper substrate 210 released from the substrate holder 220.

Further, as shown in FIG. 16, the above-described displacement accumulates as boundary K moves toward the outer periphery of the substrates 210 and 230, and the displacement increases toward the outer periphery.

Figure 17:
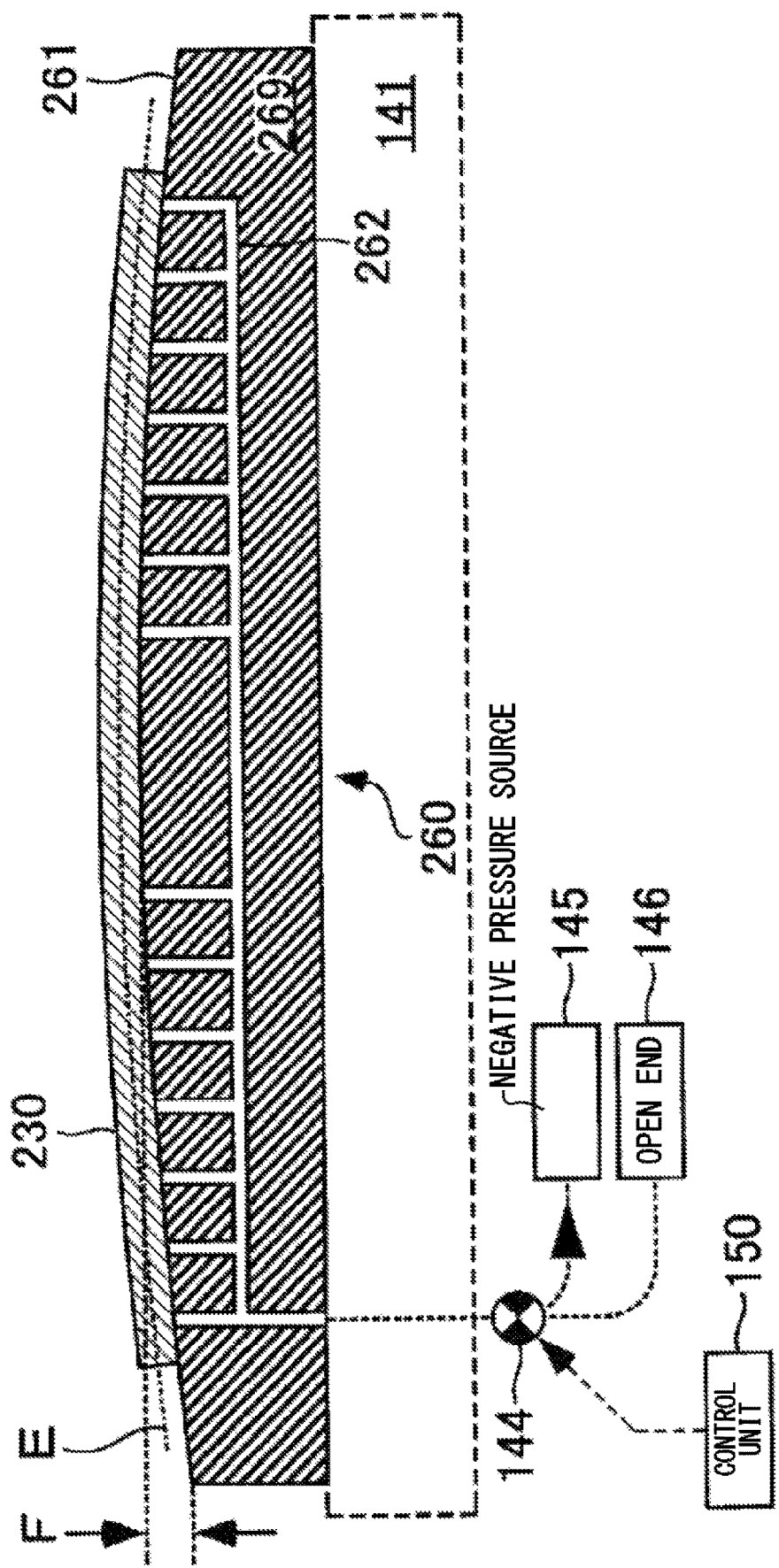
FIG. 17 is a schematic cross-sectional view of a substrate holder 260.

FIG. 17 is a schematic cross-sectional view of a substrate holder 260, which is prepared as a countermeasure against the displacement occurring in the bonding process as described above. The substrate holder 260 includes a main body 269 including a holding surface 261 and an air passage 262.

The holding surface 261 of the substrate holder 260 has a cross-sectional shape in which height gradually increases from the peripheral portion toward the central portion, and in the illustrated example, has a cross-sectional shape in which thickness gradually increases from the peripheral portion toward the central portion. Thus, the holding surface 261 forms, for example, a spherical surface. Also, a plurality of openings connecting with the air passage 262 are disposed in the holding surface 261. One end of the air passage 262 is coupled to a negative pressure source 145 or an open end 146, which are provided outside the substrate holder 260, via a control valve 144. Note that the shape of the holding surface 261 is certainly not limited to spherical, and may be, for example, a shape of a curved surface formed by revolution of a parabola on its axis of symmetry, or a paraboloid as its part, or a shape other than that of a solid of revolution such as a cylindrical surface as an outer peripheral surface of the solid obtained by sectioning a cylinder along its central axis.

When the control unit 150 controls the control valve 144 to connect the air passage 262 with the negative pressure source 145, the substrate 230 is suctioned onto the substrate holder 260. Since the holding surface 261 of the substrate holder 260 is a curved surface, the substrate 230, when suctioned onto the substrate holder 260, is curved in conformity with the shape of the holding surface 261.

When the substrate 230 is suctioned onto the holding surface 261 of the substrate holder 260, the front surface of the substrate 230, i.e., its illustratively upper surface is deformed to enlarge in in-plane directions from the center toward the peripheral portion, relative to central portion E of the substrate 230 in its thickness direction, which is indicated by the long dashed short dashed line in the figure. Meanwhile, the back surface of the substrate 230, i.e., its illustratively lower surface is deformed to contract in-plane directions from the center of the substrate 230 toward the peripheral portion.

Figure 18:
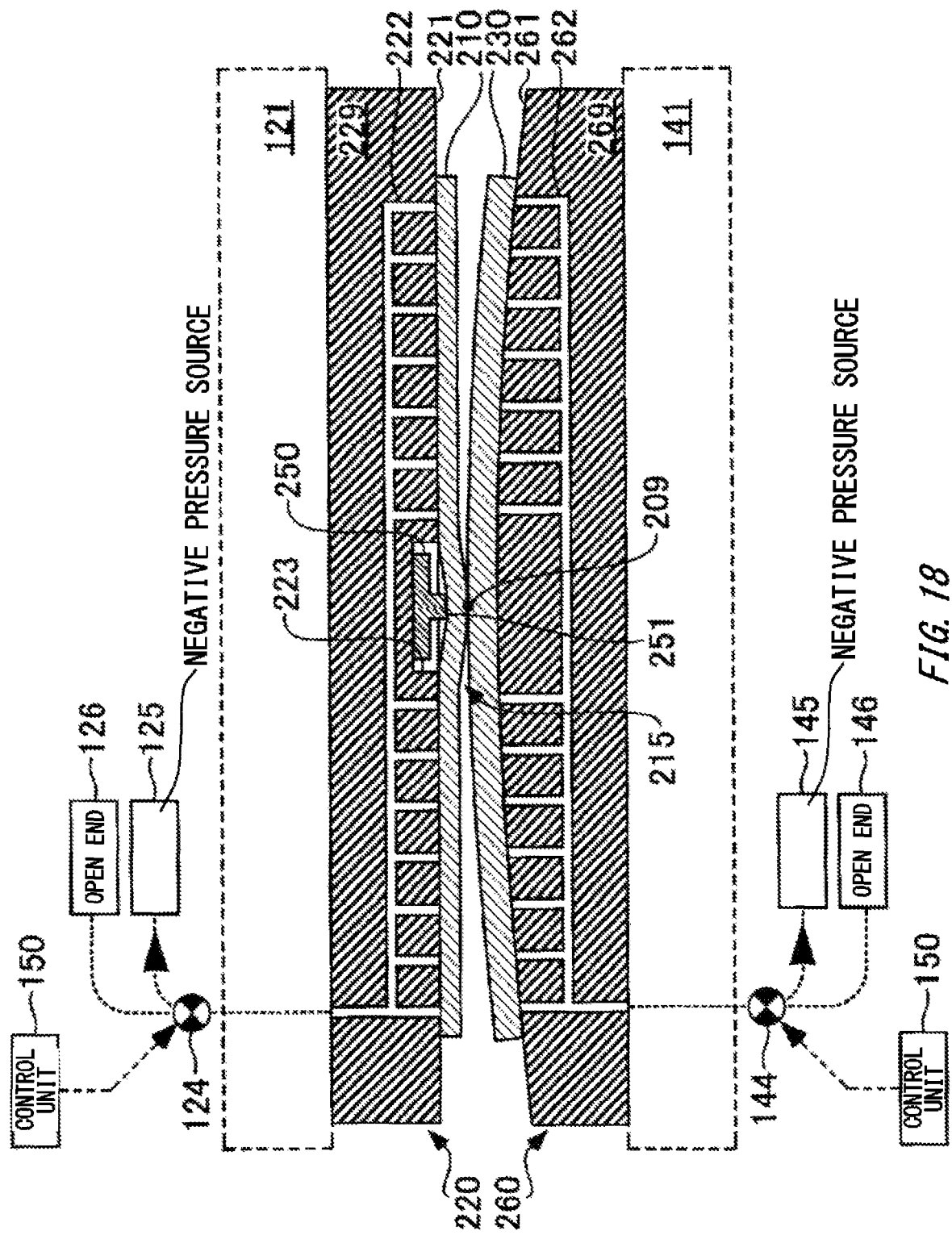
FIG. 18 is a schematic cross-sectional view in the bonding process using the substrate holder 260.

FIG. 18 is a schematic cross-sectional view illustrating a case of using the substrate holder 260 for holding the substrate 230 on the movable stage 141 side in the bonding device 100. The illustrated state corresponds to the point at which the bonding origin 209 is formed between the substrates 210 and 230 in step S106 shown in FIG. 2.

The substrate 210 is held on the illustratively upper substrate holder 220, and has the protrusion 215 locally formed by the abutting portion 251 of the projecting member 250. Thus, it is more certainly ensured that, when the substrates 210 and 230 contact, the bonding origin 209 is formed at an approximately central point of the protrusion 215 than in the case where the holding surface 261 of the substrate holder 260 is flat.

Figure 19:
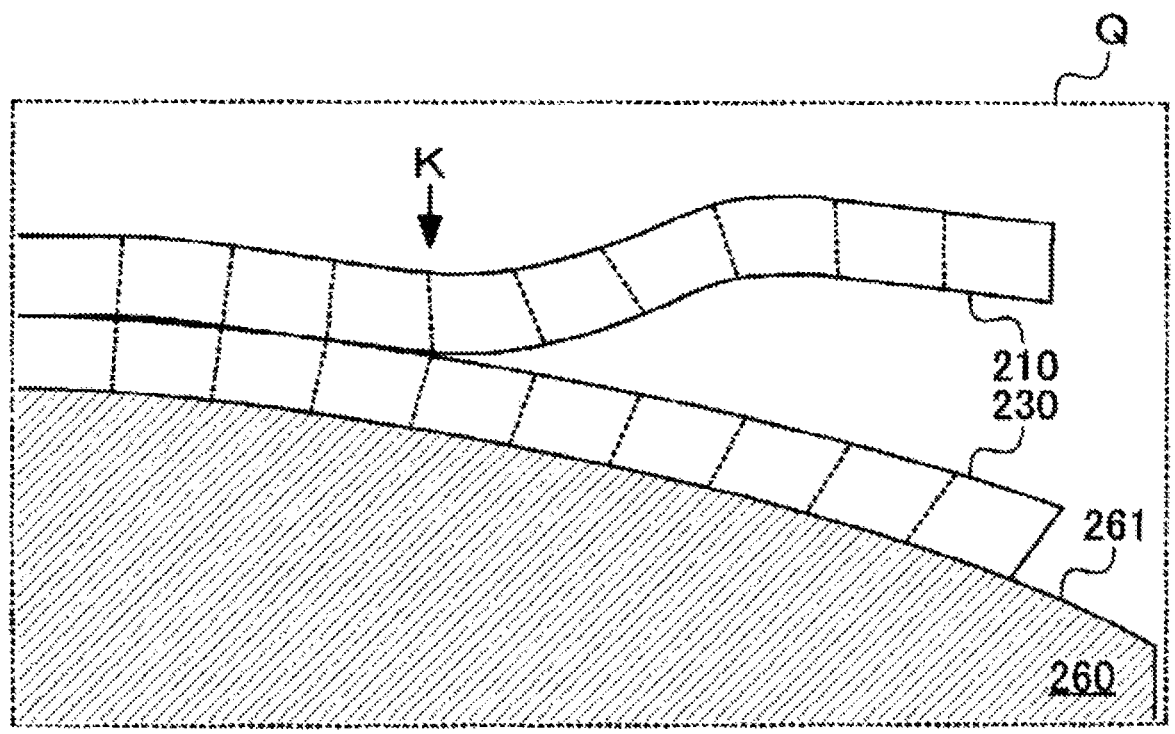
FIG. 19 is a schematic cross-sectional view of the bonding wave in progress.

The hold of the substrate 210 by the substrate holder 220 is then released, so that the bonding wave progresses between the substrates 210 and 230 as shown in FIG. 19 (step S108 in FIG. 2).

As illustrated, the upper surface of the substrate 230 held on the substrate holder 260, which has the raised holding surface 261, has an enlarged magnification ratio by conforming with the curved shape of the holding surface 261. Thus, when the hold of the substrate 210 by the substrate holder 240 is released and the substrate 210 is bonded to the substrate 230 and deformed, the deformation of the substrate 210 is cancelled by the curving deformation of the substrate 230, so that the stacked substrate 201 can be formed without causing displacement between the substrates 210 and 230.

Note that the magnification ratio mentioned above refers to a value obtained by dividing difference $(X_1-X_0)$ by distance $X_0$, assuming that a structure is designed to be positioned at distance $X_0$ from the center of a substrate and is positioned at distance $X_1$ from the center of the actually manufactured substrate. The magnification ratio is represented in unit of ppm (parts per million), for example.

While the holding surface 261 of the substrate holder 260 has a raised central portion in the above-described example, the holding surface 261 of the substrate holder 260 may have a depressed central portion, so that the surface of the substrate 230 contracts when being held, in order to reduce the magnification ratio. In this manner, even if the circuit regions 214 of the substrate 210 are smaller than as designed, the substrate 230 can be adapted accordingly, so as to suppress displacement.

The amount of change in magnification ratio occurring in the bonding process is also affected by the height of the protrusion 215 formed in the substrate 210. Thus, the curvature of the substrate holder 240 for holding the substrate 230 may be adjusted based on the amount of protrusion of the projecting member 250 from the holding surface 221 of the opposing substrate holder 220. More specifically, for example, if the projecting member 250 of the substrate holder 240 has a larger height, the substrate holder 240 may be selected to have a central portion raised at a larger curvature.

Figure 20:
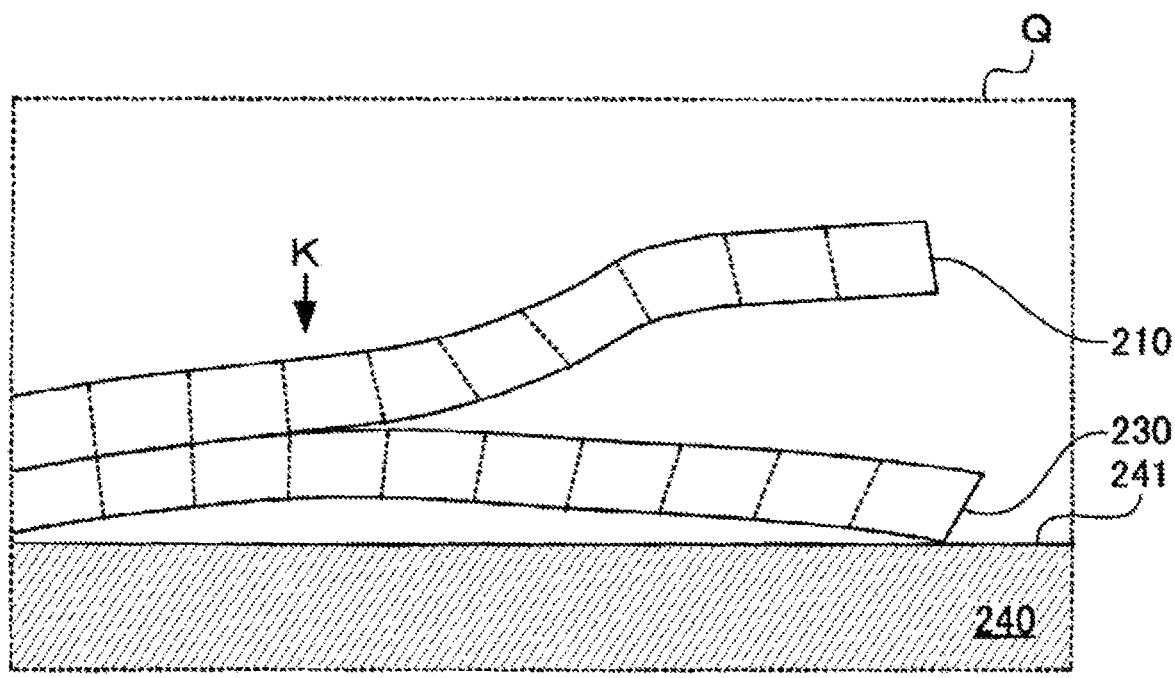
FIG. 20 is a schematic cross-sectional view of the bonding wave in progress.

FIG. 20 illustrates another countermeasure against displacement in the bonding process. The figure shows the bonding wave progressing between the substrates 210 and 230 (step S108 in FIG. 2).

In the illustrated method, the lower substrate 230 is held onto the substrate holder 240 having the flat holding surface 241, and the lower substrate 230 is released from the hold by the substrate holder 240 at the same time when the upper substrate 210 is released from the hold by the substrate holder 220. The pulling force from the upper substrate 210 causes the lower substrate 230 to lift up off the substrate holder 240 and become curved. This changes the shape of the lower substrate 230 such that its surface stretches, and thus the difference relative to the amount of stretch in the surface of the upper substrate 210 is decreased by the amount of this stretch. Therefore, displacement due to different amounts of deformation between the two substrates 210 and 230 is suppressed.

In other words, the displacement due to the difference in magnification ratio between the substrates 210 and 230 can be reduced by adjusting the amount of curvature, that is, the amount of stretching deformation of the substrate 230. In this manner, displacement between the substrates 210 and 230 can also be suppressed in the case of using the substrate holder 240 having the flat holding surface 241.

In the case of releasing the hold by both substrate holders 220 and 240, the substrates 210 and 230 may be actively maintained in contact at the position where the bonding origin 209 is to be formed until the bonding strength between the substrates 210 and 230 becomes high enough. This can prevent the bonding origin 209 from being formed at an undesired position of the substrates 210 and 230, which would result in air bubbles remaining in the stacked substrate 201. After the bonding of the substrates 210 and 230 is finished in step S109 (FIG. 2), the stacked substrate 201 may be held again by any of the substrate holders 220 and 240.

If a suction force is applied on the substrate 210 from the illustratively upper side at a region near boundary K, where the deformation of the substrate 210 occurs, in the overlaying process, a larger deformation occurs in the substrate 210 than in the case of performing no correction.

To release the hold of the substrate 230 for the purpose of correction, the holding force may merely be weakened rather than completely eliminating the holding force. As above, the magnification ratio of the substrate 230 can also be adjusted by adjusting the holding force of the substrate holder 240 on the substrate 230, so that displacement due to the difference in magnification ratio relative to the substrate 210 can be corrected.

FIGS. 21, 22, 23, and 24 show another method for bonding the substrates 210 and 230 using the bonding device 100 shown in FIG. 5, the substrate holder 220 shown in FIG. 3, and the substrate holder 260 shown in FIG. 17. The same descriptions of the individual members used will not be repeated here.

Figure 21:
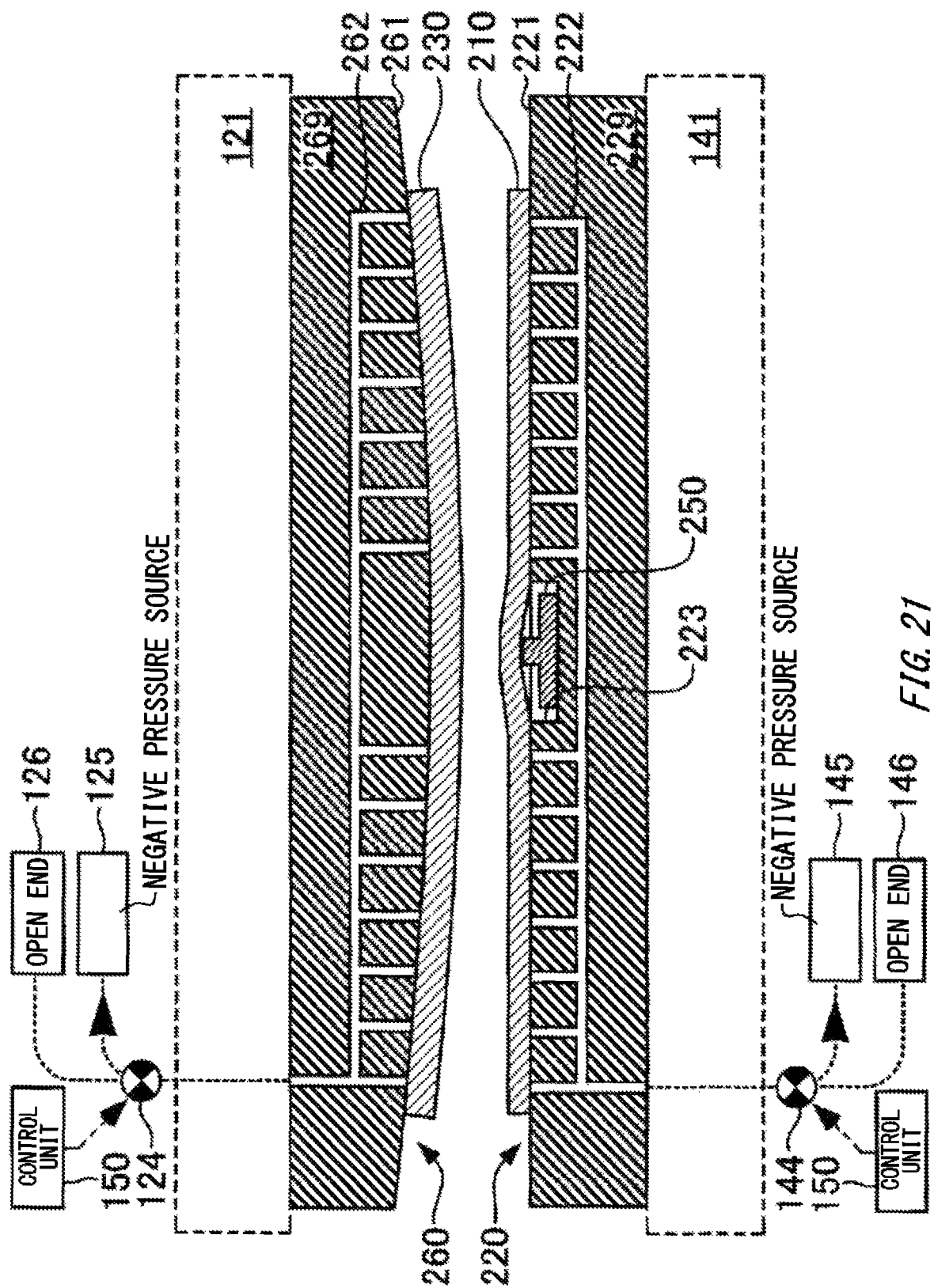
FIG. 21 is a schematic cross-sectional view in the bonding process using the substrate holder 260.

As shown in FIG. 21, the substrate holder 220 holds the substrate 210, is imported into the bonding device 100, and is held onto the movable stage 141. The substrate holder 260 holds the substrate 230, is imported into the bonding device 100, and is held onto the fixed stage 121.

Figure 22:
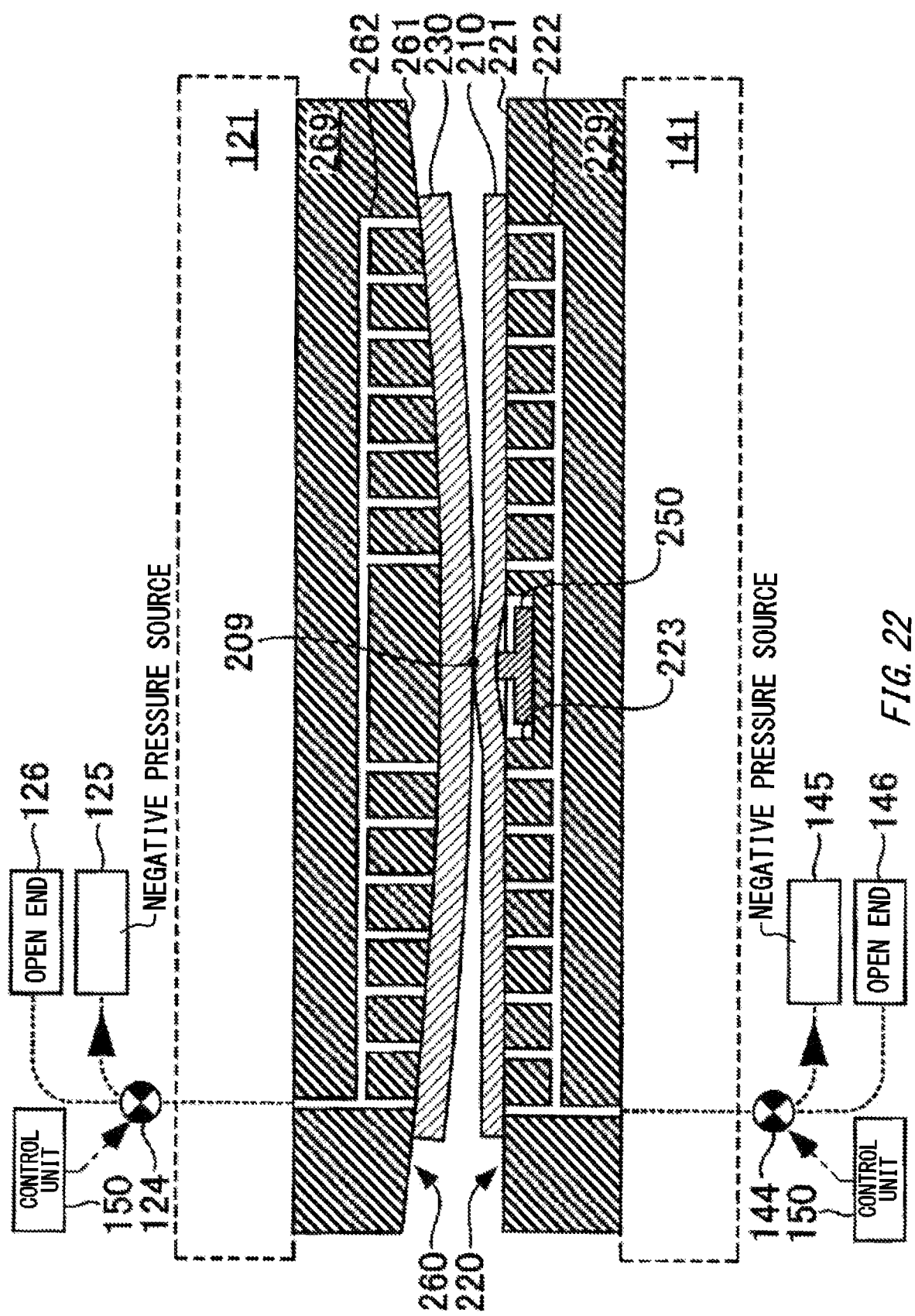
FIG. 22 is a schematic cross-sectional view in the bonding process using the substrate holder 260.
Figure 23:
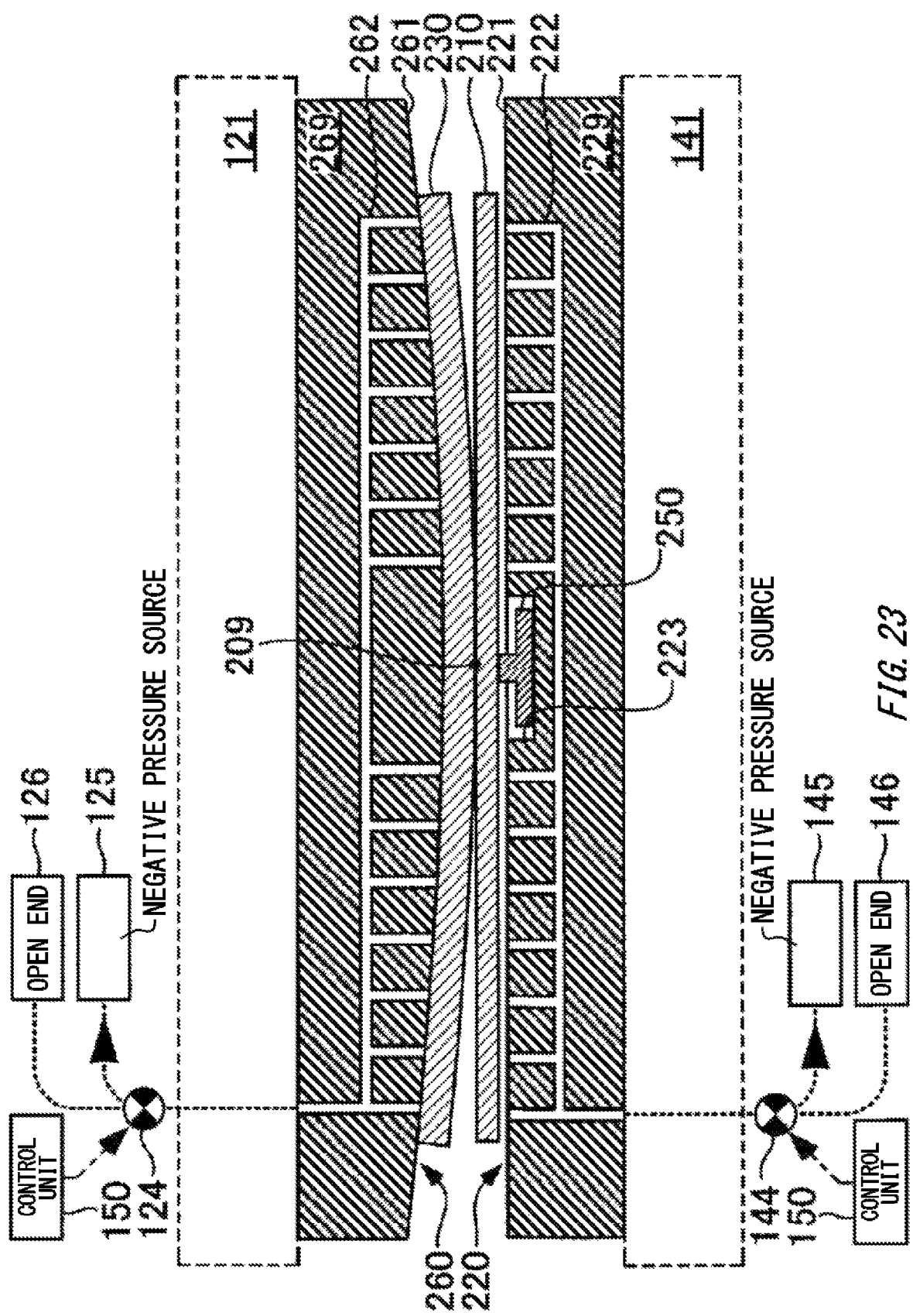
FIG. 23 is a schematic cross-sectional view in the bonding process using the substrate holder 260.

After the position measurement (step S103), the substrate activation (step S104), and the substrate alignment (step S105), the substrate 210 in which the protrusion 215 is formed is elevated by the movable stage 141 to form the bonding origin 209 as shown in FIG. 22 (step S106). Further, as shown in FIG. 23, the hold of the substrate 210 by the substrate holder 220 is released (step S107), so that the bonding wave progresses (step S108).

Figure 24:
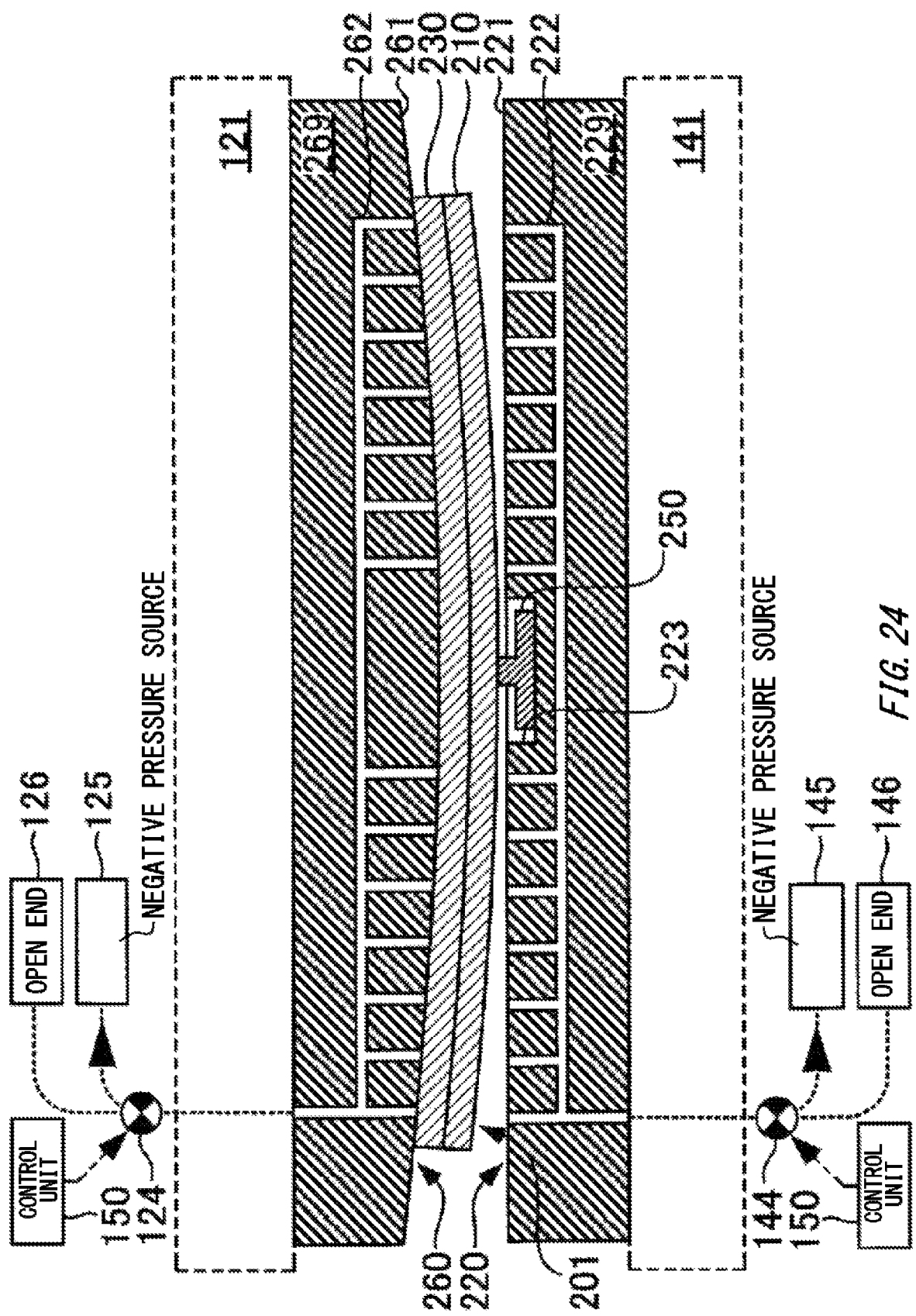
FIG. 24 is a schematic cross-sectional view in the bonding process using the substrate holder 260.

As the bonding wave progresses between the substrates 210 and 230, the substrate 210, which has been released from the hold by the substrate holder 220 positioned at the illustratively lower side, is bonded to the substrate 230 held on the illustratively upper substrate holder 240, so that the stacked substrate 201 is formed as shown in FIG. 24. As above, according to the bonding device 100, the stacked substrate 201 can also be formed by releasing the lower substrate 210.

Figure 25:
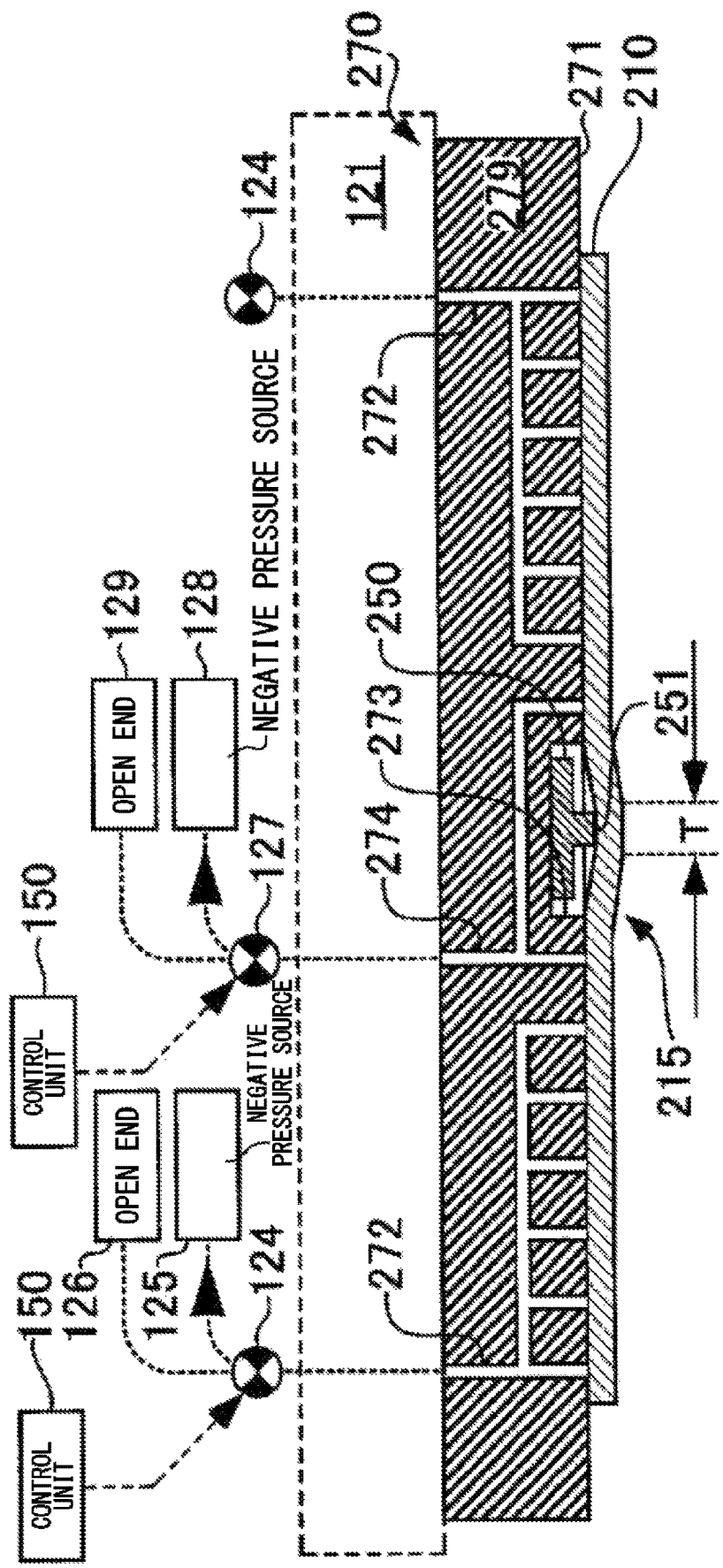
FIG. 25 is a schematic cross-sectional view of a substrate holder 270.

FIG. 25 is a schematic cross-sectional view of another substrate holder 270 having a flat holding surface 271. The figure shows the substrate holder 270 holding the substrate 210 and held on the fixed stage 121.

The substrate holder 270 includes a main body 279 and a projecting member 250. The projecting member 250 and the recess 273 of the holding surface 271 for accommodating the projecting member 250 are equal in shape to the projecting member 250 and the recess 223 of the substrate holder 220 that are shown in FIG. 3, and the same descriptions will not be repeated here.

The main body 279 includes two types of air passages 272 and 274 that are independent of each other. One of the air passages, 272, includes a plurality of openings disposed at an outer peripheral side of the holding surface 271. The other end of the air passage 272 is coupled to a negative pressure source 125 or an open end 126, which are provided outside the substrate holder 270, via a control valve 124. The control valve 124 selectively connects the air passage 272 with the negative pressure source 125 or the open end 126 under control of the control unit 150 of the bonding device 100.

When the control valve 124 connects the air passage 272 with the negative pressure source 125, a negative pressure is applied through the openings of the holding surface 271 to suction the substrate 210 onto the outer peripheral side of the holding surface 271. When the control valve 124 connects the air passage 272 with the open end 126, the suction of the substrate 210 onto the holding surface 271 of the substrate holder 270 is released.

The other air passage 274 includes a plurality of openings disposed in the holding surface 271 around the recess 273 accommodating the projecting member 250. The other end of the air passage 274 is coupled to a negative pressure source 128 or an open end 129, which are provided outside the substrate holder 270, via a control valve 127. The control valve 127 selectively connects the air passage 274 with the negative pressure source 128 or the open end 129 under control of the control unit 150 of the bonding device 100.

When the control valve 127 connects the air passage 274 with the negative pressure source 128, a negative pressure is applied through the openings of the holding surface 271 to suction the substrate 210 onto the holding surface 271 around the recess 273. When the control valve 127 connects the air passage 274 with the open end 129, the suction of the substrate 210 around the recess 273 is released.

In the step of holding the substrate 210 onto the substrate holder 270 (step S101 in FIG. 2), both of the air passages 272 and 274 are connected with the negative pressure sources, 125 and 129, to suction the substrate 210 onto the entire region of the holding surface 271. Thus, the protrusion 215 is formed in the substrate 210 at region T, where the abutting portion 251 abuts.

Figure 26:
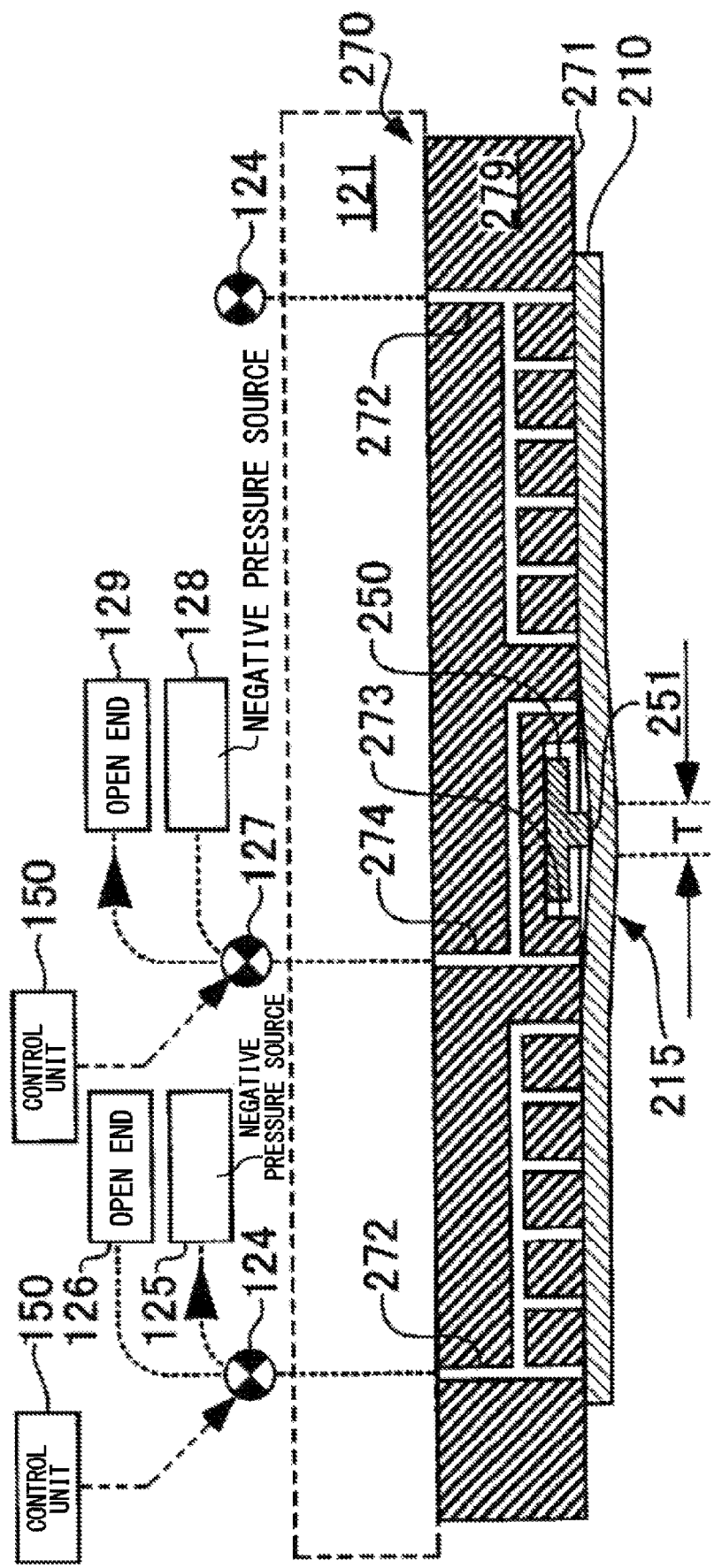
FIG. 26 is a schematic cross-sectional view of a substrate holder 270.

FIG. 26 shows a next step. This step is performed after the step of holding the substrate 210 by the substrate holder 270 (step S101) and before the step of starting the position measurement on the substrate 210 (step S103).

The control unit 150 may control the control valve 127 to connect the air passage 274 with the open end 129 before starting the position measurement of the alignment marks 213 on the substrate 210. This eliminates the suction force around the projecting member 250 in the substrate holder 270, and the region of the substrate 210 that is no longer suctioned goes away from the holding surface 271.

Therefore, the curvature of the extremity of the protrusion 215 of the substrate 210 decreases, and the amount of deformation of the illustratively lower surface of the substrate 210 also decreases, so that the deformation of the surface of the substrate 210 at its central portion due to the formation of the protrusion 215 is mitigated. Note that the step of connecting the air passage 274 with the open end 129 is not necessary, and the measurement in step S103 may be started while the air passage 274 is connected to the negative pressure source 145.

The position measurement of the alignment marks 213 (step S103) is performed in this state. This reduces the difference between the positions of the alignment marks 213 when the substrate 210 is suctioned onto the holding surface 271 at the central portion of the substrate 210, that is, when the protrusion 215 is formed at the central portion of the substrate 210 and the positions of the alignment marks 213 at the time of releasing the substrate 210 from the holding surface 271 and bonding the substrate 210 to the substrate 230, and thus the accuracy of aligning the substrates 210 and 230 can be improved.

Figure 27:
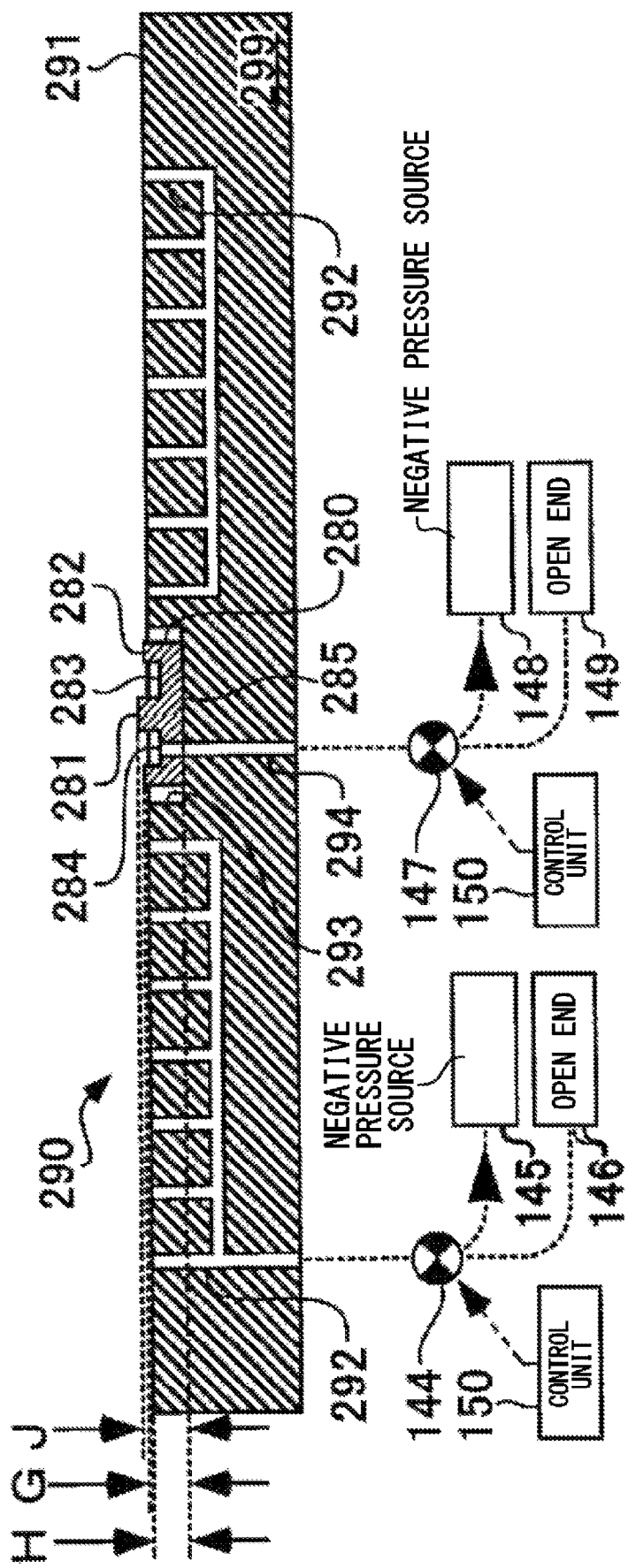
FIG. 27 is a schematic cross-sectional view of a substrate holder 290.

FIG. 27 is a schematic cross-sectional view of another substrate holder 290. The substrate holder 290 includes a main body 299 and a projecting member 280.

The main body 299 includes a holding surface 291, air passages 292 and 294, and a recess 293. The holding surface 291 is the illustratively upper surface of the main body 299 and is flat. The recess 293 is provided at a central part of the holding surface 291 and is depressed from the holding surface 291. Further, the main body 299 includes a plurality of air passages 292 and 294 formed therethrough in its thickness direction.

One of the air passages, 292, has a plurality of openings distributed over the entire region of the holding surface 291 except its central portion. The other end of the air passage 292 is coupled to a negative pressure source 145 or an open end 146, which are provided outside the substrate holder 290, via a control valve 144. The control valve 144 selectively connects the air passage 292 with the negative pressure source 145 or the open end 146 under control of the control unit 150 of the bonding device 100.

When the control valve 144 connects the air passage 292 with the negative pressure source 145, a negative pressure is applied through the openings of the holding surface 291 to suction the substrate 210 onto the holding surface 291 of the substrate holder 290. When the control valve 144 connects the air passage 292 with the open end 146, the suction force of the holding surface 291 is eliminated to release the suction of the substrate 210 onto the holding surface 291 of the substrate holder 220.

The other air passage 294 has one end opened at the bottom of the recess 293. The other end of the air passage 294 is coupled to a negative pressure source 148 or an open end 149, which are provided outside the substrate holder 290, via a control valve 147. The control valve 147 selectively connects the air passage 294 with the negative pressure source 148 or the open end 149 under control of the control unit 150 of the bonding device 100.

Figure 28:
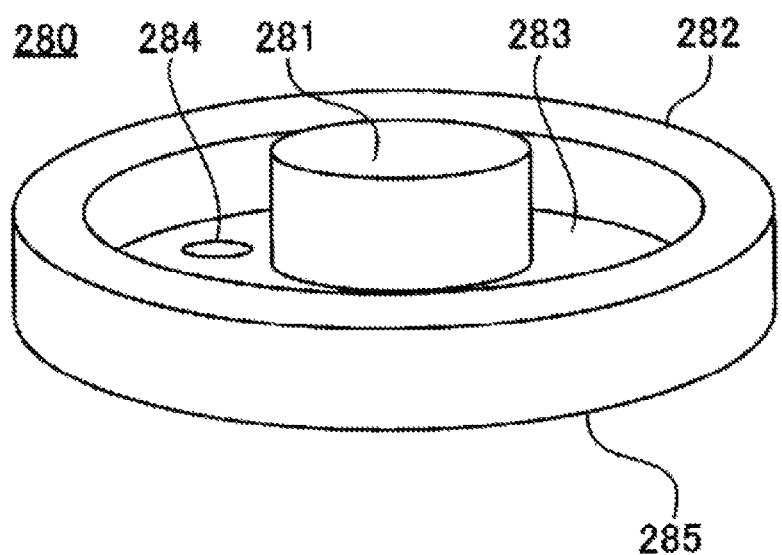
FIG. 28 is a perspective view of a projecting member 280.

FIG. 28 is a perspective view of the projecting member 280. The projecting member 280 includes an abutting portion 281, a peripheral wall portion 282, and an air passage 284. The projecting member 280 is another example of the forming section for forming the protrusion 215 at a partial region of the substrate 210.

The abutting portion 281 is disposed at the extremity of a projection that protrudes illustratively upward at a central part of the projecting member 280. The peripheral wall portion 282 is disposed annularly along the outer periphery of the projecting member 280. A grooved portion 283 is thus formed between the abutting portion 281 and the peripheral wall portion 282.

The air passage 284 has, at its one end, an opening inside the grooved portion 283, and is formed through the projecting member 280 to its lower surface. When the projecting member 280 is accommodated in the recess 293 of the main body 299, the air passage 284 is connected with the air passage 294 of the main body 299. Thus, when the control valve 147 connects the air passage 294 with the negative pressure source 148, a negative pressure is applied inside the grooved portion 283 of the projecting member 280 to suction the substrate 210 onto the grooved portion 283. That is, the grooved portion 283 is an example of a suctioning section for attracting the substrate 210. When the control valve 147 connects the air passage 294 with the open end 149, the suction force of the grooved portion 283 of the projecting member 280 is eliminated.

When the projecting member 280 is accommodated in the recess 293 of the main body 299, at least part of the abutting portion 281 and at least part of the peripheral wall portion 282 protrude from the holding surface 291. In the illustrated example, the peripheral wall portion 282 is lower in height than the abutting portion 281.

Referring back to FIG. 27, height G of the peripheral wall portion 282 of the projecting member 280 is larger than depth H of the recess 293, and the illustratively upper end of the peripheral wall portion 282 protrudes from the holding surface 291. In the illustrated example, height J of the abutting portion 281 is even larger than the height of the peripheral wall portion 282, and the illustratively upper end of the abutting portion 281 further protrudes from the peripheral wall portion 282.

Figure 29:
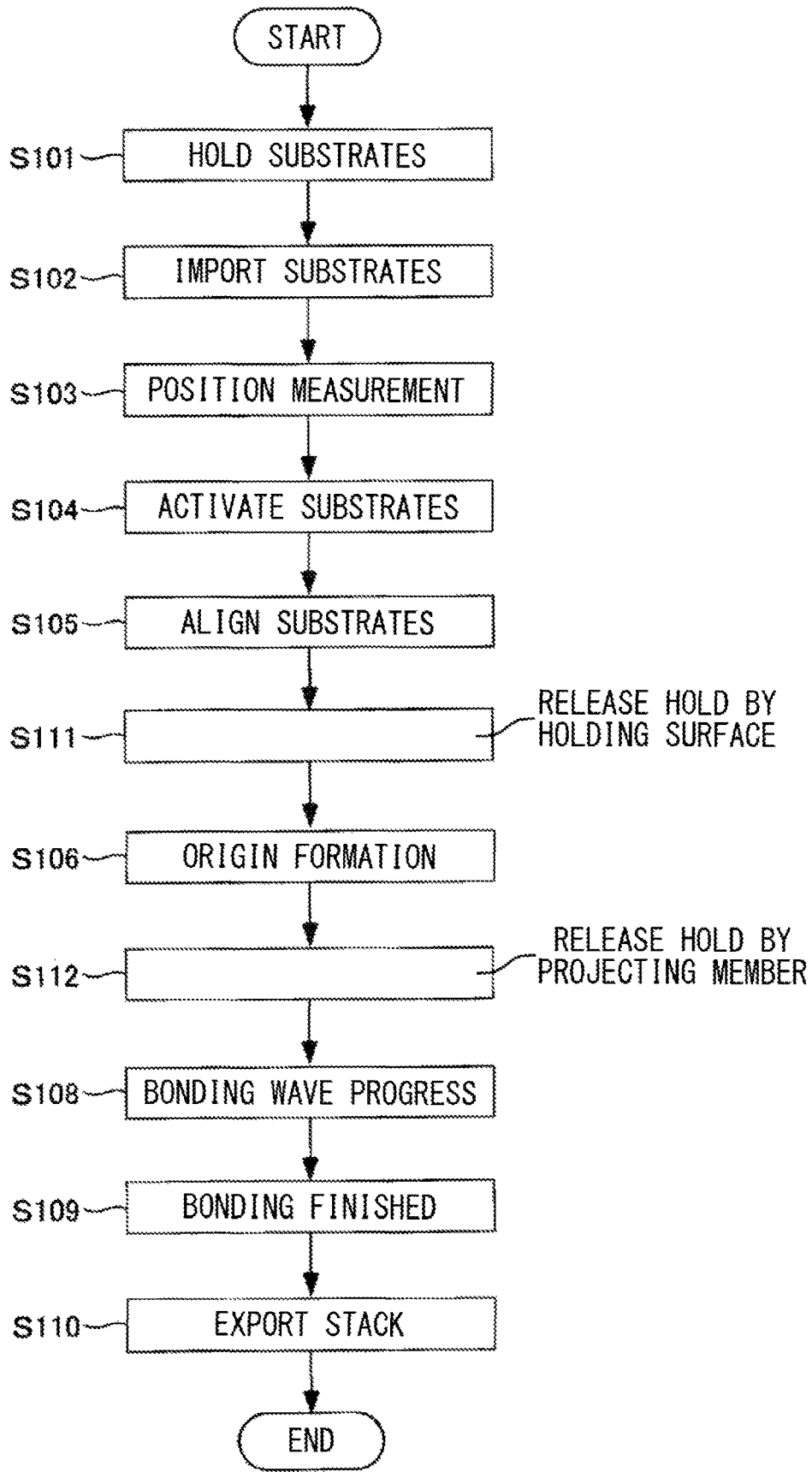
FIG. 29 is a flow diagram showing additional bonding procedures.

FIG. 29 is a flow diagram showing procedures for bonding the substrates 210 and 230 using the bonding device 100 shown in FIG. 5, the substrate holder 260 shown in FIG. 17, and the substrate holder 290 shown in FIG. 27. The operations in the procedures shown in FIG. 29 that are the same as those in the procedures shown in FIG. 2 are provided with the same reference symbols to simplify the descriptions thereof.

First, the substrates 210 and 230 are held onto the substrate holders 290 and 260, respectively (step S101). In this process, the substrate holder 290 suctions the substrate 210 using both the air passage 292 of the main body 299 and the grooved portion 283 of the projecting member 280.

In this manner, regions of the substrate 210 other than its central portion are suctioned onto the holding surface 291 of the main body 299. The central portion of the substrate 210 partially abuts the abutting portion 281 of the projecting member 280, to form the protrusion 215 at the central portion. Further, the outer periphery of the protrusion 215 partially abuts the upper end of the peripheral wall portion 282 of the projecting member 280, so that the central portion of the substrate 210 is suctioned from the grooved portion 283.

Figure 30:
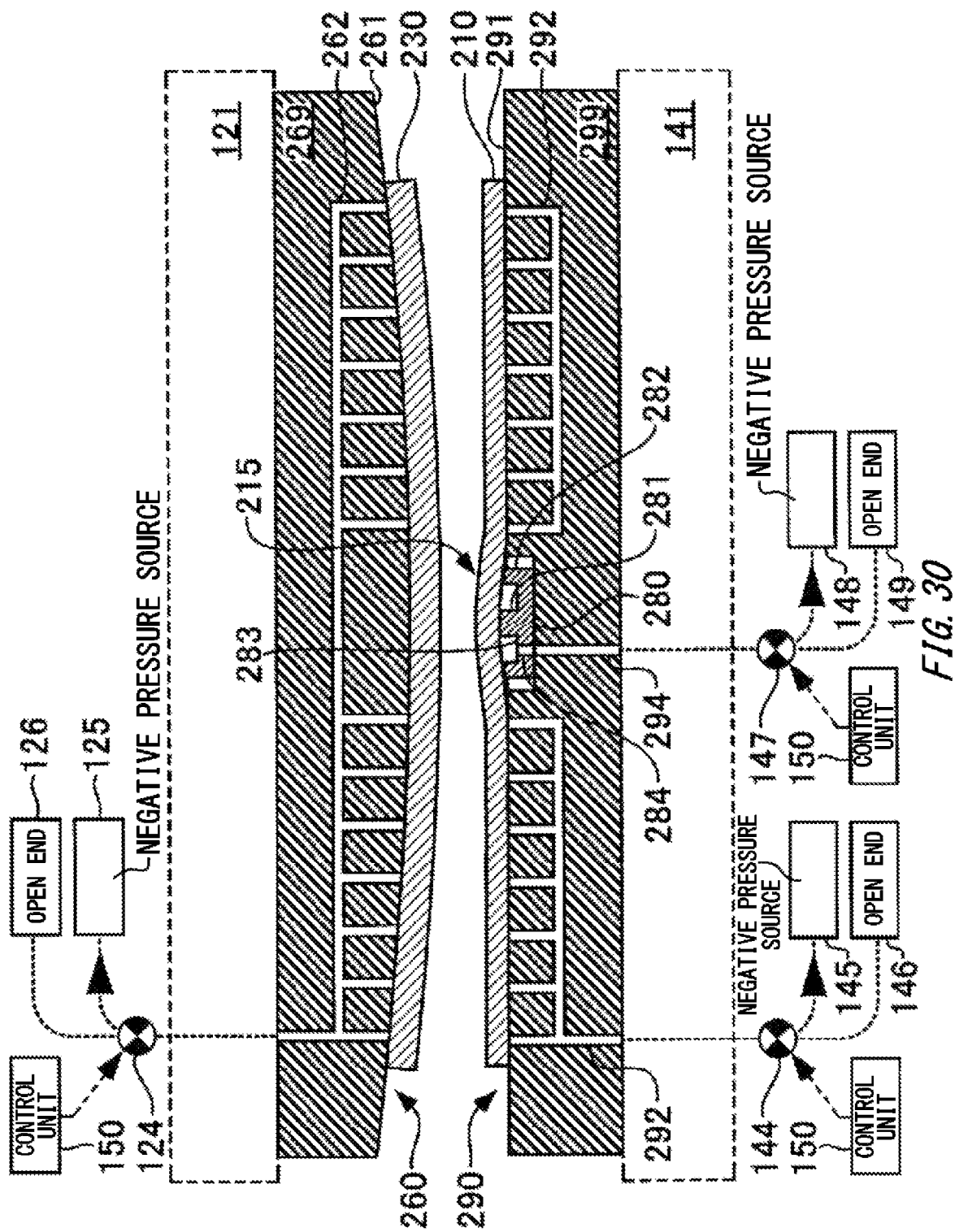
FIG. 30 is a schematic cross-sectional view in the bonding process using the substrate holders 260 and 290.

Next, the substrates 210 and 230 held on the substrate holders 290 and 260 are imported into the bonding device 100 as shown in FIG. 30 (step S102). In the illustrated example, the substrate holder 290 holding one of the substrates, 210, is imported onto the movable stage 141, the substrate holder 260 holding the other substrate 230 is imported onto the fixed stage 121.

Figure 31:
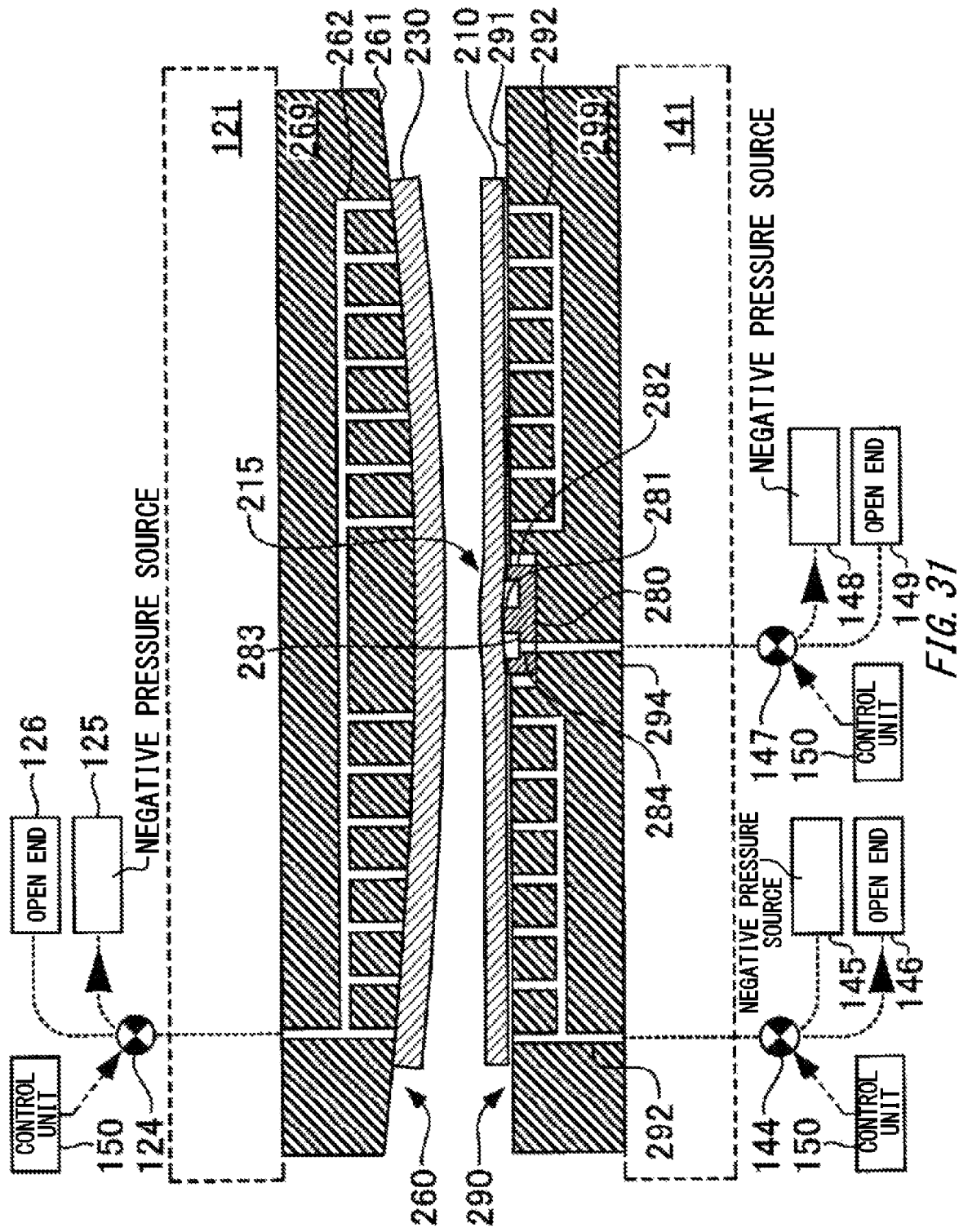
FIG. 31 is a schematic cross-sectional view in the bonding process using the substrate holders 260 and 290.

After the position measurement (step S103), the substrate activation (step S104), and the substrate alignment (step S105) are performed, the control unit 150 switches the control valve 144 to connect the air passage 292 of the holding surface 291 of the substrate holder 290 with the open end 146, as shown in FIG. 31. This releases the suction of the regions of the substrate 210 other than the central portion on the holding surface 291 (step S111).

When the hold by the holding surface 291 is released, a jet of fluid may be applied onto the holding surface 291 through the air passage 292 to actively move the substrate 210 away from the holding surface 291. This can facilitate the release of the substrate 210, reducing the time required to proceed to the next step. Also, pushing the substrate 210 away from the holding surface 291 with a jet of fluid can mitigate the deformation of the substrate 210 at the protrusion 215.

Figure 32:
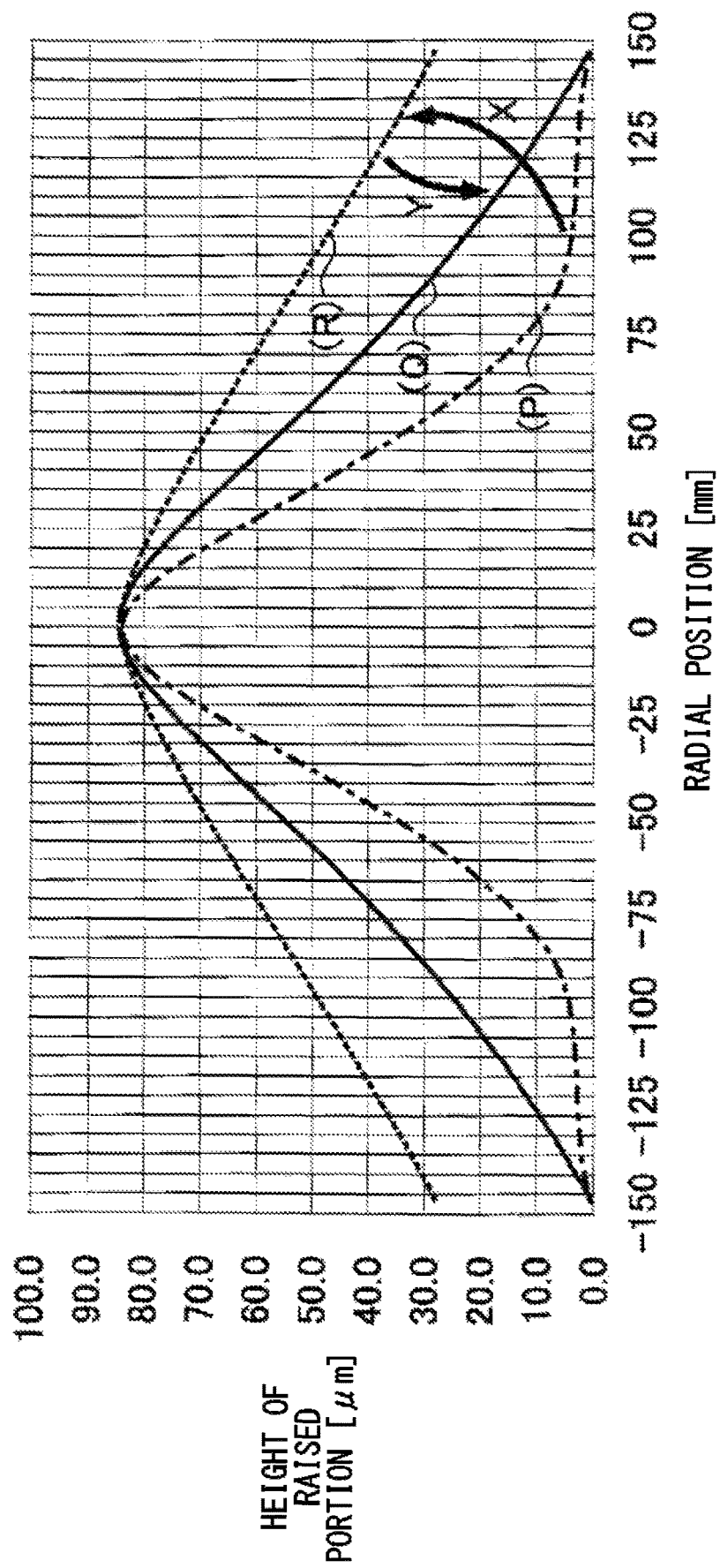
FIG. 32 is a graph illustrating the bonding process using the substrate holder 270.

FIG. 32 is a graph showing changes in cross-sectional shape of the protrusion 215 of the substrate 210 held on the substrate holder 290. For curve P illustrated, when both the holding surface 291 and the projecting member 280 suction the substrate 210, the central portion of the substrate 210 closely contacts the abutting portion 281 to form the protrusion 215.

When the suction of the holding surface 291 of the substrate holder 290 is released, and further the outer periphery of the substrate 210 is pushed up with a jet of fluid from the air passage 292, the outer periphery of the protrusion 215 deforms as indicated by arrow X to form curve R illustrated, in which the curvature of the extremity of the protrusion 215 is smaller than in curve P, with no change in height of the protrusion 215.

Further, when the jet of fluid from the air passage 292 is ceased, the protrusion 215 of the substrate 210 no longer undergoes the application of the pushing-up force, and deforms as indicated by arrow Y to form curve Q illustrated, in which the curvature of the extremity of the protrusion 215 is larger than in curve R and smaller than in curve P, with no change in height of the protrusion 215. In the state of curve Q, the curvature is lower than in curve P, in which there is no active application of a jet of fluid, and the deformation of the substrate 210 at the protrusion 215 is mitigated.

When the hold of the holding surface 291 is released, the substrate 210 may undergo vibration while leaving the holding surface 291. If the next step is performed with this vibration remaining, the accuracy of alignment of the substrates 210 and 230 may be affected. Accordingly, after step S111, the next step may be suspended, for example, until the amplitude of the substrate vibration reaches such a degree that the substrates 210 and 230 do not contact at portions other than the center, or until it reaches such a degree that the amount of displacement between the substrates 210 and 230 does not exceed an acceptable range due to the change in speed of progress of the bonding wave caused by the substrate vibration.

Figure 33:
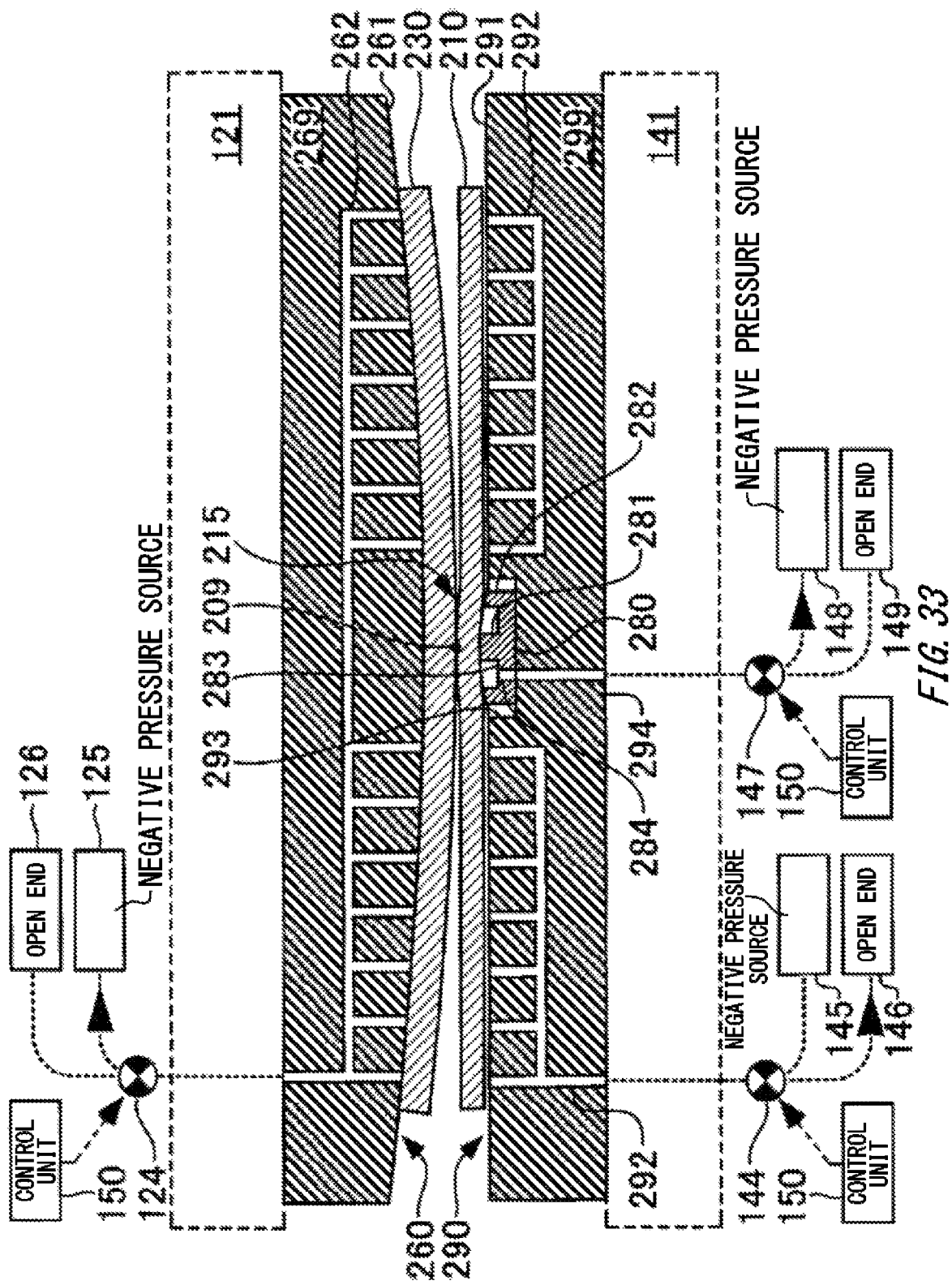
FIG. 33 is a schematic cross-sectional view in the bonding process using the substrate holders 260 and 290.

At the stage of step S111, the substrate holder 290 continues the suction of the substrate 210 at the grooved portion 283 of the projecting member 280. Thus, the protrusion 215 is still formed in the substrate 210 by the abutting portion 281. In this state, the control unit 150 causes the Z-direction driving unit 133 to elevate the movable stage 141, so that the protrusion 215 of the substrate 210 contacts the other substrate 230 to form the bonding origin 209, as shown in FIG. 33 (step S106).

The outer peripheral portion of the substrate 210 is released from the hold by the holding surface 291, while a suction force from the projecting member 280 is applied to the substrate 210 in the direction away from the substrate 230. Thus, even when the bonding origin 209 is formed between the substrates 210 and 230, the contact region is prevented from continuing to enlarge.

Figure 34:
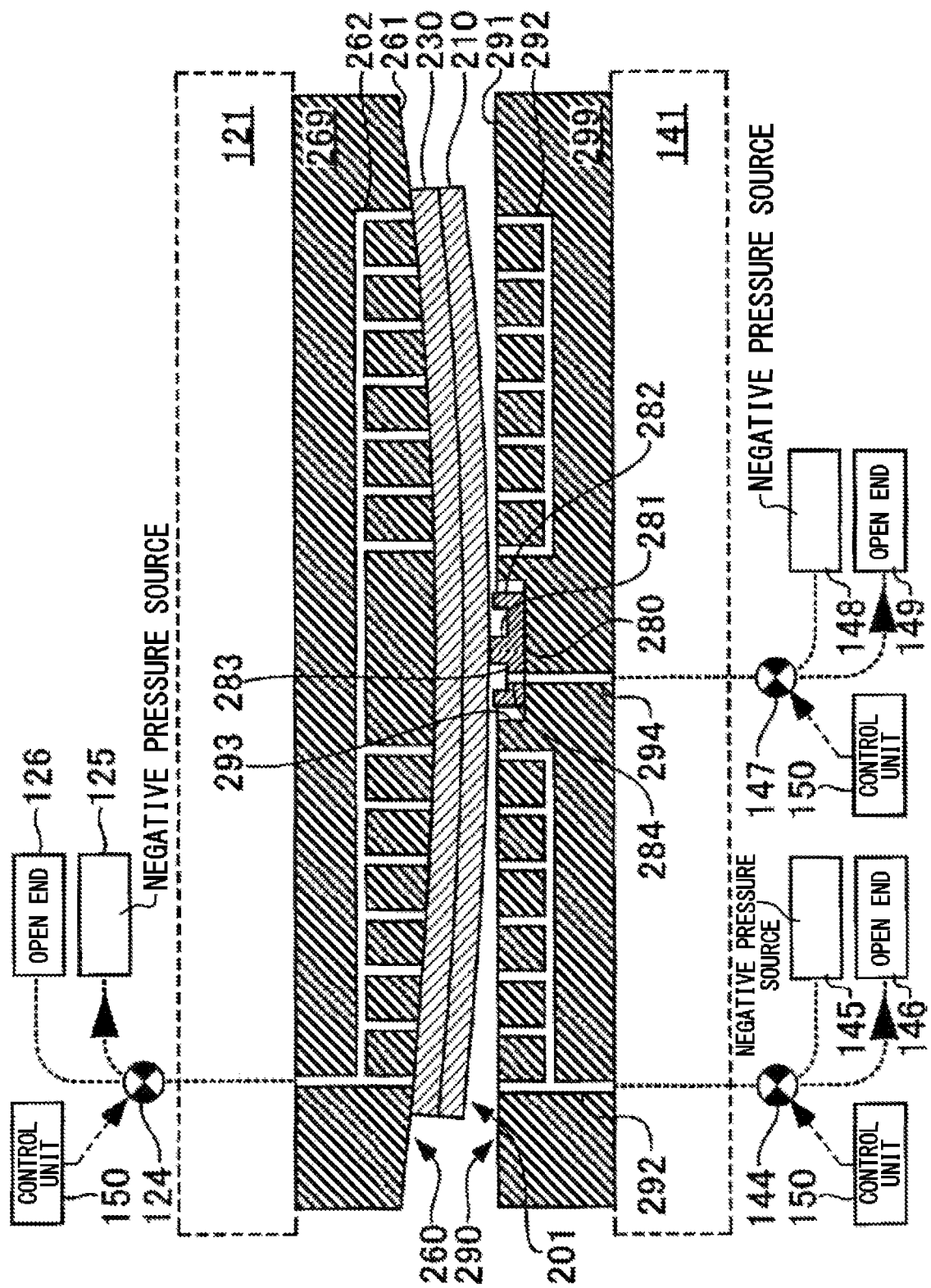
FIG. 34 is a schematic cross-sectional view in the bonding process using the substrate holders 260 and 290.

The control unit 150 then causes the control valve 147 to connect the air passages 294 and 284 with the open end 149. Thus, the suction of the substrate 210 by the projecting member 280 is released (step S107), and the bonding wave progresses between the substrates 210 and 230 (step S108), as shown in FIG. 34. In this process, in order to prevent displacement between the substrates 210 and 230 during the progress of the bonding wave, the control unit 150 controls the position of the movable stage 141 such that the abutting portion 281 of the projecting member 280 keeps on pushing the substrate 210 against the substrate 230.

When the substrate 210 contacts the substrate 230 for forming the bonding origin 209 with its outer peripheral portion not held in step S106, vibration may occur in the outer peripheral portion of the substrate 210. If the next step is performed with the vibration remaining in the substrate 210, the accuracy of alignment of the substrates 210 and 230 may be affected. Accordingly, as described above, the next step may be suspended until the substrate vibration is sufficiently decreased.

Subsequently, after the bonding wave reaches the outer periphery and the bonding is finished (step S109), the stacked substrate 201 formed is exported from the bonding device 100, as in the case described with respect to FIG. 2. As above, the projecting member 280 may also be provided with a suctioning functionality, so as to minutely control the process of bonding the substrates 210 and 230.

In the above-described example, height J of the abutting portion 281 of the projecting member 280 is larger than the height of the peripheral wall portion 282. However, height J of the abutting portion 281 may be the same as height G of the peripheral wall portion 282. If height G is equal to height J of the abutting portion 281, the attracting force applied to the substrate 210 is increased, and it is ensured that the substrate 210 is held by the projecting member 280.

Figure 35:
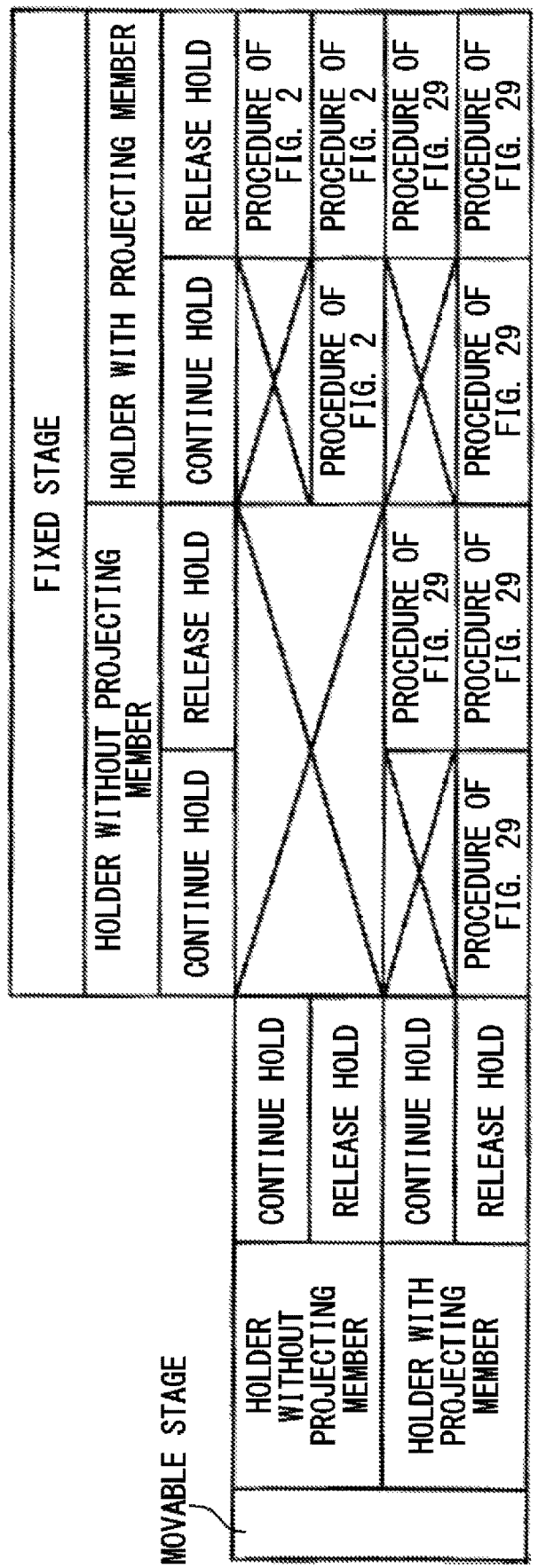
FIG. 35 shows an example of application of bonding procedures depending on substrate holders used.

FIG. 35 is a table showing the correspondence between the substrate holders 220, 240, 260, 270, and 290 used for bonding the substrates 210 and 230 and the bonding procedures shown in FIG. 2 and FIG. 29.

"Holder without projecting member" in the illustrated table refers to the flat substrate holder 240 such as shown in FIG. 4, the substrate holder 260 with the curved holding surface 261 shown in FIG. 17, etc. "Holder with projecting member" in the illustrated table refers to the substrate holder 220 with the projecting member 250 such as shown in FIG. 3, the substrate holder 290 with the projecting member 280 having the peripheral wall portion 282 such as shown in FIG. 27, etc.

"Procedure of FIG. 2" in the illustrated table refers to the procedure of releasing the hold of the substrate 230 by the substrate holders 240 and 260 (step S107) only from the holding surfaces 241 and 261. "Procedure of FIG. 29" in the illustrated table refers to the procedure of releasing the hold of the substrate 210 by the substrate holders 220 and 290 from the holding surfaces 221 and 291 (step S111) and from the projecting member 280 (step S112) at different steps.

Further, "continue hold" in the illustrated table refers to continuing the hold of the substrate 230 until the bonding is finished. Note that, if the hold the substrates 210 and 230 is not released from both of the substrate holders 220 and 240 of the fixed stage 121 and the movable stage 141, the substrates 210 and 230 will not be bonded, and thus there is no corresponding bonding procedure. If the substrate holder 290 with the projecting member 280 is used on neither side, there is no room for selecting a procedure, and thus no correspondence is listed in the illustrated table.

As illustrated, in the case of using the substrate holder 290 with the projecting member 280, which itself suctions the substrate 210 to inhibit bonding, the procedure shown in FIG. 29 can be performed. Further, the substrates 210 and 230 can also be bonded by continuing the hold of the substrate 210 by the substrate holder 290 with the projecting member 280 while releasing the hold of the substrate 230 by the substrate holder 240 without the projecting member 280. Further, as described with reference to FIG. 20, displacement due to variation in magnification ratio in the bonding process can be suppressed by releasing the hold of both substrates 210 and 230 to let the bonding progress.

However, even in the case of using the substrate holder 290, which can suction the substrate 210 on the projecting member 280 to inhibit the progress of the bonding wave, if the substrate holder 290 is held on the fixed stage 121 and the substrate 210 is held to face gravitationally downward, suctioning the substrate only in its central vicinity by the projecting member 280 may be insufficient to inhibit the substrate bonding. Accordingly, in the case of using the substrate holder 290 with the projecting member 280 on the fixed stage 121, the procedure shown in FIG. 2 may be applied.

In the operations shown in FIG. 35, if substrates are bonded to each other by releasing a substrate held on a substrate holder without a projecting member while not releasing a substrate held on a substrate holder with a projecting member, the released substrate may not deform in conformity with the protrusion of the fixed substrate. In such cases, appropriate bonding at the protrusion may not be achieved. For such cases, the entire substrates may be bonded in the methods described below, for example. In one method, a substrate holder with a projecting member is used on each stage, and the substrates are released from both substrate holders while the projecting members of both substrate holders are opposed to each other. In another method, both substrate holders have respective projecting members that are movable, as will be described later, and after the protrusions of the two substrates contact each other, a pressure is applied between the substrate holders such that the amount of protrusion of each projecting member is decreased, to gradually enlarge the contact region between the protrusions.

In the above-described example, the hold of the substrates 210 and 230 is released by connecting the air passages 222, 242, 262, 272, 274, 284, 294, 322, 331, 332, 352, 382, and 292 of the substrate holders 220, 240, 260, 270, 290, etc. with the open ends 129, 146, and 149. However, the substrates 210 and 230 may also be actively released by connecting the air passages 222, 242, 262, 272, 274, 284, 294, 322, 331, 332, 352, 382, and 292 with a pressure source that provides positive pressure.

In the procedure of holding the substrates 210 and 230 only onto the holding surfaces 221 and 241 of the substrate holders 220 and 240 as shown in FIG. 2, the positive pressure will be applied to the substrates 210 and 230 at the point of time when at least one of the substrates 210 and 230 (step S107) is released after the bonding origin 209 is formed between the substrates 210 and 230. This can facilitate the formation and progress of the bonding wave between the substrates 210 and 230, improving the throughput of the substrate bonding.

On the other hand, in the procedure of releasing the hold of the substrates 210 and 230 from the holding surfaces 221 and 241 of the substrate holders 220 and 240 and from the projecting member 280 step by step as shown in FIG. 29, the positive pressure may be applied to the substrates 210 and 230 at the point of time when the hold by the holding surfaces is released (step S111) or may be applied at the point of time when the hold by the projecting member 280 is released (step S112). In particular, by applying the positive pressure at the point of time when the hold by the holding surfaces is released (step S111) before the two substrates 210 and 230 contact each other, impact, vibration or the like caused to the substrates 210 and 230 due to the application of the positive pressure itself can be prevented from affecting measurement such as for alignment.

Figure 36:
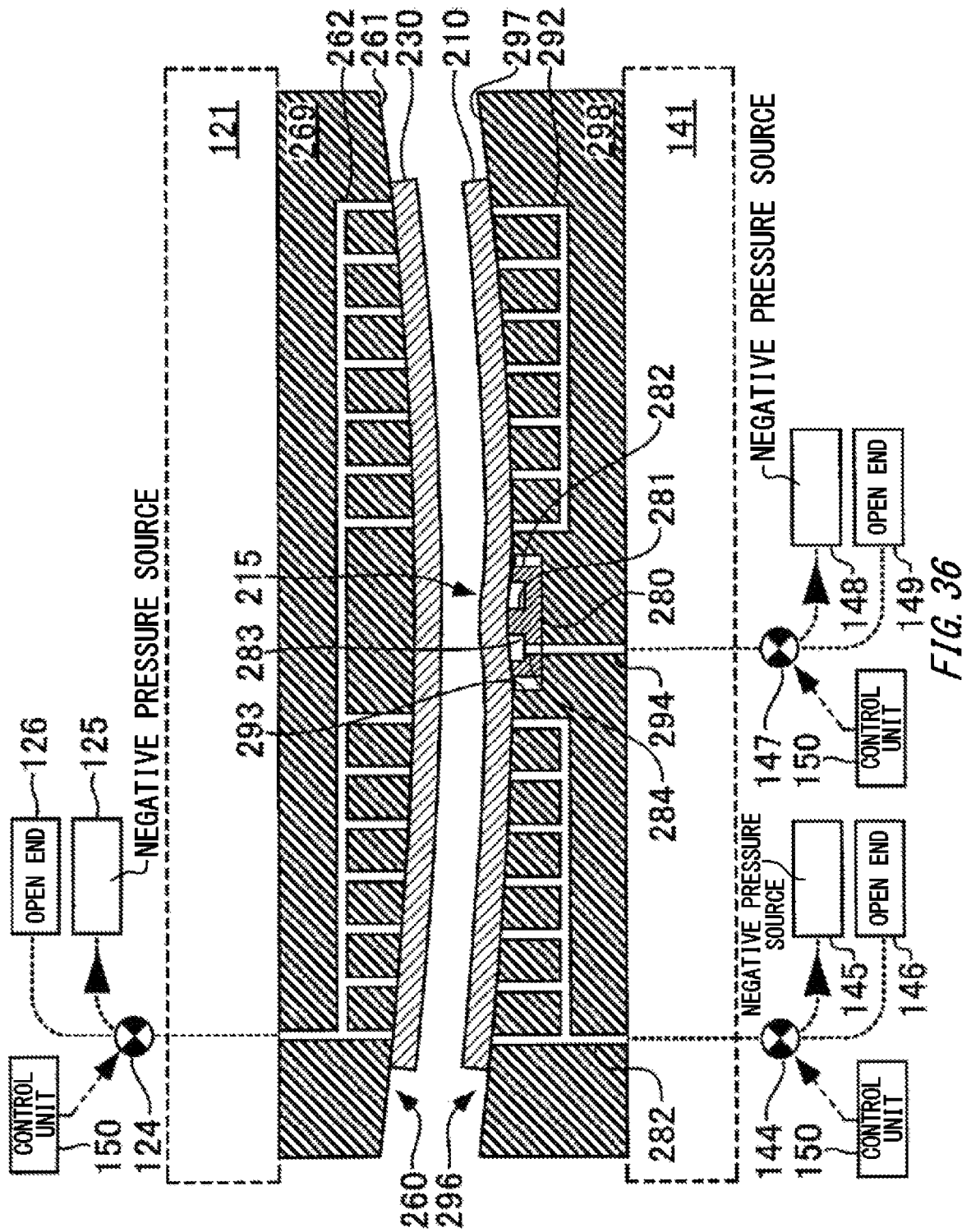
FIG. 36 is a schematic cross-sectional view in the bonding process using the substrate holders 260 and 296.
Figure 37:
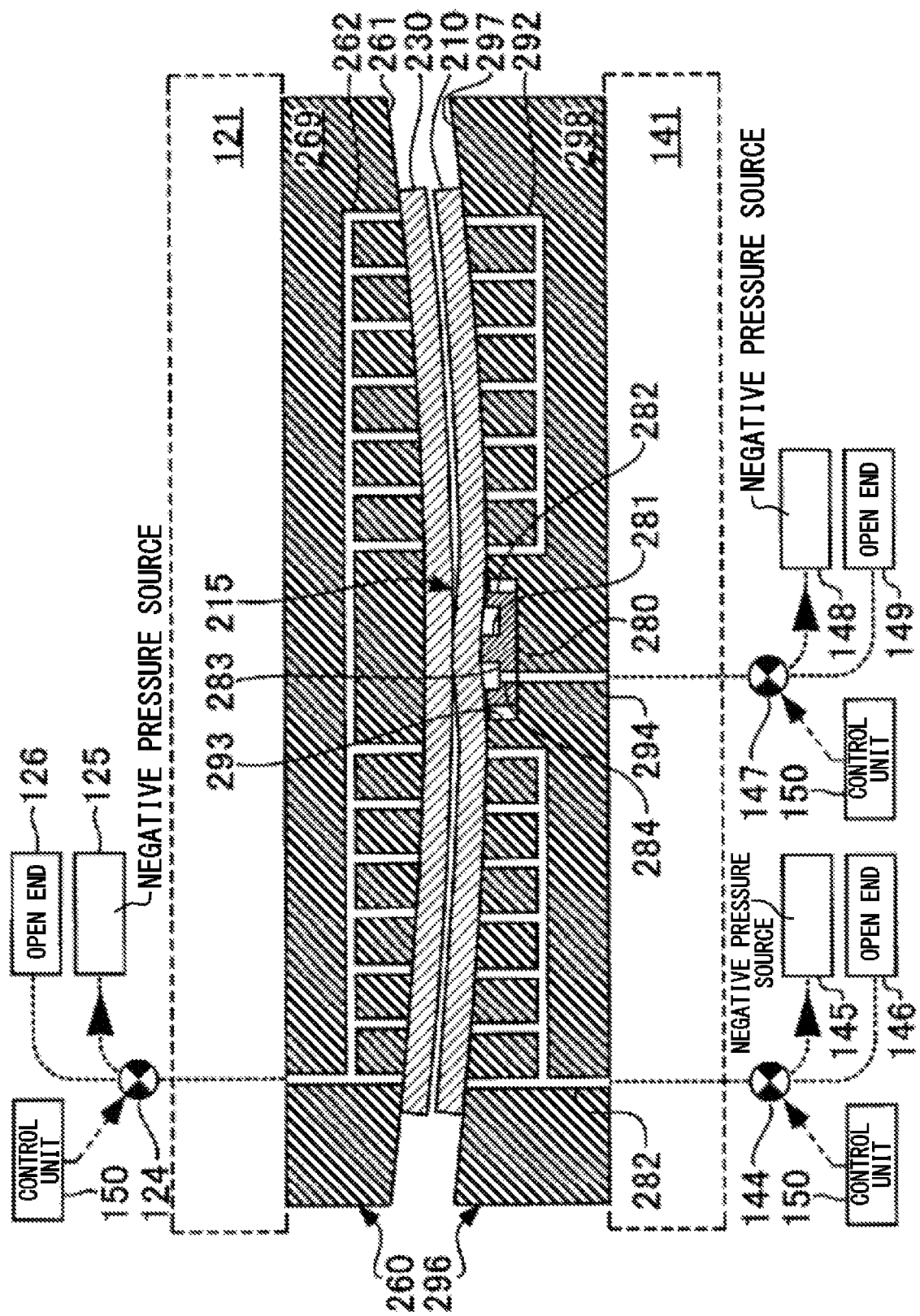
FIG. 37 is a schematic cross-sectional view in the bonding process using the substrate holders 260 and 296.

FIG. 36 and FIG. 37 are schematic cross-sectional views showing the structure and use of a substrate holder 296, which can be used as a replacement of the substrate holder 290. Elements that are common to those of the substrate holder 290 are provided with the same reference numerals, and the same descriptions will not be repeated here.

As shown in FIG. 36, a main body 298 of the substrate holder 296 has a shape in which its central portion is depressed and thickness gradually increases toward the outer periphery, and is imported onto the illustratively lower movable stage 141. A substrate holder 260 including a main body 269, having a shape in which thickness decreases toward the outer periphery from a thicker central part, is held on the fixed stage 121, opposing the movable stage 141, together with the substrate 230.

As shown in FIG. 37, using the combination of the substrate holders 260 and 296 having the above-described shapes, the substrates 230 and 210 have shapes that are approximately complementary to each other when held on the holding surfaces 261 and 297 of the respective substrate holders 260 and 296. In the illustrated example, the projecting member 280 is provided to the substrate holder 260, and the protrusion 215 is thus formed at a central part of the substrate 210. In this case, the curvature of the extremity of the protrusion 215 is larger than the curvature of the holding surface 297 of the substrate holder 296, that is, the curvature of regions of the substrate 210 other than the region where the protrusion 215 is formed.

Thus, at the point of time when the bonding origin is formed after the substrates 210 and 230 come close to each other, most portions of the substrates 210 and 230 are opposed at approximately constant intervals. This reduces the amount of movement of the substrate 210, released from the substrate holder 296, toward the substrate 230 while the bonding wave progresses between the substrates 210 and 230. This can reduce the displacement between the substrates 210 and 230 during the progress of the bonding wave.

Also, in order to correct the displacement between the substrates 210 and 230, performing the correction for each of the substrate holders 260 and 296 rather than for only the substrate holder 260 can increase the correctable range and decrease the correction pitch.

Figure 38:
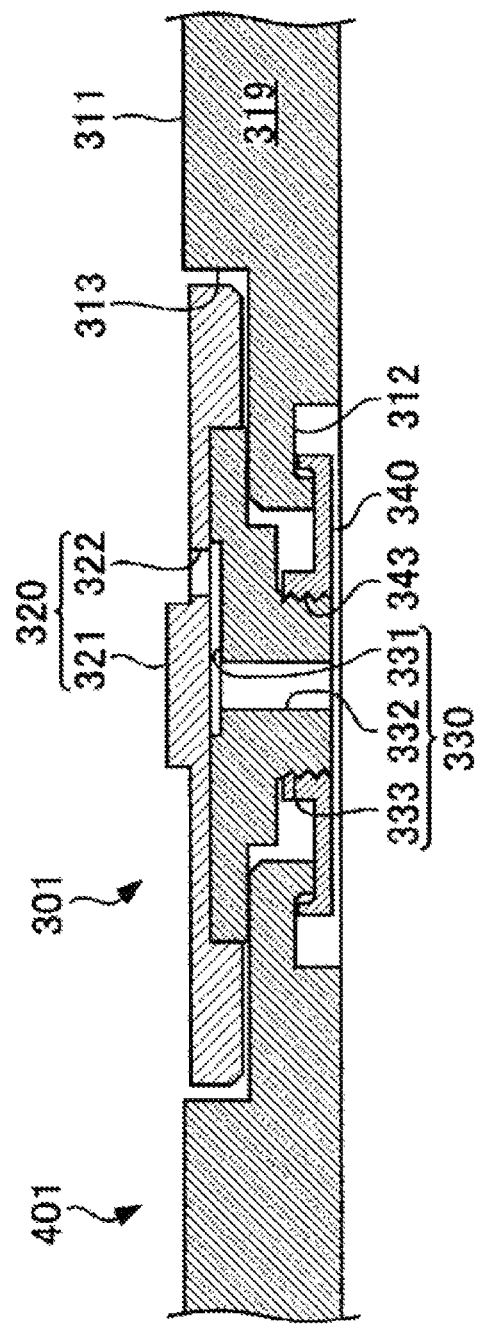
FIG. 38 is a schematic cross-sectional view of a projecting member 301.

FIG. 38 is a partial cross-sectional view of another substrate holder 401 showing its structure. The substrate holder 401 includes a main body 319 and a projecting member 301.

The main body 319 includes a recess 313 at a part of a flat holding surface 311. The bottom surface of the recess 313 is formed through the main body 319 in its thickness direction. A rib 312 is disposed on the inner surface of the recess 313 and protrudes inward.

The projecting member 301 includes an abutting member 320, an intermediate member 330, and a nut 340. The abutting member 320 is generally disc-shaped, and includes an air passage 322 formed therethrough in its thickness direction. The abutting member 320 also includes an abutting portion 321 protruding on its upper surface. When the projecting member 301 is fixed inside the recess 313, as will be described later, the abutting portion 321 protrudes from the holding surface 311. The abutting portion 321 can thus form a protrusion 215 in the substrate 210 held on the holding surface 311. That is, the projecting member 301 is an example of the forming section for forming the protrusion 215 at a partial region of the substrate 210.

Also, the intermediate member 330 has a flanged portion provided at its illustratively upper end, and is kept inside the recess 313 by abutting the upper surface of the rib 312 of the main body 319 at the flanged portion while supporting the abutting member 320 at its upper end. A thread 333 is disposed at the outer peripheral lower end of the intermediate member 330. The abutting member 320 is fixed to the intermediate member 330 such as with an adhesive, a double-sided tape, or by screwing.

Further, the intermediate member 330 includes an air passage 331 formed in parallel with its horizontal upper surface and an air passage 332 formed through its center in its height direction. The air passages 331 and 332 connect with the air passage 322 of the abutting member 320 supported on the upper surface of the intermediate member 330, and are connected to a negative pressure source (not shown). Thus, using the substrate holder 401, the substrate 210 can also be suctioned from the inside of the recess 313.

The nut 340 has, on its inner surface, a thread 343 to be threadedly engaged with the thread 333 of the intermediate member 330. The nut 340 has an outer diameter that is larger than the inner diameter of the rib 312 of the main body 319. Thus, when the nut 340 is screwed from the lower end of the intermediate member 330, the rib 312 is placed between the intermediate member 330 and the nut 340, so that the projecting member 301 can be fixed to the main body 319. The projecting member 301 can be removed from the main body 319 by loosening the nut 340.

Figure 39:
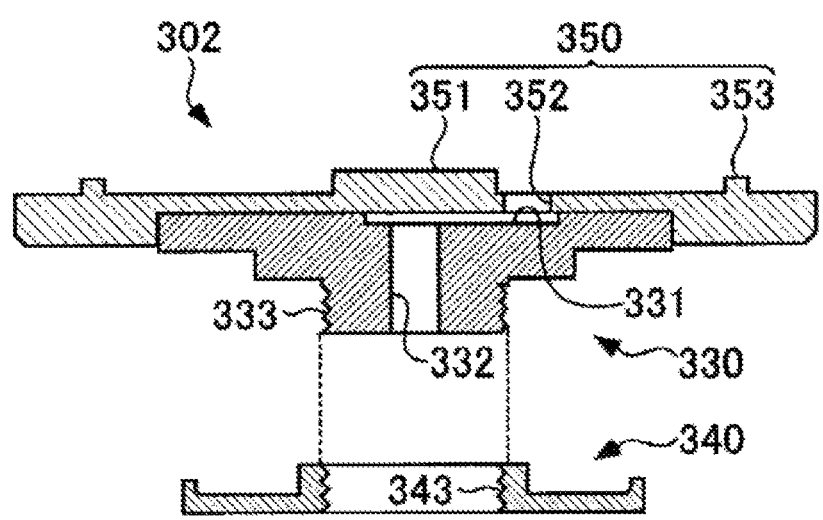
FIG. 39 is a schematic cross-sectional view of a projecting member 302.

FIG. 39 is a cross-sectional view of another projecting member 302, which can be attached to the main body 319 of the substrate holder 401 instead of the projecting member 301, showing its structure. The projecting member 302 includes an abutting member 350, an intermediate member 330, and a nut 340.

The intermediate member 330 and the nut 340 of the projecting member 302 are equal to those of the projecting member 301. The abutting member 320 has a structure common to that of the abutting member 320 of the projecting member 301 in being generally disc-shaped, having the air passage 352 formed therethrough in its thickness direction, and having the abutting portion 351 protruding on its upper surface.

The abutting member 350 is different in shape from the abutting member 320 in further having a peripheral wall portion 353 provided around the abutting portion 351. When the projecting member 302 is fixed inside the recess 313, the peripheral wall portion 353 protrudes from the holding surface 311. The amount of protrusion thereof is smaller than that of the abutting portion 351.

Thus, when the substrate 210 is held on the substrate holder 401 including the projecting member 302, the protrusion 215 is formed in the substrate 210 by the abutment of the abutting portion 351, and also the outer periphery of the protrusion 215 can be suctioned by reducing the pressure in the space between the abutting portion 351 and the peripheral wall portion 353. That is, the projecting member 302 is an example of the forming section for forming the protrusion 215 at a partial region of the substrate 210.

As described above, the substrate holder 401 can be used for substrate bonding in different methods by replacing the projecting members 301 and 302. This can improve the utilization of the expensive main body 319, improving the productivity of the stacked substrate 201. In addition, a plurality of projecting members with abutting portions having different heights may be prepared so as to adjust the amount of protrusion of the abutting portion, for example. In this case, the projecting member may be replaced based on the targeted bonding strength between the substrates 210 and 230, the degree of activation of the surfaces of the substrates 210 and 230, the amount of correction of displacement between the substrates 210 and 230, and the like. Instead of preparing the plurality of projecting members 301 and 302, the amount of protrusion of the abutting portions 321 and 351 can also be adjusted by inserting shims having different thicknesses between the intermediate member 330 and the rib 312 or between the intermediate member 330 and the abutting member 320.

Figure 40:
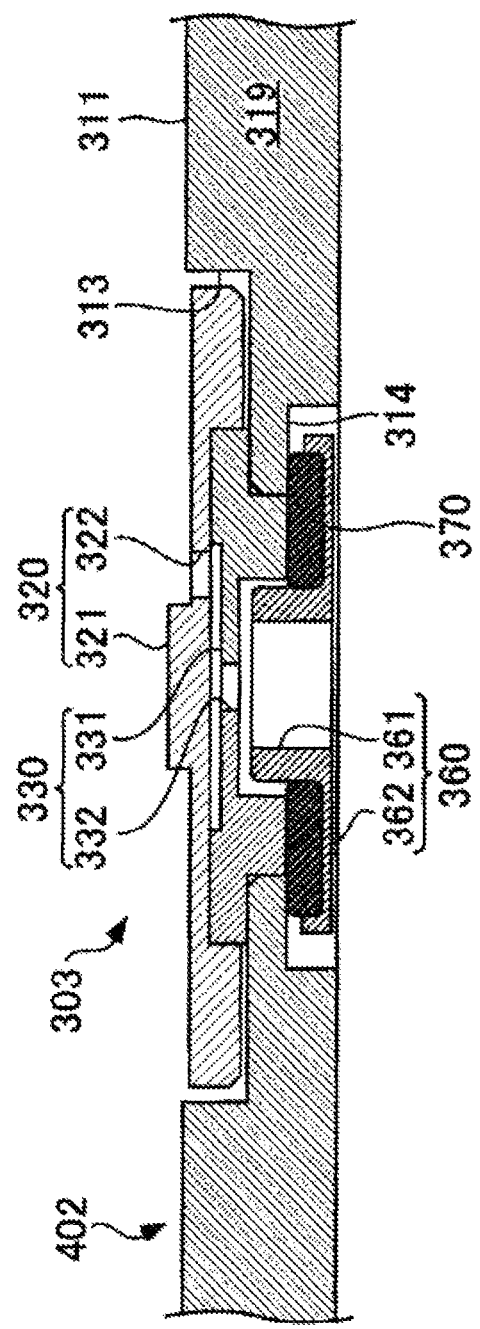
FIG. 40 is a schematic cross-sectional view of a projecting member 303.

FIG. 40 is a partial cross-sectional view of yet another substrate holder 402 showing its structure. The substrate holder 402 includes a main body 319 and a projecting member 303.

The main body 319 includes a recess 313 at a part of a flat holding surface 311. The bottom surface of the recess 313 is formed through the main body 319 in its thickness direction. A rib 314 is disposed on the inner surface of the recess 313 and protrudes inward.

The projecting member 303 includes an abutting member 320, an intermediate member 330, and a ring member 360. As with the abutting member 320 of the projecting member 301, the abutting member 320 is generally disc-shaped, and includes an air passage 322 formed therethrough in its thickness direction. The abutting member 320 also includes an abutting portion 321 protruding on its upper surface. When the projecting member 303 is fixed inside the recess 313 of the main body 319, the abutting portion 321 protrudes from the holding surface 311. The abutting portion 321 can thus form a protrusion 215 in the substrate 210 held on the holding surface 311. That is, the projecting member 303 is an example of the forming section for forming the protrusion 215 at a partial region of the substrate 210.

The intermediate member 330 supports the abutting member 320 at its upper end. The abutting member 320 is fixed to the intermediate member 330 such as with an adhesive, a double-sided tape, or by screwing. The intermediate member 330 has a flanged portion provided at its illustratively upper end and extending laterally, and is prevented from dropping downward from the inside of the recess 313 by abutting the upper surface of the rib 314 of the main body 319 at the flanged portion. Further, a lower extending portion of the intermediate member 330 shown in FIG. 40 is shorter than that of the intermediate member 330 of the projecting member 301 in FIG. 38. Thus, the lower end of the intermediate member 330 is positioned inside the recess 313, and extends to approximately the same height as the lower surface of the rib 314.

The intermediate member 330 includes an air passage 331 formed in parallel with its horizontal upper surface and an air passage 332 formed through its center in its height direction. The air passages 331 and 332 connect with the air passage 322 of the abutting member 320 supported on the upper surface of the intermediate member 330, and are connected to a negative pressure source (not shown).

The ring member 360 includes a cylindrical guide 361 to be inserted inside the intermediate member 330, and a flange 362 extending from the lower end of the guide 361 in the radial direction of the guide 361. Thus, in order to fix the projecting member 303 to the main body 319, the intermediate member 330 is inserted into the recess 313 from the illustratively upper side, and the guide 361 of the ring member 360 is inserted into the intermediate member 330 from the lower side, so that the rib 314 of the main body 319 is placed between the intermediate member 330 and the flange of the ring member 360. An adhesive 370, a magnet, or the like can be used to fix the intermediate member 330 and the ring member 360.

As above, using the substrate holder 402, a simplified structure is obtained and the number of assembly steps required is reduced. Note that, in the example shown in FIG. 40, an adhesive or the like may be used to directly fix the intermediate member 330 to the rib 314 without involving the ring member 360.

Figure 41:
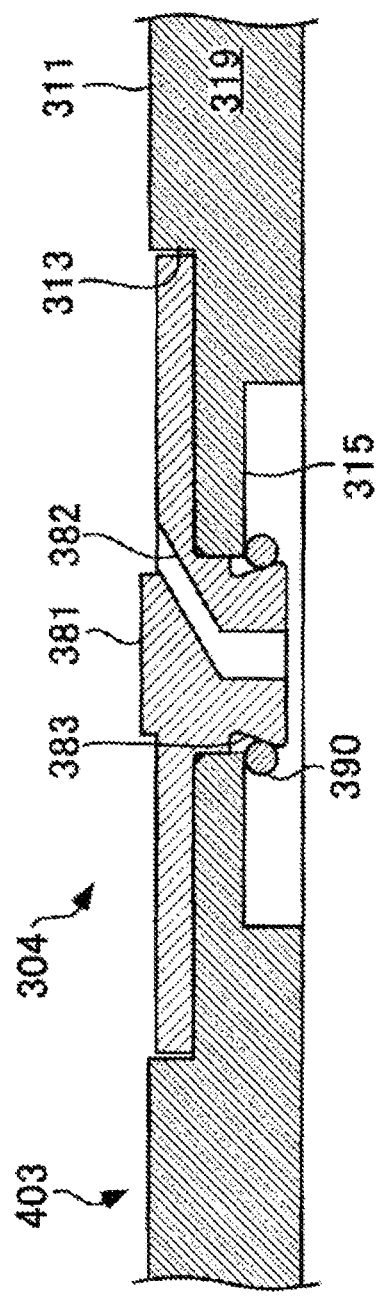
FIG. 41 is a schematic cross-sectional view of a projecting member 304.

FIG. 41 is a partial cross-sectional view of yet another substrate holder 403 showing its structure. The substrate holder 403 includes a main body 319 and a projecting member 304.

The main body 319 includes a recess 313 at a part of a flat holding surface 311. The bottom surface of the recess 313 is formed through the main body 319 in its thickness direction. A rib 315 is disposed on the inner surface of the recess 313 and protrudes inward.

The projecting member 304 is formed of a single component. An upper portion of the projecting member 304 has the shape of a disc having a diameter larger than the inner diameter of the rib 315, and a projection having an abutting portion 381 is disposed at a central portion of its illustratively upper surface. An air passage 382 is opened in the disc portion.

A lower portion of the projecting member 304 has the shape of a cylinder having an outer diameter that can be inserted through the inside of the rib 315. A tapered portion 383, in which its outer diameter decreases toward the illustratively upper side, is provided at the lower end of the cylindrical portion.

The projecting member 304 is fixed to the main body 319 by inserting its lower end portion through the inside of the rib 315 and then fitting an O-ring with the tapered portion 383. The O-ring 390 is biased in the upward direction, in which the diameter of the tapered portion 383 decreases, due to its own elasticity, and prevents backlash between the projecting member 304 and the main body 319. The amount of protrusion of the abutting portion 381 can be adjusted by inserting a spacer between the upper-end disc portion of the projecting member 304 and the upper surface of the rib 315 of the main body 319. The projecting member 304 is an example of the forming section for forming the protrusion 215 at a partial region of the substrate 210.

Figure 42:
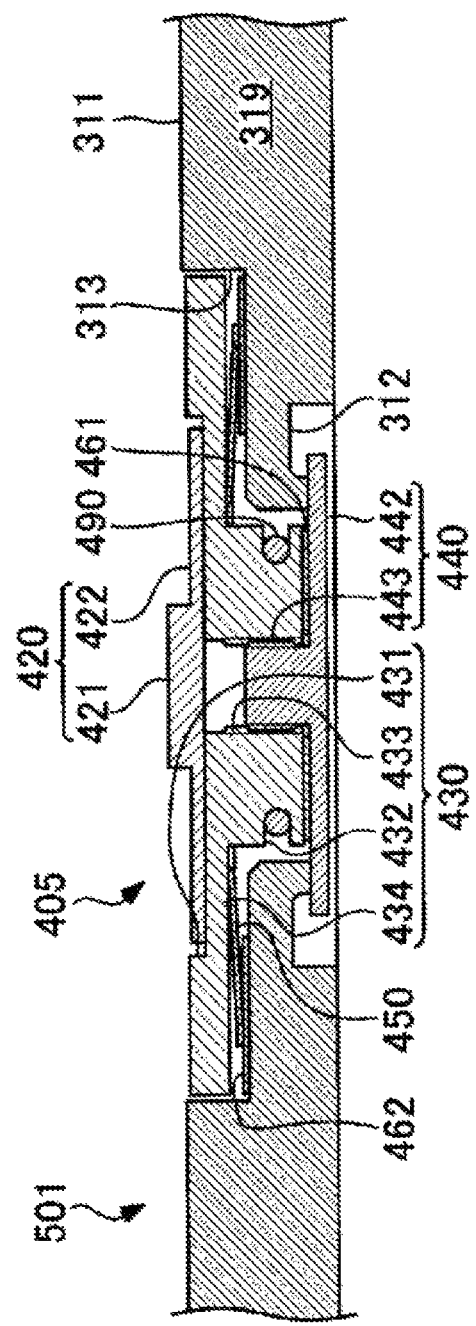
FIG. 42 is a schematic cross-sectional view of a substrate holder 501.

FIG. 42 is a partial schematic cross-sectional view of another substrate holder 501. The substrate holder 501 is formed by combining a projecting member 405, having a structure different from the structures of the other substrate holders 401 to 404, to the main body 319, which is common to the substrate holders 401 to 403 shown in FIGS. 38 to 41.

The projecting member 405 of the substrate holder 501 includes an abutting member 420, an intermediate member 430, and a screw member 440. The abutting member 420 includes an abutting portion 421 and a base 422. The base 422 has a flat disc shape. The abutting portion 421 is formed as a raised portion at a central part of the base 422. The base 422 has a larger area than the abutting portion 421, and extends around the abutting portion 421.

The intermediate member 430 includes a depression 431, a peripheral groove 432, a thread 433, and an upper flange 434. The depression 431 is formed in the upper surface of the intermediate member 430, and has a space that can accommodate the base 422 of the abutting member 420. When the abutting member 420 is accommodated in the depression 431, the upper end of the abutting portion 421 protrudes illustratively upward from the upper surface of the intermediate member 430. After accommodated in the depression 431 of the intermediate member 430, the abutting member 420 is fixed to the intermediate member 430 such as with an adhesive.

The peripheral groove 432 extends around the side surface of the intermediate member 430. An O-ring 490 is accommodated in the peripheral groove 432. Further, the thread 433 is formed on the inner surface of a screw hole formed through the center of the intermediate member 430 in its height direction. The thread 433 is threadedly engaged with a thread 443 of the screw member 440, which will be described below.

The upper flange 434 is formed at an illustratively upper portion of the intermediate member 430, and has an outer diameter larger than the inner diameter of the rib 312 formed on the inner surface of the recess 313 of the main body 319. In contrast, an illustratively lower portion of the intermediate member 430 has an outer diameter smaller than the inner diameter of the rib 312. Thus, when the intermediate member 430 is attached to the main body 319 from the holding surface 311 side, the lower end of the intermediate member 430 is inserted through the inside of the rib 312 of the main body 319.

The screw member 440 includes a lower flange 442 and the thread 443. As previously described, the thread 443 has dimensions and a shape to be threadedly engaged with the thread of the intermediate member 430. The lower flange 442 has an outer diameter larger than the inner diameter of the rib 312 of the main body 319. Thus, when the screw member 440 is attached to the main body 319 from the opposite side of the holding surface 311, and the thread 433 of the intermediate member 430 and the thread 443 of the screw member 440 are threadedly engaged, the rib 312 of the main body 319 is placed between the upper flange 434 of the intermediate member 430 and the lower flange 442 of the screw member 440. This prevents the projecting member 405 from being detached from the main body 319.

The distance between the upper flange 434 and the lower flange 442 is larger than the thickness of the rib 312. Thus, the projecting member 405 is attached to be displaceable upward and downward relative to the main body 319. In the substrate holder 501, a disc spring 450 is disposed between the upper flange 434 and the rib 312. The disc spring 450 biases the upper flange 434 in a direction away from the rib 312. In this manner, the projecting member 405 maintains itself in the state in which the amount of protrusion of the abutting portion 421 is maximum within the movable range of the projecting member 405.

Using the substrate holder 501 including the above-described projecting member 405 for bonding the substrates 210 and 230 in the bonding device 100, at first when the substrate 210 is held on the substrate holder 501, the protrusion 215 is formed in the substrate 210 by the abutting portion 421 protruding from the holding surface 311. That is, the projecting member 405 is an example of the forming section for forming the protrusion 215 at a partial region of the substrate 210. In forming the bonding origin, the movable stage 141 is elevated while the protrusion 215 of the substrate 210 is in contact with the substrate 230 to be adhered, so that the amount of protrusion of the projecting member 405 is decreased against the biasing force of the disc spring 450. As the amount of protrusion of the projecting member 405 decreases, the contact area between the substrates 210 and 230 increases. In this manner, the contact area between the substrates 210 and 230 can be adjusted at the time of origin formation.

Using the substrate holder 501, the amount of protrusion of the abutting portion 421 can be adjusted by, for example, replacing an adjustment shim 461, placed between the lower surface of the intermediate member 430 and the lower flange 442 of the screw member 440, with another one having a different thickness. Also, using the substrate holder 501, the force of the abutting portion 421 pressing the substrate 210 can also be adjusted by replacing an adjustment shim 462, placed between the disc spring 450 and the rib 312 as illustrated, with another one having a different thickness. The adjustment shim 462 for the disc spring 450 may also be placed between the upper flange 434 of the intermediate member 430 and the disc spring 450.

In each of the exemplary embodiments described above, in order to adjust the amount of protrusion of the projecting member from the holding surface of the substrate holder, a plurality of projecting members with abutting portions having different heights may be prepared, so as to select the projecting member used therefrom based on the size of the bonding origin to be formed, the speed of the bonding wave, the amount of displacement between the substrates while being bonded, and the like. Also, if the amount of displacement between the substrates while being bonded changes with the amount of protrusion of the projecting member, the amount of convexness of the holding surface 261 of the substrate holder 260 as shown in FIG. 17, that is, the amount of correction of the substrate held on the holding surface 261 may be adjusted based on the amount of protrusion of the projecting member.

Figure 43:
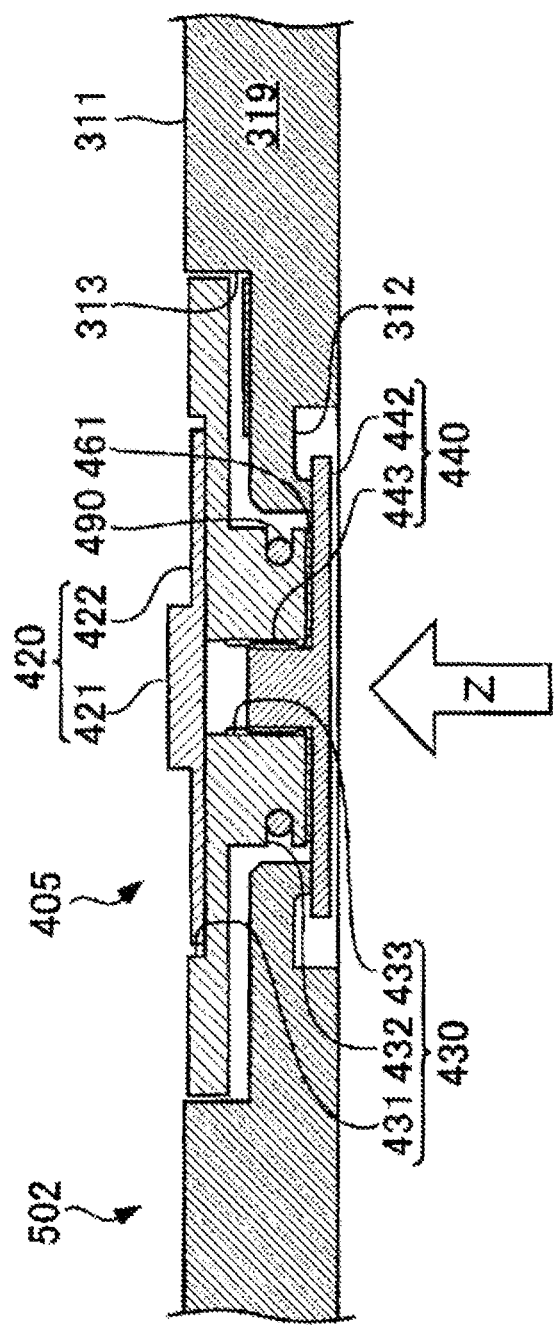
FIG. 43 is a schematic cross-sectional view of a substrate holder 502.

FIG. 43 is a schematic cross-sectional view of a substrate holder 502. The substrate holder 502 has the same structure as the substrate holder 501 except that the disc spring 450 and the one of the adjustment shims, 462, are not provided.

In the substrate holder 502 as well, the projecting member 405 is attached displaceably such that the amount of protrusion relative to the main body 319 changes. Thus, the same functionality as the substrate holder 501 including the disc spring 450 can be achieved by, for example, applying a pressurized fluid from the illustratively lower side to bias the projecting member 405 upward, as indicated by arrow Z in the figure. Further, by externally adjusting the pressure of the pressurized fluid, the pressure of the abutting portion 421 can be adjusted in the process of bonding the substrates 210 and 230.

Figure 44:
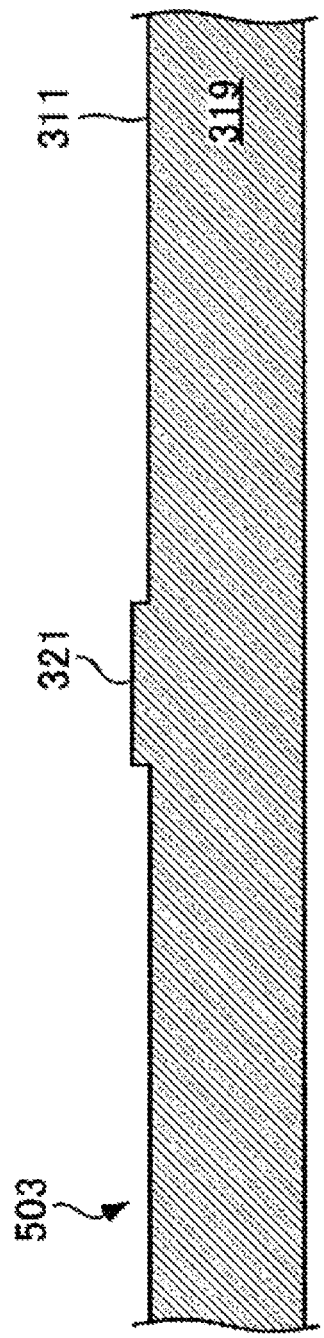
FIG. 44 is a schematic cross-sectional view of a substrate holder 503.

FIG. 44 is a schematic cross-sectional view of another substrate holder 503. The substrate holder 503 is formed by shaping the main body 319 itself to provide an abutting portion 321 on the holding surface 311. Thus, using the substrate holder 503, in which the abutting portion is formed, instead of providing the projecting member 405 to the main body 319 as a separate component, the bonding origin for bonding the substrates 210 and 230 can also be controlled. The abutting portion formed in the substrate holder 503 as above is an example of a projection for forming the protrusion by abutting a partial region of the substrates 210 and 230 held on the holding surface.

Figure 45:
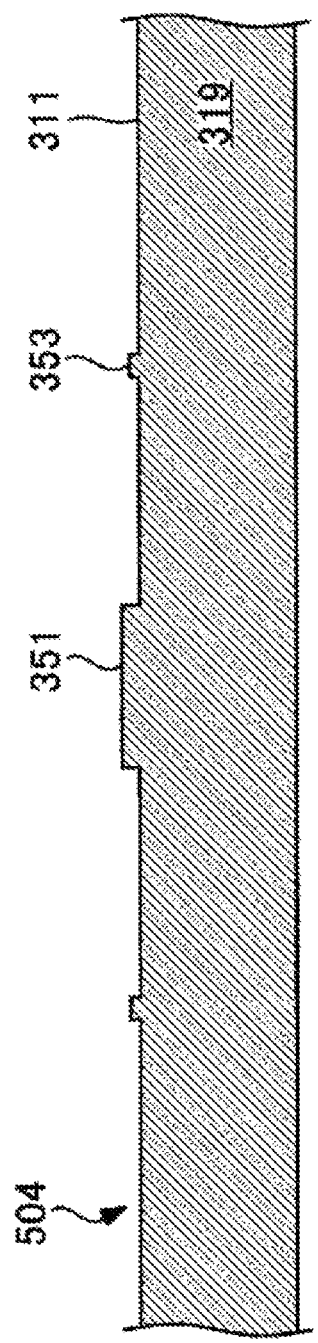
FIG. 45 is a schematic cross-sectional view of a substrate holder 504.

FIG. 45 is a schematic cross-sectional view of yet another substrate holder 504. The substrate holder 504 is formed by shaping the main body 319 itself to provide an abutting portion 351 and a peripheral wall portion 353 on the holding surface 311. By providing an air passage opened between the abutting portion 351 and the peripheral wall portion 353 in the substrate holder 504, having the main body 319 as above, the substrate holder 504 can be formed with the same functionality as that of the substrate holder 290 shown in FIG. 27 and with a simplified structure. In this case, the abutting portion 351 serves as the forming section for forming the protrusion 215 at a partial region of the substrate 210.

The various structures forming an abutting portion in the substrate holders 401, 402, 403, 501, 502, 503, and 504 as described above may also be provided on a stage for holding a substrate in a bonding device that does not use a substrate holder for substrate bonding.

Also, while in this exemplary embodiment the projecting member for forming the protrusion 215 is provided on a substrate holder or a stage, a projecting member may instead be used that is formed through a substrate holder or a stage and is arranged to be movable toward a substrate held on the substrate holder or stage. In this case, an actuator for moving the projecting member may be used so that the amount of protrusion from a holding surface of the substrate holder or stage can be controlled. Also, in this case, by measuring the positions of alignment marks after forming a protrusion in the substrate by the projecting member, displacement between the substrates after the position measurement can be suppressed. The projecting member and the actuator serve as the forming section for forming the protrusion 215 at a partial region of the substrate 210.

In this exemplary embodiment, the protrusion 215 of the substrate 210 undergoes stretching or contracting deformation by the amount corresponding to the amount of protrusion thereof as compared to the original state before being held on the substrate holder. Thus, the protrusion 215 may have stretching or contracting deformation when being bonded to the central portion of the substrate 230. In this case, the amount of convexness or shape of the holding surface 241 of the substrate holder 240 may be set such that the surface of the central portion of the substrate 230 is deformed in advance by an amount corresponding to the amount of protrusion of the projecting member 250 from the holding surface 221 of the substrate holder 220 or the amount of deformation of the protrusion 215.

Alternatively, a deformation mechanism having an actuator for deforming the central portion of the substrate holder 240 may be provided below the substrate holder 240, so as to deform the substrate 230 in advance by deforming the substrate holder 240 by driving the actuator by an amount corresponding to the amount of protrusion of the projecting member 250 from the holding surface 221 of the substrate holder 220 or the amount of deformation of the protrusion 215.

Alternatively, if the substrate 210 is held on a substrate holder provided with the projecting member 250, and is released from the substrate holder for bonding the substrate 210 to the other substrate 230 held on another substrate holder, the suction of the central portion of the substrate 230 is released or the suction force is weakened while regions of the substrate 230 other than the central portion is held on the other substrate holder, as shown in FIG. 20. In this manner, when the protrusion 215 of the substrate 210 contacts the other substrate 230 for forming the origin, the substrate 230 may be removed from the other substrate holder by attracting forces between the substrates 210 and 230. This can cause the central portion of the substrate 230 to undergo deformation similar to the deformation of the protrusion 215 of the substrate 210, and thus the difference between the amount of deformation of the protrusion 215 of the substrate 210 and the amount of deformation of the central portion of the substrate 230 can be decreased, and displacement due to these different amounts of deformation can be suppressed.

In this case, the suctioning region of the other substrate holder may be divided into a plurality of regions to individually control the suction force for each region. If vacuum chucking is used for suctioning, the pressure applied to the substrate 230 is controlled for each region, and if electrostatic chucking is used, the voltage applied to each region is individually controlled.

After the origin formation, a bonding wave is formed by releasing the substrate 210 from the substrate holder. In this process, the central portion of the substrate 230 is moved back toward the other substrate holder due to the self weight of the substrate 210 as the bonding with the substrate 210 progresses from the origin, and the protrusion 215 of the substrate 210 and the central portion of the substrate 230 are simultaneously turned back into the state before being deformed. This can suppress the occurrence of displacement between the substrates 210 and 230 during the progress of the bonding wave due to the different amounts of deformation.

Also, when the hold of the substrate 210 from the substrate holder 220 is released, the protrusion 215 may be released from stretching deformation so that the state before the formation of the protrusion 215 is recovered. In this case, the position of the surface of the substrate 210 in the protrusion 215 in its in-plane direction may be displaced from the position when the positions of the alignment marks 213 are detected. In this case as well, the amount of this displacement is measured or estimated in advance, and the surface of the substrate 230 at the central portion is deformed in advance by an amount that can correct this amount of displacement, as described above. Alternatively, the position measurement of the alignment marks 213 or the position control of the movable stage 141 may be performed in consideration of the amount of recovery or the amount of displacement due to this releasing operation.

Further, while in this exemplary embodiment the abutting portions 251, 281, 321, 351, 381, and 421 are cylindrical, it is preferable to chamfer the corner formed by the abutting surface and its peripheral surface so as not to cause a flaw or damage in the substrate 210 at the time of abutment. Instead of the cylindrical abutting portion, an abutting portion having a shape other than cylindrical, such as hemispherical, pyramid, or truncated pyramid, may also be used. If an abutting portion having a hemispherical shape is used, the abutting surface of the abutting portion may be curved at a curvature equal to the curvature required for the extremity of the protrusion 215 of the substrate 210. The required curvature refers to a curvature corresponding to the area, shape and the like of the contact region that allow the protrusion 215 and the substrate 230 to be in contact such that air bubbles are not produced or interposed between the extremity of the protrusion 215 and the other substrate 230.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A bonding method for bonding a first substrate and a second substrate, the bonding method comprising:
forming a protrusion at a partial region of the first substrate held at a holding surface of a holding section;
measuring a position of an alignment mark formed on a front-surface of the first substrate from a front-surface side of the first substrate and a position of an alignment mark formed on a front-surface of the second substrate from a front-surface side of the second substrate after the protrusion is formed in the first substrate and while the first substrate with the protrusion having formed therein and the second substrate are not overlapped with each other; and
bonding the first substrate and the second substrate by contacting at least a part of the protrusion of the first substrate with the front-surface of the second substrate to form a contact region and enlarging the contact region by releasing hold of the first substrate.

2. The bonding method according to claim 1, wherein forming the protrusion comprises forming the protrusion in the first substrate by abutting the partial region of the first substrate on a projection provided in advance to the holding surface of the holding section for holding the first substrate, while holding other regions of the first substrate onto the holding surface.

3. The bonding method according to claim 1, comprising aligning the first substrate and the second substrate after the protrusion is formed in the first substrate.

4. The bonding method according to claim 1, wherein forming the protrusion comprises curving the partial region such that the protrusion has a larger curvature than regions of the first substrate other than the partial region.

5. The bonding method according to claim 1, wherein during bonding the first substrate and the second substrate, holding of the second substrate is maintained.

6. The bonding method according to claim 1, comprising curving the second substrate,
wherein the bonding the first substrate and the second substrate comprises contacting the protrusion of the first substrate and a curved front-surface of the second substrate with each other.

7. The bonding method according to claim 1, wherein the bonding the first substrate and the second substrate comprises starting enlarging the contact region after a predetermined bonding strength is obtained between the protrusion of the first substrate and the second substrate after contacting the protrusion with the second substrate.

8. The bonding method according to claim 1, wherein
the releasing hold of the first substrate causes a vibration in at least one of the first substrate and the second substrate, and
the bonding the first substrate and the second substrate comprises starting enlarging the contact region after the vibration in the at least one of the first substrate and the second substrate stops after contacting the protrusion of the first substrate with the second substrate.

9. The bonding method according to claim 1, wherein the bonding the first substrate and the second substrate further comprises releasing hold of the first substrate after contacting the protrusion of the first substrate with the second substrate, the releasing of the hold of the first substrate causing a vibration in the first substrate, and then inhibiting the contact region from enlarging by continuing holding a part of the first substrate until the vibration in the released first substrate stops.

10. The bonding method according to claim 1, comprising releasing hold of the first substrate at least in a region adjacent to the protrusion before contacting the protrusion of the first substrate with the front-surface of the second substrate.

11. A bonding device for bonding a first substrate and a second substrate, the bonding device comprising:
a holding section configured to hold the first substrate;
a forming section configured to form a protrusion at a partial region of the first substrate;
a measuring section configured to measure a position of an alignment mark formed on a front-surface of the first substrate from a front-surface side of the first substrate and a position of an alignment mark formed on a front-surface of the second substrate from a front-surface side of the second substrate after the protrusion is formed in the first substrate and while the first substrate with the protrusion having formed therein and the second substrate are not overlapped with each other; and
a bonding section configured to bond the first substrate and the second substrate by contacting at least a part of the protrusion of the first substrate with a part of the front-surface of the second substrate to form a contact region and enlarging the contact region by releasing hold of the first substrate.

12. The bonding device according to claim 11, comprising an aligning section configured to align the first substrate and the second substrate after the protrusion is formed in the first substrate.

13. The bonding device according to claim 11, wherein:
the holding section comprises a main body having a holding surface for holding the first substrate;
the forming section is provided to the main body, and the protrusion comprises a projecting member at least partially protruding from the holding surface; and
the protrusion is formed in a partial region of the first substrate when the first substrate is held on the holding surface and the partial region abuts the projecting member.

14. The bonding device according to claim 13, wherein:
a recess is formed in the holding surface; and
the projecting member is disposed within the recess, and comprises an abutting portion having a height that is larger than a depth of the recess.

15. The bonding device according to claim 13, wherein the projecting member is detachably fixed to the main body.

16. The bonding device according to claim 13, wherein the projecting member comprises a suctioning section configured to suction a part of the first substrate abutting thereon.

17. A substrate bonding method for bonding a first substrate and a second substrate, the substrate bonding method comprising:
providing a first holding member including:
a first holding surface to hold the first substrate; and
a projection protruding from the first holding surface by a preset height before holding the first substrate to the first holding surface;
abutting the first substrate on the projection protruding from the first holding surface;

forming a protrusion at a partial region of the first substrate by applying first force to suction the first substrate on the first holding surface; and bonding the first substrate and the second substrate by contacting at least a part of the protrusion of the first substrate with a front-surface of the second substrate to form a contact region and enlarging the contact region by eliminating the first force to suction the first substrate.

18. The substrate bonding method according to claim 17, further comprising measuring a position of the first substrate after the protrusion is formed in the first substrate.

19. The substrate bonding method according to claim 17, wherein
the protrusion has a larger curvature than regions of the first substrate other than the partial region, and
the regions other than the partial region are flat or curved.

20. The substrate bonding method according to claim 17, wherein
the forming the protrusion comprises forming the protrusion in the first substrate by abutting the partial region of the first substrate on the projection and suctioning, to the first holding surface, regions of the first substrate other than the partial region.

21. The substrate bonding method according to claim 17, further comprising aligning the first substrate and the second substrate after the protrusion is formed in the first substrate.

22. The substrate bonding method according to claim 17, wherein
the bonding the first substrate and the second substrate comprises, during eliminating the first force to suction the first substrate, maintaining second force to suction the second substrate on a second holding surface for holding the second substrate.

23. The substrate bonding method according to claim 17, further comprising curving the second substrate, wherein
the bonding the first substrate and the second substrate comprises contacting the protrusion of the first substrate and a curved front-surface of the second substrate.

24. The substrate bonding method according to claim 17, wherein
the bonding the first substrate and the second substrate comprises starting enlarging the contact region after a predetermined bonding strength is obtained between the protrusion of the first substrate and the second substrate after contacting the protrusion of the first substrate with the second substrate.

25. The substrate bonding method according to claim 17, further comprising releasing hold of the first substrate, the releasing of the hold of the first substrate causing a vibration in at least one of the first substrate and the second substrate, wherein
the bonding the first substrate and the second substrate comprises starting enlarging the contact region after the vibration in the at least one of the first substrate and the second substrate stops after contacting the protrusion of the first substrate with the second substrate.

26. The substrate bonding method according to claim 17, wherein the bonding the first substrate and the second substrate further comprises,
releasing the first substrate by eliminating the first force to suction the first substrate after contacting the protrusion of the first substrate with the second substrate, the releasing of the first substrate causing a vibration in the first substrate, and inhibiting the contact region from enlarging by continuing to suction a part of the first substrate until the vibration in the released first substrate stops.

27. The substrate bonding method according to claim 17, further comprising eliminating the first force to suction the first substrate at least in a region adjacent to the protrusion before contacting the protrusion of the first substrate with the front-surface of the second substrate.

28. The substrate bonding method according to claim 18, wherein
the measuring comprises detecting an alignment mark formed on the first substrate.

29. The substrate bonding method according to claim 17, further comprising adjusting a protruding amount of the projection protruding from the front-surface of the first holding surface.

30. The substrate bonding method according to claim 17, wherein
the first holding surface for holding the first substrate is positioned above a second holding surface for holding the second substrate and faces downward.

31. The substrate bonding method according to claim 17, wherein the preset height protruding from the first holding surface is fixed during the abutting and the forming.

32. A substrate bonding device for bonding a first substrate and a second substrate, the substrate bonding device comprising:
a first holding member (i) having a first holding surface to hold the first substrate and (ii) a projection protruding from the first holding surface by a preset height before holding the first substrate to the first holding surface;
a forming section configured to form a protrusion at a partial region of the first substrate by abutting the first substrate on the projection and applying first force to suction the first substrate on the first holding surface of the first holding member; and
a bonding section configured to bond the first substrate and the second substrate by contacting at least a part of the protrusion of the first substrate with a part of a front-surface of the second substrate to form a contact region and enlarging the contact region by eliminating the first force to suction the first substrate.

33. The substrate bonding device according to claim 32, further comprising an adjusting section configured to adjust a protruding amount of the projection protruding from a front-surface of the first holding surface.

34. The substrate bonding device according to claim 32, further comprising a measuring section configured to measure a position of the first substrate after the protrusion is formed in the first substrate.

35. The substrate bonding device according to claim 32, wherein
the protrusion has a larger curvature than regions of the first substrate other than the partial region, and
the regions other than the partial region are flat or curved.

36. The substrate bonding device according to claim 32, further comprising an aligning section configured to align the first substrate and the second substrate after the protrusion is formed in the first substrate.

37. The substrate bonding device according to claim 32, further comprising a second holding member having a second holding surface for holding the second substrate, wherein
the bonding section is further configured to, during eliminating the first force to suction the first substrate, maintain second force to suction the second substrate on the second holding surface of the second holding member.

38. The substrate bonding device according to claim 32, further comprising a second holding member having a second holding surface for holding the second substrate, wherein
   the first holding member is positioned above the second holding member, and
   the first holding surface of the first holding member faces downward.

39. The substrate bonding device according to claim 32, wherein the preset height protruding from the first holding surface is fixed in forming the protrusion.

* * * * *